United States Patent [19]

White

[11] Patent Number: 5,754,563

[45] Date of Patent: May 19, 1998

[54] BYTE-PARALLEL SYSTEM FOR IMPLEMENTING REED-SOLOMON ERROR-CORRECTING CODES

[75] Inventor: Philip E. White, Minnetonka, Minn.

[73] Assignee: ECC Technologies, Inc., Minnetonka, Minn.

[21] Appl. No.: 526,088

[22] Filed: Sep. 11, 1995

[51] Int. Cl.$^6$ .............................. H03M 13/00; G06F 7/44
[52] U.S. Cl. .................... 371/376; 364/746.1; 364/754; 371/37.11; 371/40.17
[58] Field of Search ................. 371/376, 40.17, 371/37.11; 364/746.1, 754

[56] References Cited

U.S. PATENT DOCUMENTS

| | | | |
|---|---|---|---|
| 4,077,028 | 2/1978 | Lui et al. | 371/37.03 |
| 4,099,160 | 7/1978 | Flagg | 371/37.12 |
| 4,142,174 | 2/1979 | Chen et al. | 371/37.11 |
| 4,162,480 | 7/1979 | Berlekamp | 371/37.11 |
| 4,494,234 | 1/1985 | Patel | 371/40.3 |
| 4,504,948 | 3/1985 | Patel | 371/40.3 |
| 4,633,470 | 12/1986 | Welch et al. | 371/37.07 |
| 4,937,829 | 6/1990 | Kadokawa | 371/37.6 |
| 5,170,399 | 12/1992 | Cameron et al. | 371/37.11 |
| 5,226,043 | 7/1993 | Pughe, Jr. et al. | 371/40.13 |

OTHER PUBLICATIONS

Article entitled "Euclideanization of the Berlekamp–Massey Algorithm" by Wm. Eastman, from the proceedings of the 1988 Tactical Communication Conference, vol. 1 (1988), pp. 295–303.

*Primary Examiner*—Stephen M. Baker
*Attorney, Agent, or Firm*—Frederick W. Niebuhr

[57] ABSTRACT

A high-speed byte-parallel pipelined error-correcting system for Reed-Solomon codes includes a parallelized and pipelined encoder and decoder and a feedback failure location system. Encoding is accomplished in a parallel fashion by multiplying message words by a generator matrix. Decoding is accomplished with or without byte failure location information by multiplying the received word by an error detection matrix, solving the key equation and generating the most-likely error word and code word in a parallel and pipelined fashion. Parallelizing and pipelining allows inputs to be received at very high (fiber optic) rates and outputs to be delivered at correspondingly high rates with minimum delay. The error-correcting system can be used with any type of parallel data storage or transmission media to create an arbitrary level of fault-tolerance and allows previously considered unreliable media to be effectively used in highly reliable memory or communications systems.

38 Claims, 52 Drawing Sheets

FIG. 2-A
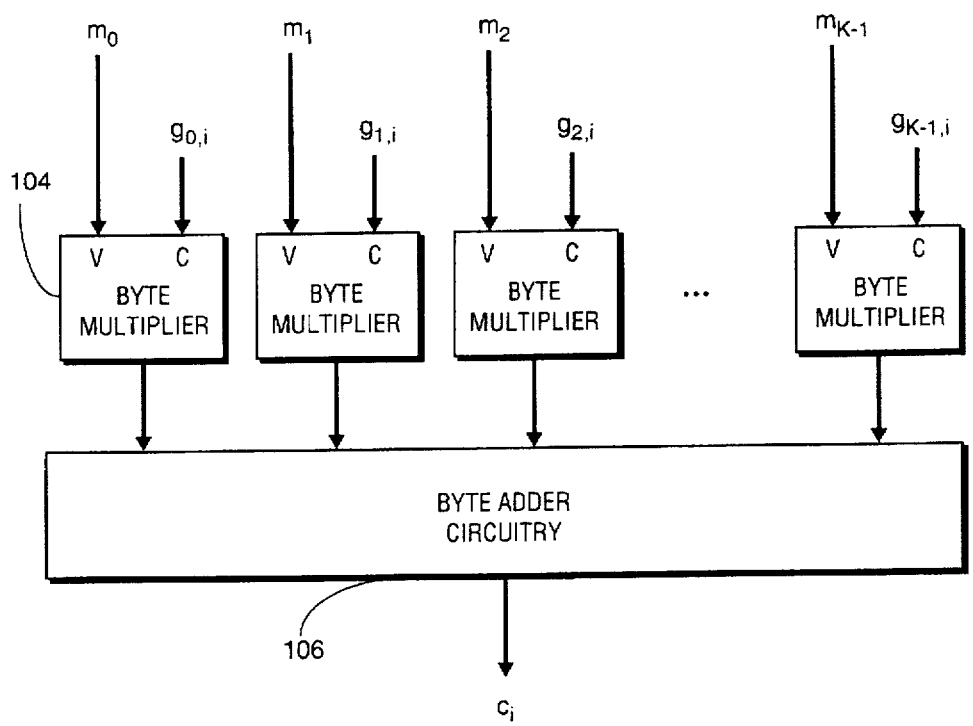
FIG. 2-B
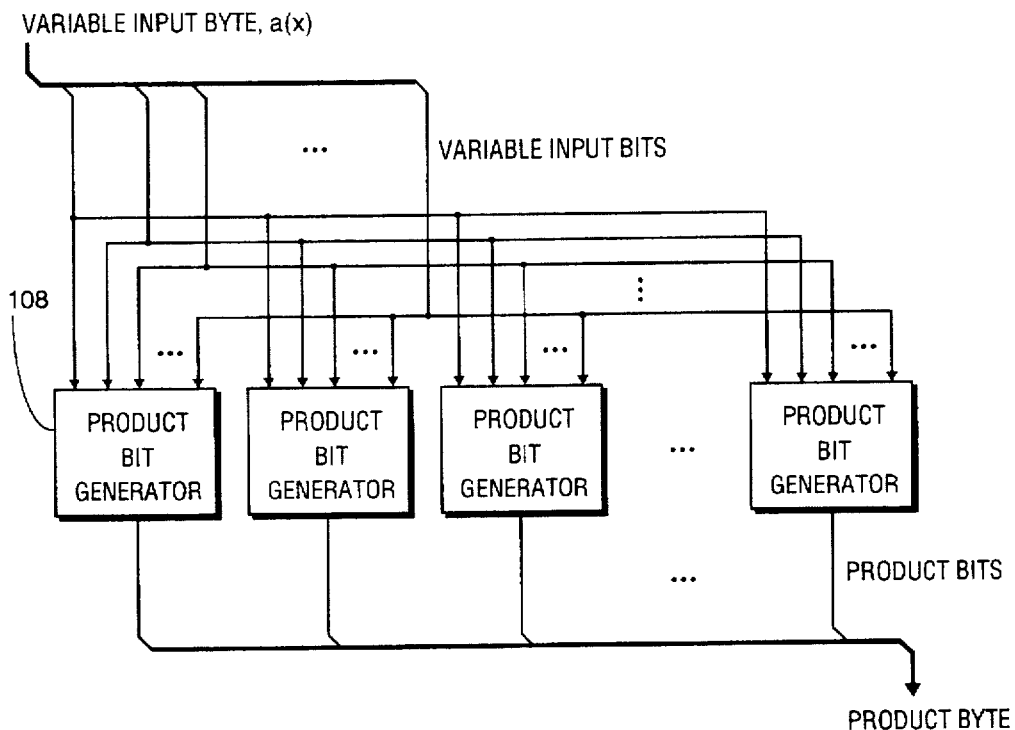

FIG. 2-C
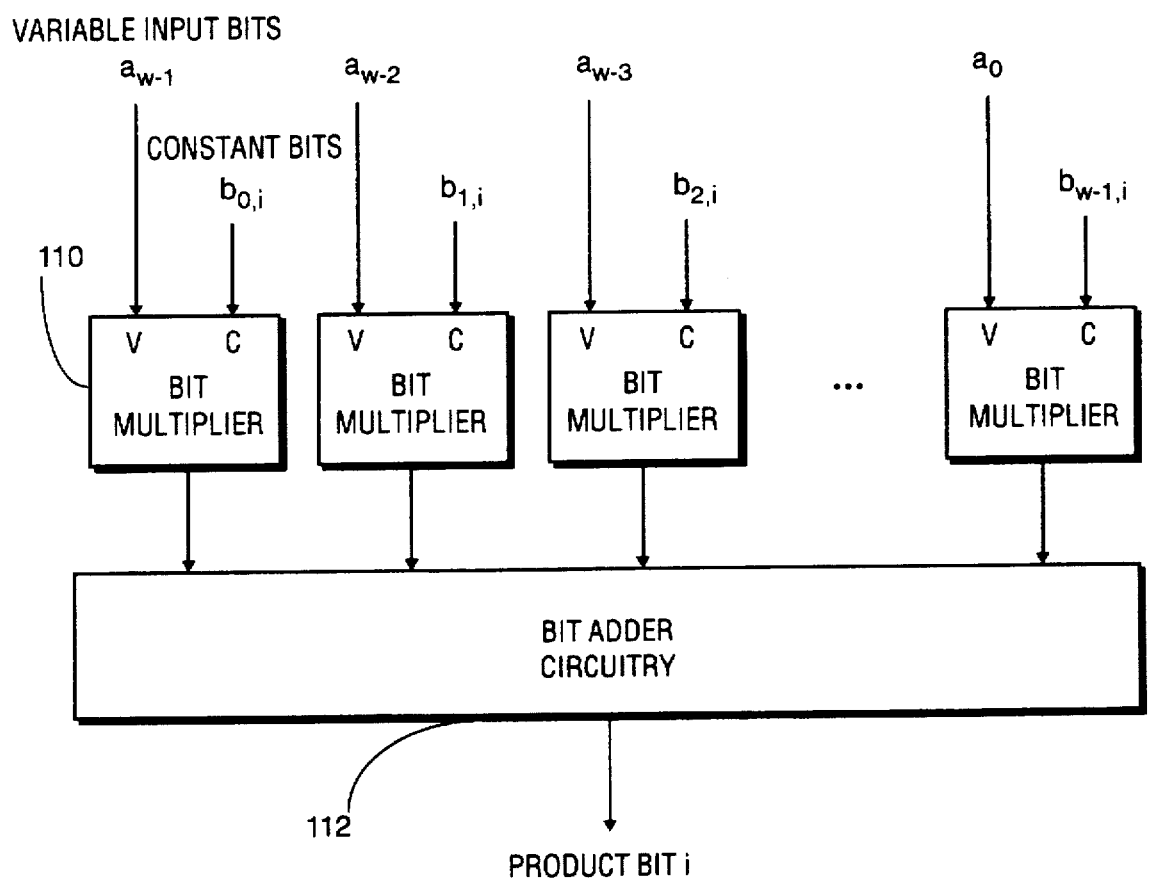

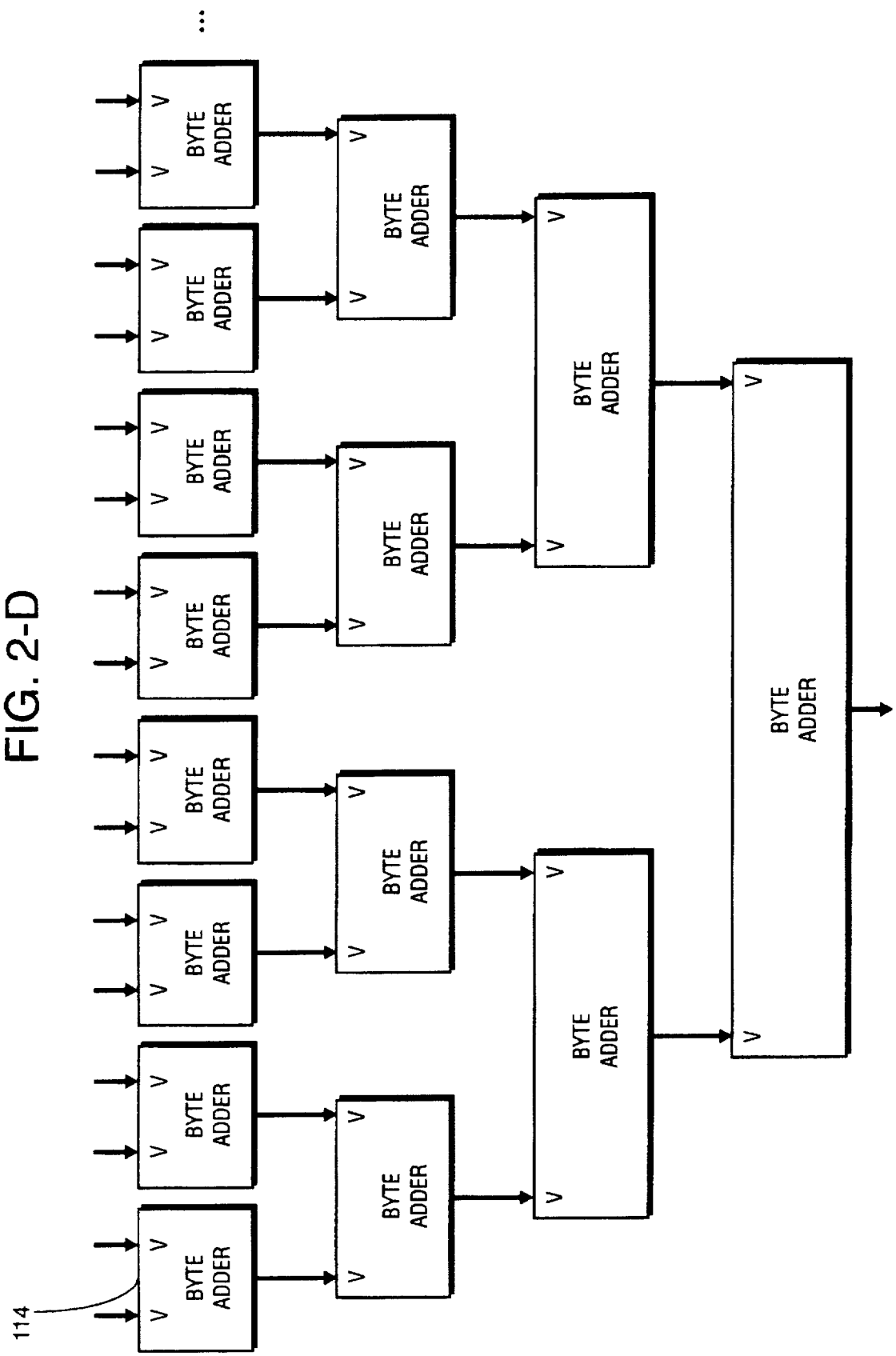
FIG. 2-D

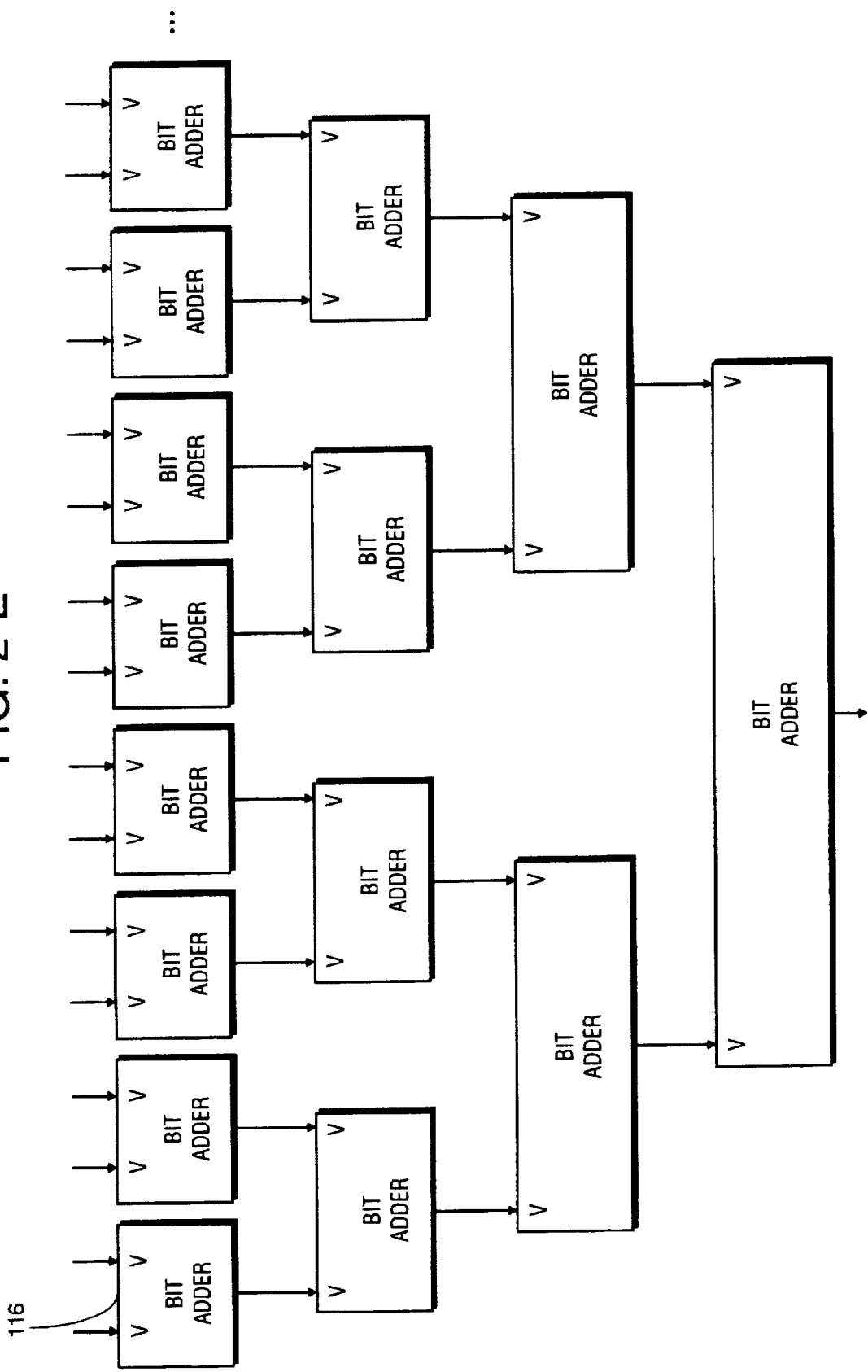
FIG. 2-E

FIG. 2-F
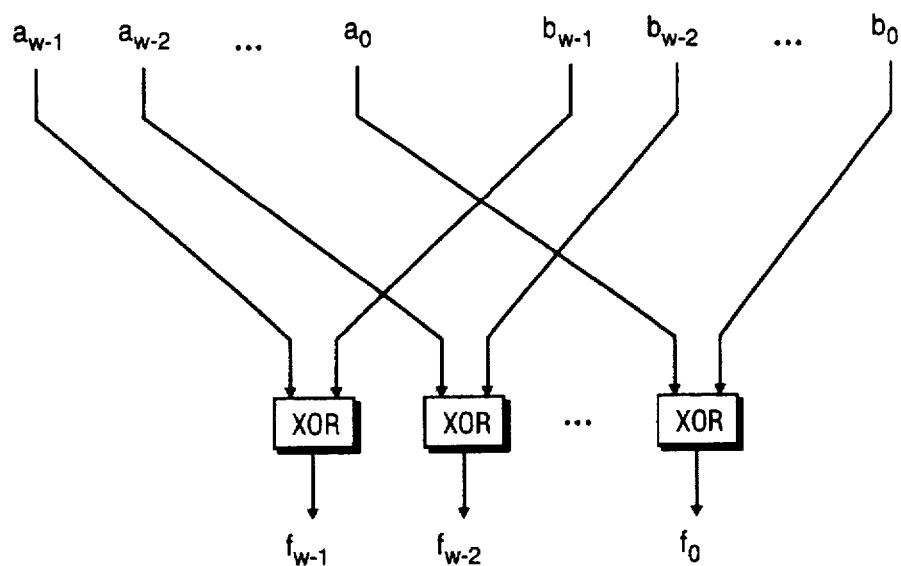
FIG. 2-G
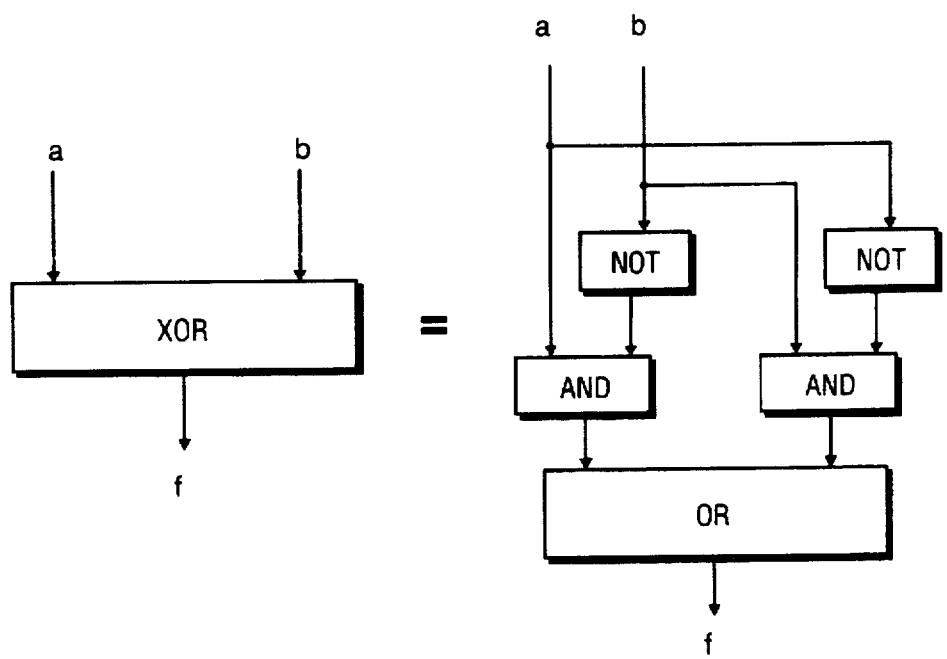

FIG. 3-A
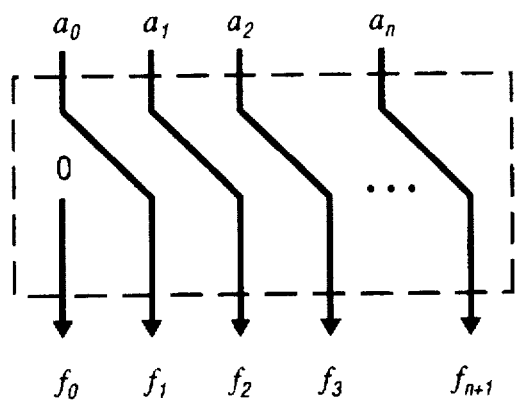
FIG. 3-B
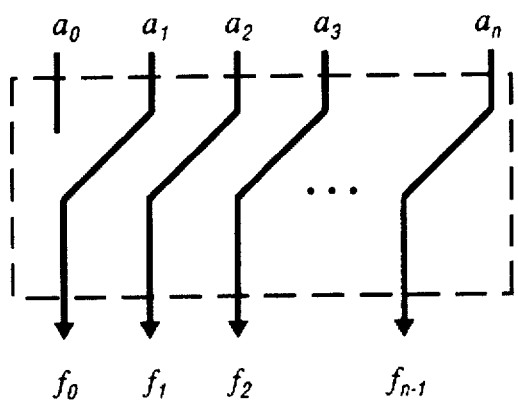

FIG. 4
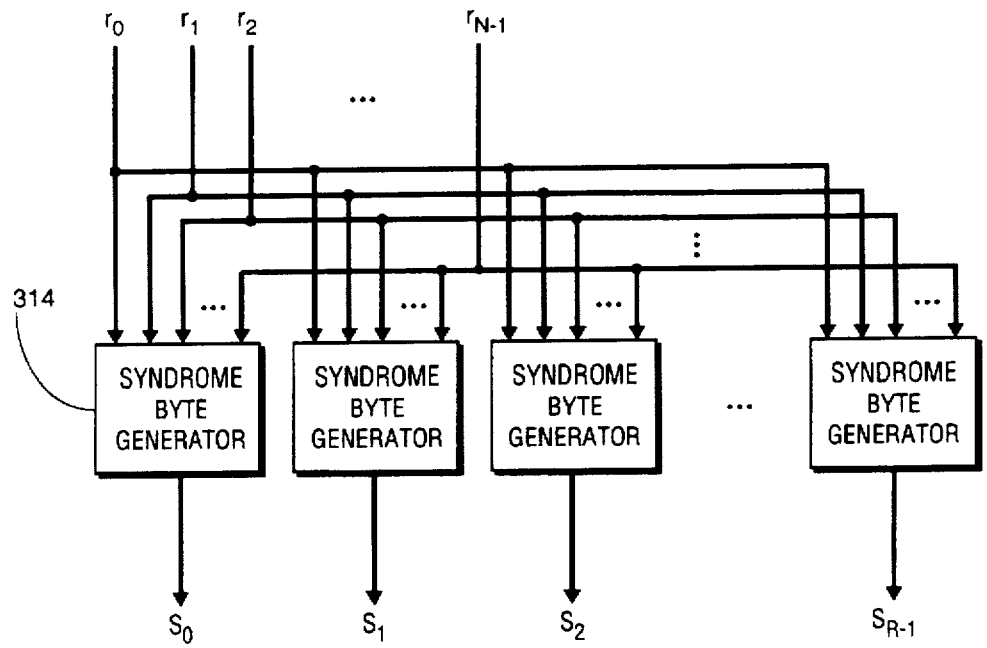
FIG. 4-A
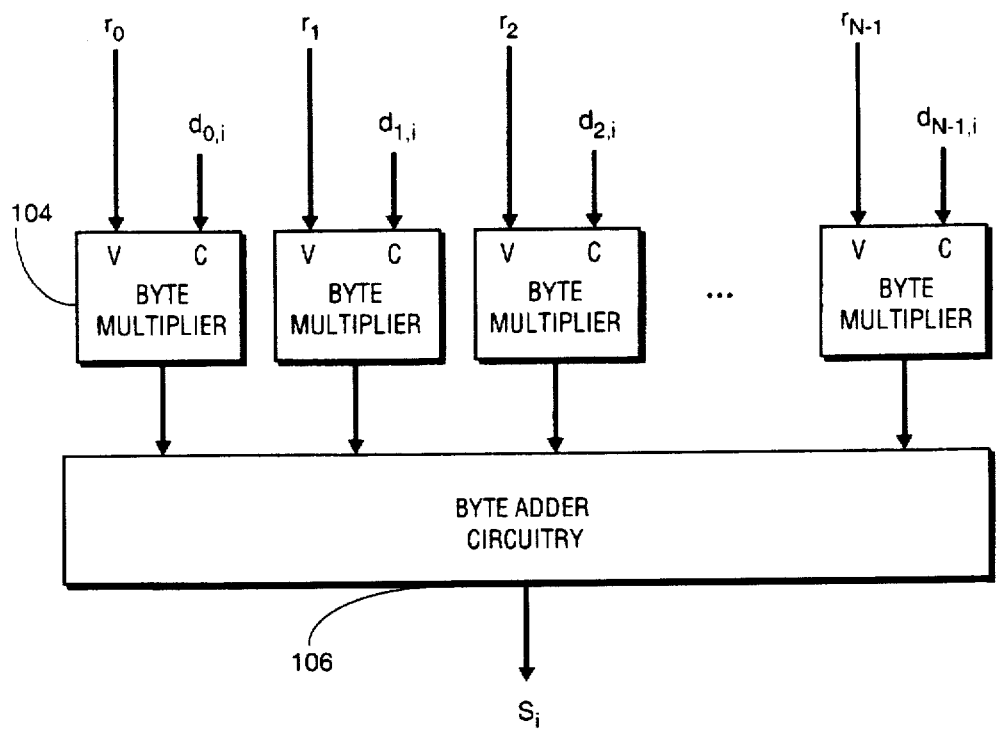

FIG. 5-A
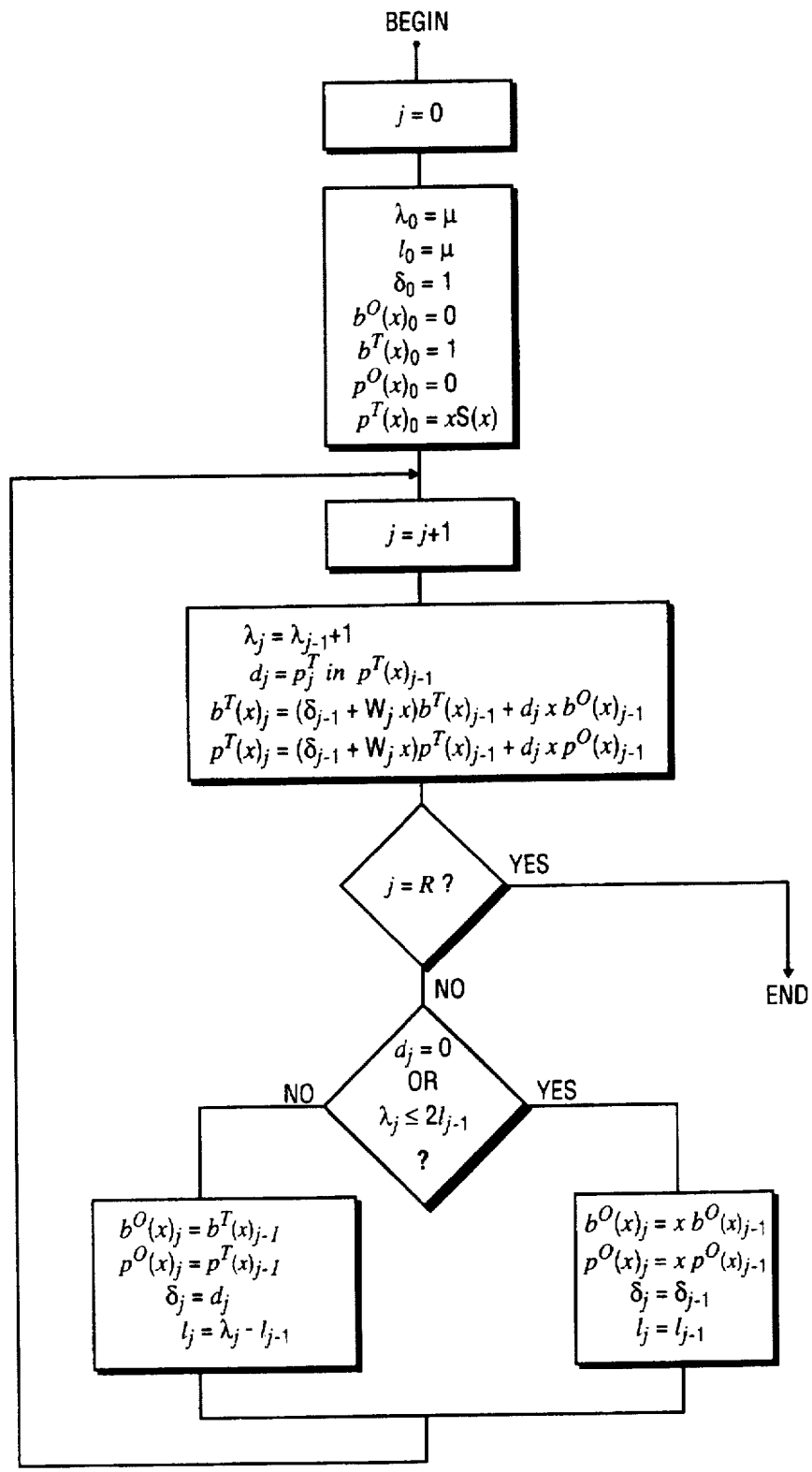

FIG. 5-B
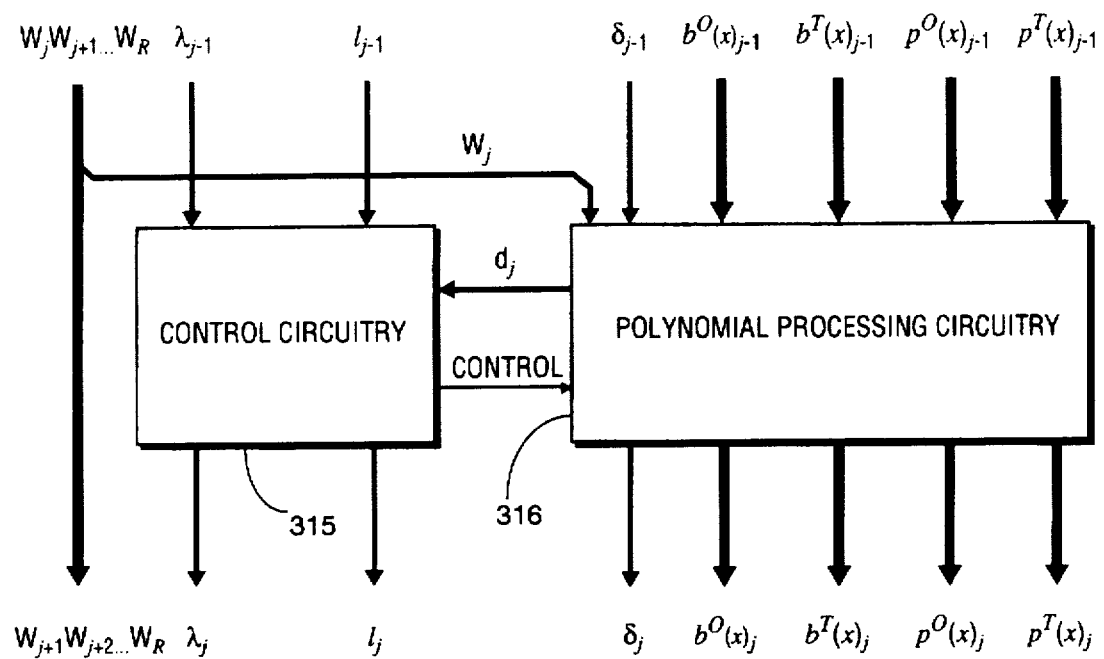

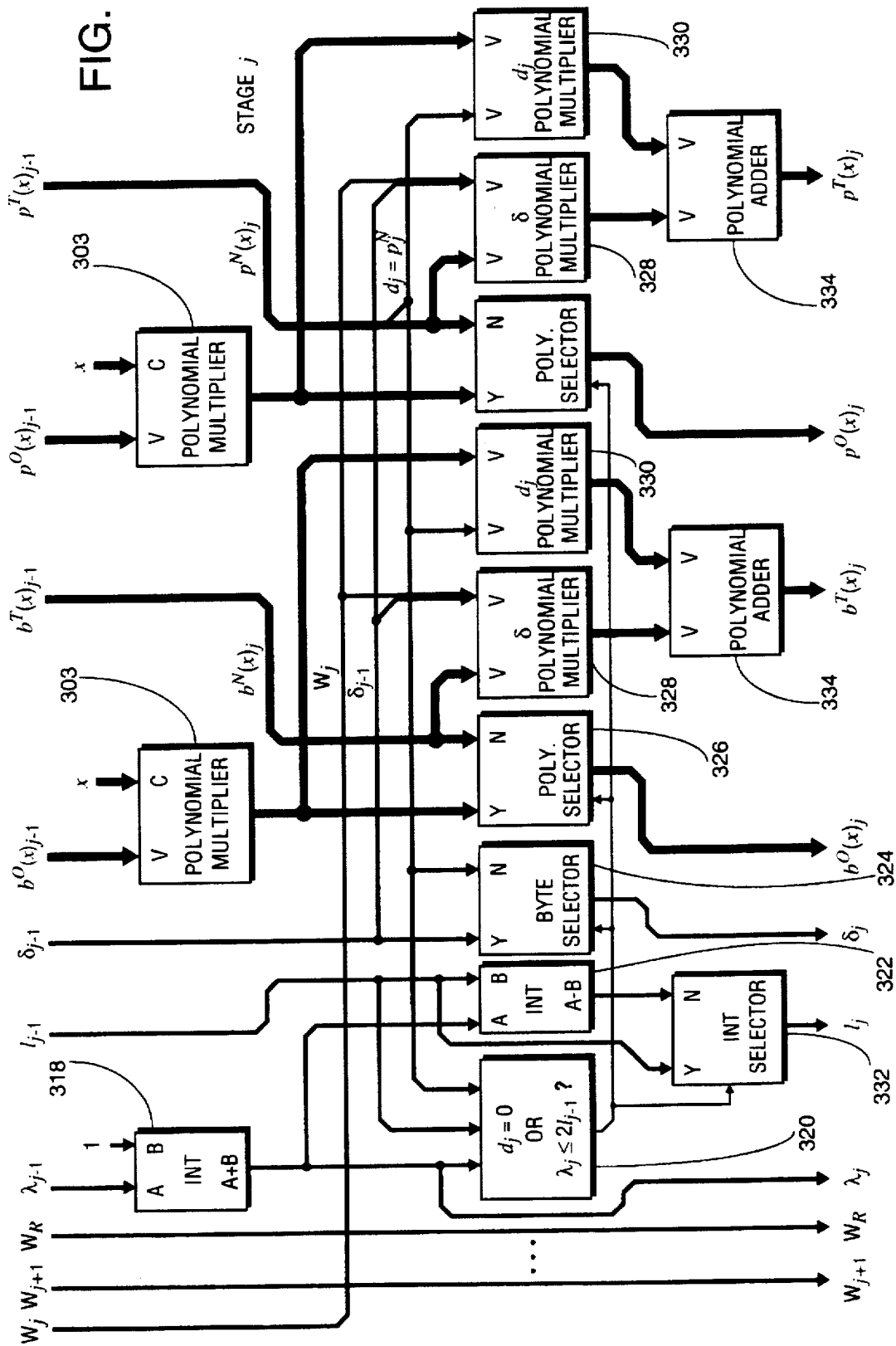
FIG. 5-C

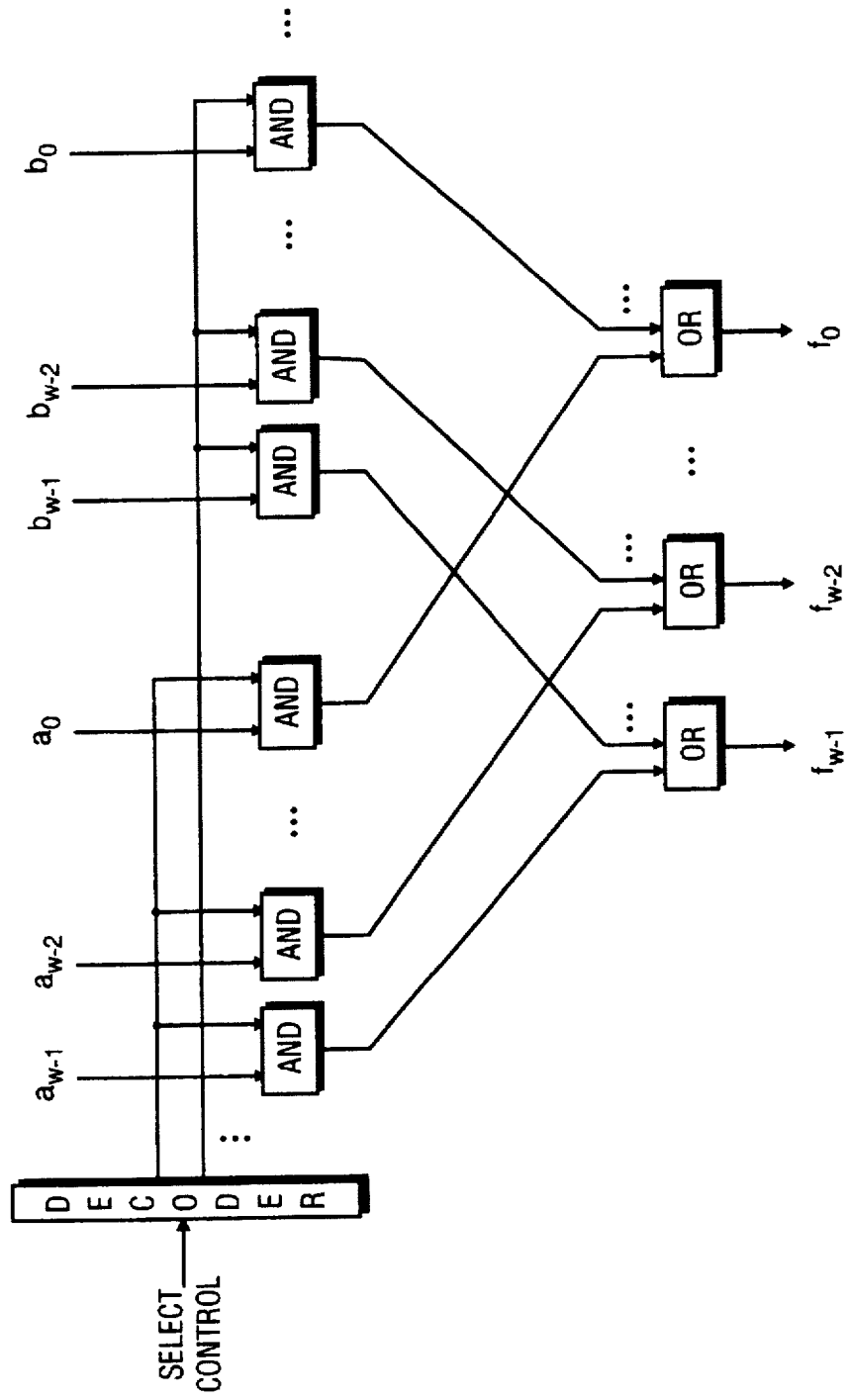
FIG. 5-D

FIG. 5-E
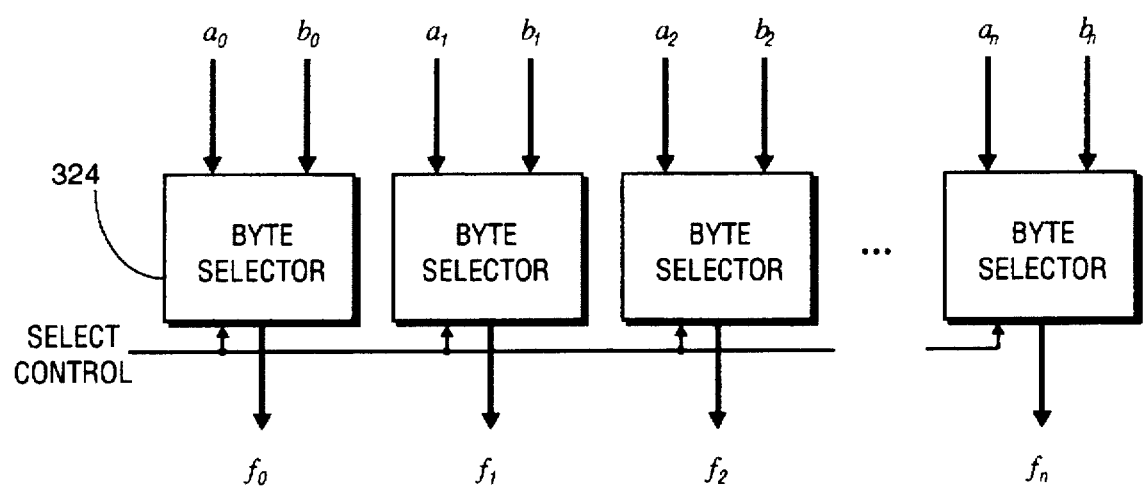

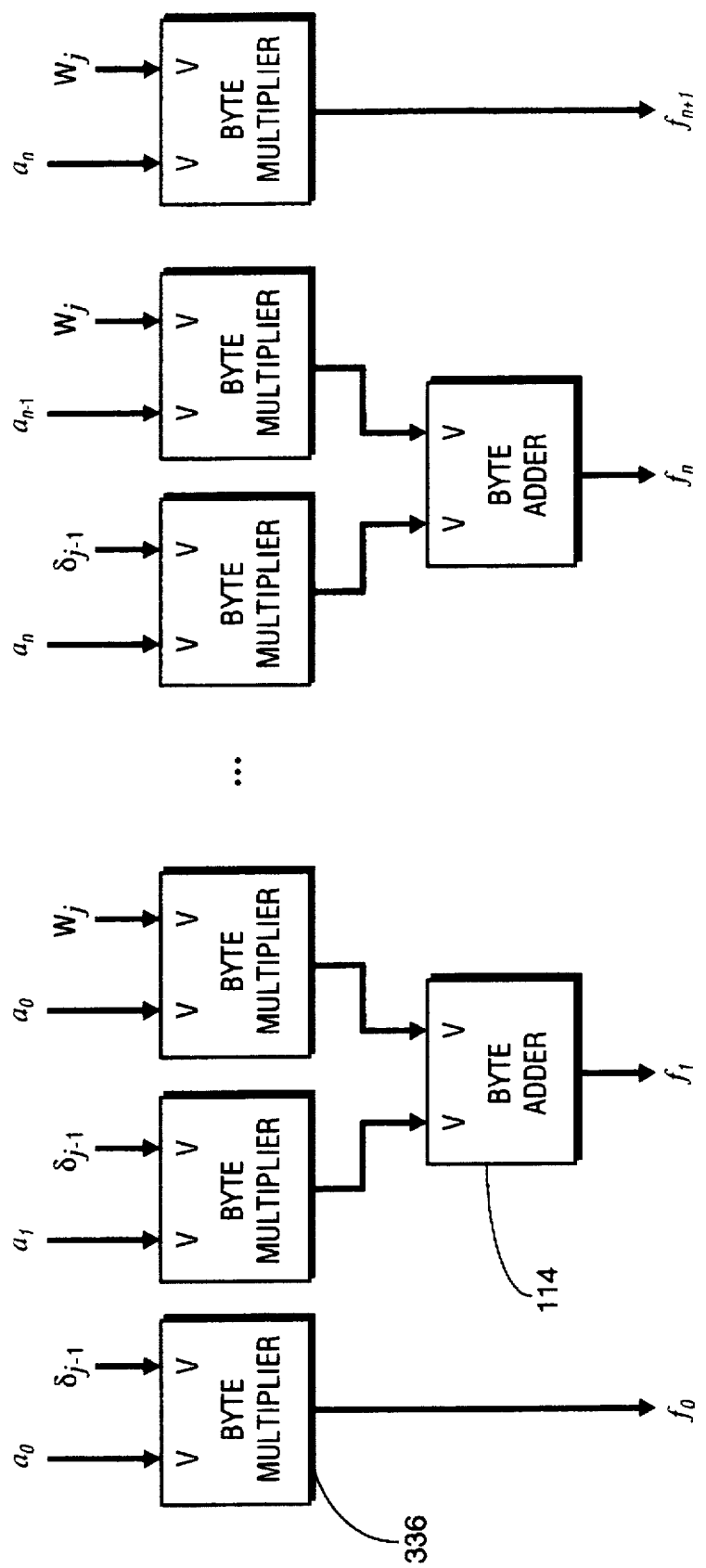
FIG. 5-F

FIG. 5-G
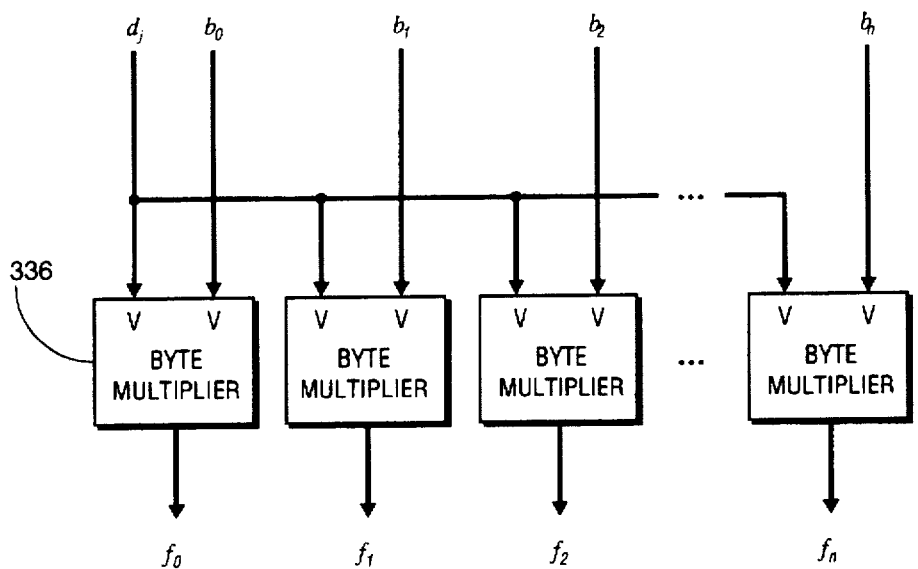
FIG. 5-H
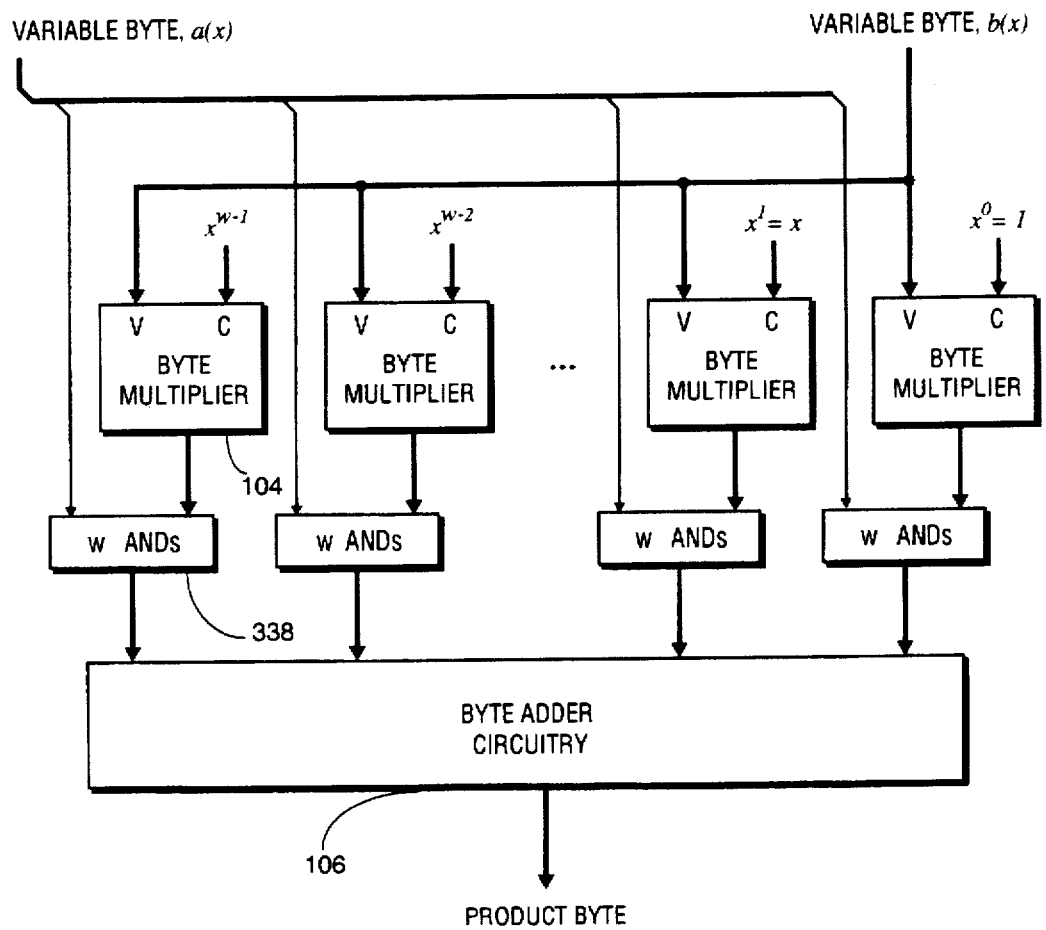

FIG. 5-I
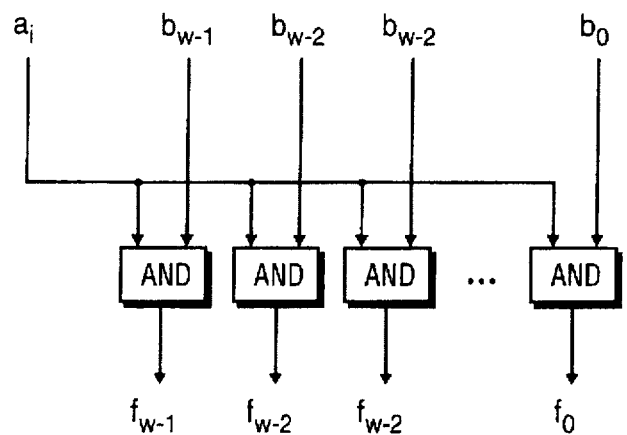
FIG. 5-J
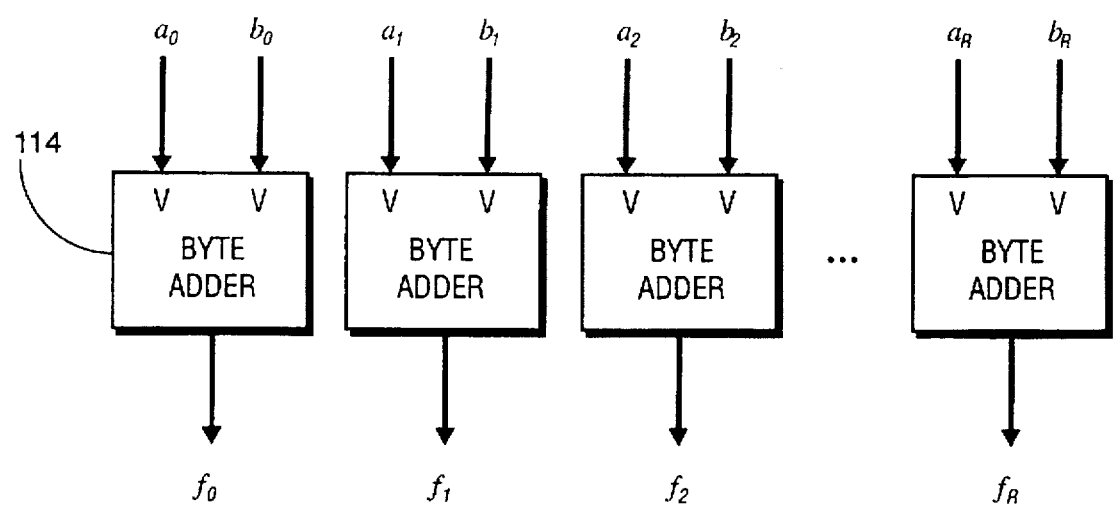

FIG. 6-A
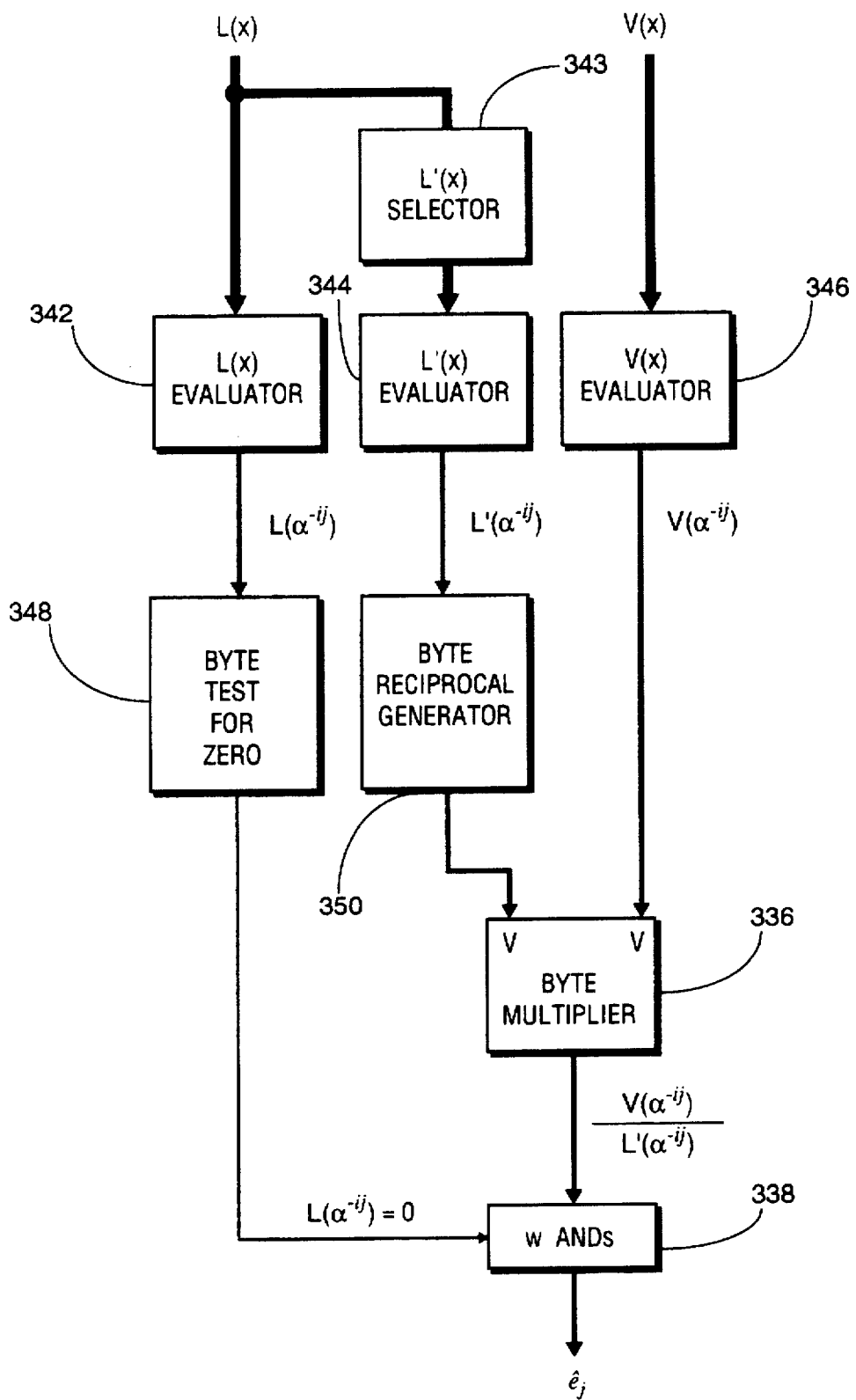

FIG. 6-B
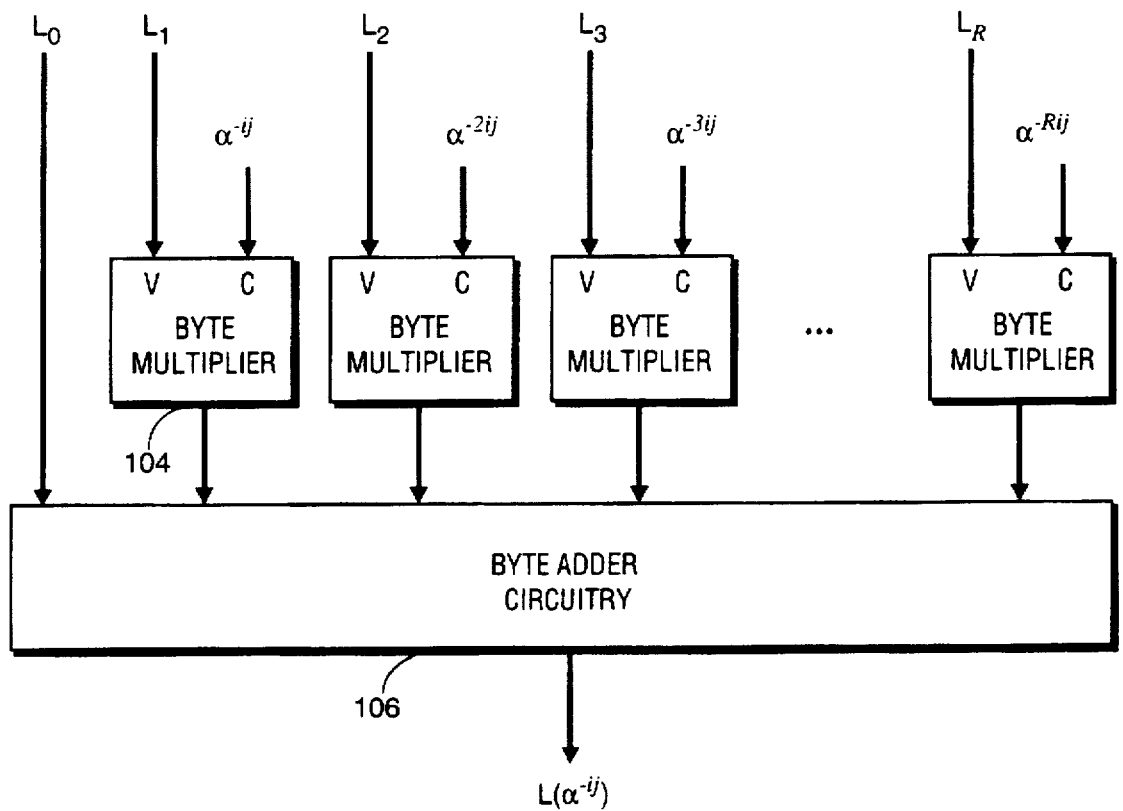
FIG. 6-C
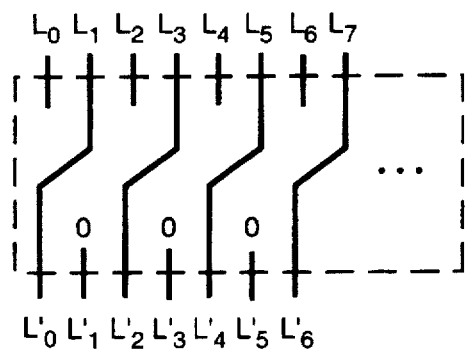

FIG. 6-D
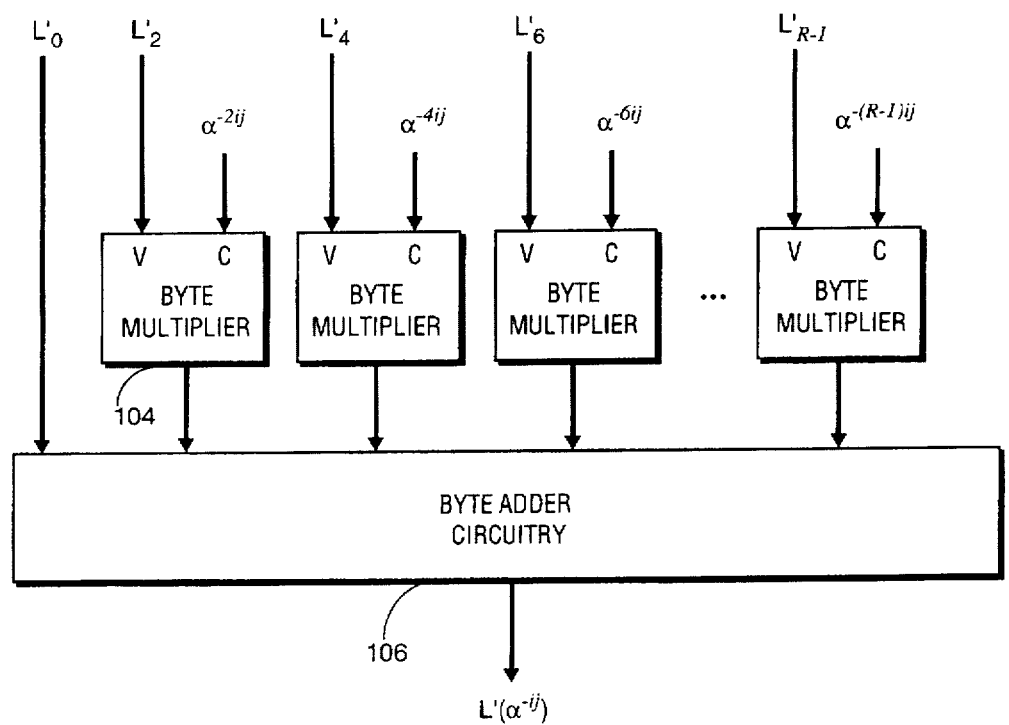
FIG. 6-E
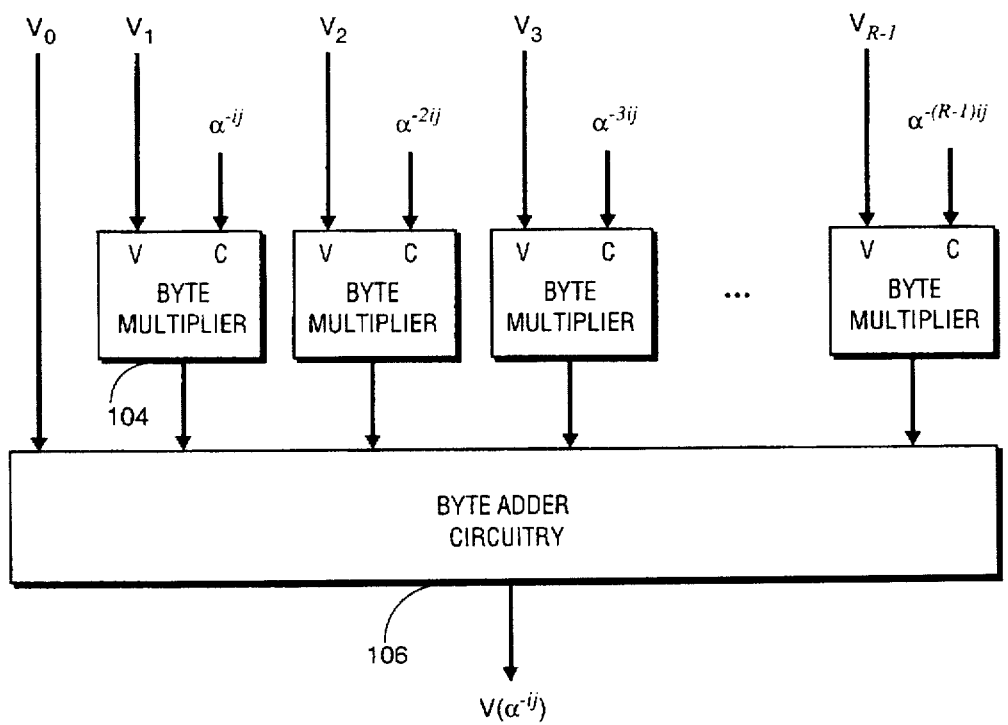

FIG. 7
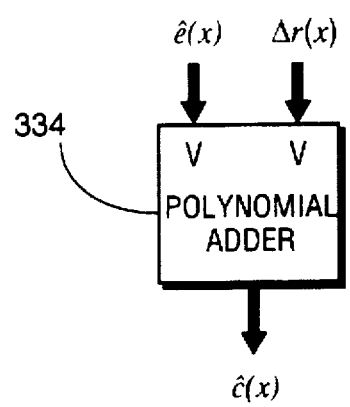
FIG. 7-A
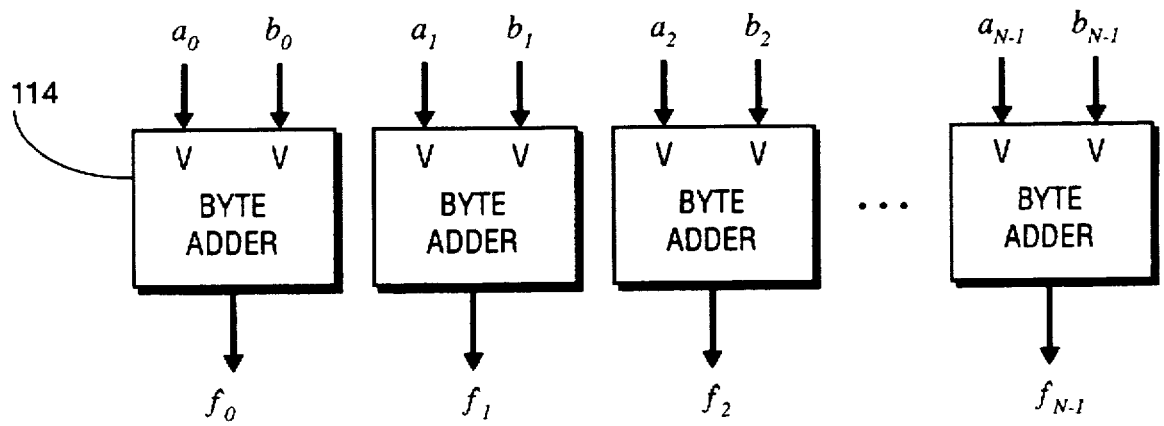

FIG. 9-A

| ADDRESS | DATA | | | | | |
|---|---|---|---|---|---|---|
| 0 | $\mu^0$ | $W_1^0$ | $W_2^0$ | $W_3^0$ | ... | $W_R^0$ |
| 1 | $\mu^1$ | $W_1^1$ | $W_2^1$ | $W_3^1$ | ... | $W_R^1$ |
| 2 | $\mu^2$ | $W_1^2$ | $W_2^2$ | $W_3^2$ | ... | $W_R^2$ |
| ⋮ | | | ⋮ | | | |
| $n$ | $\mu^n$ | $W_1^n$ | $W_2^n$ | $W_3^n$ | ... | $W_R^n$ |

FIG. 9-B
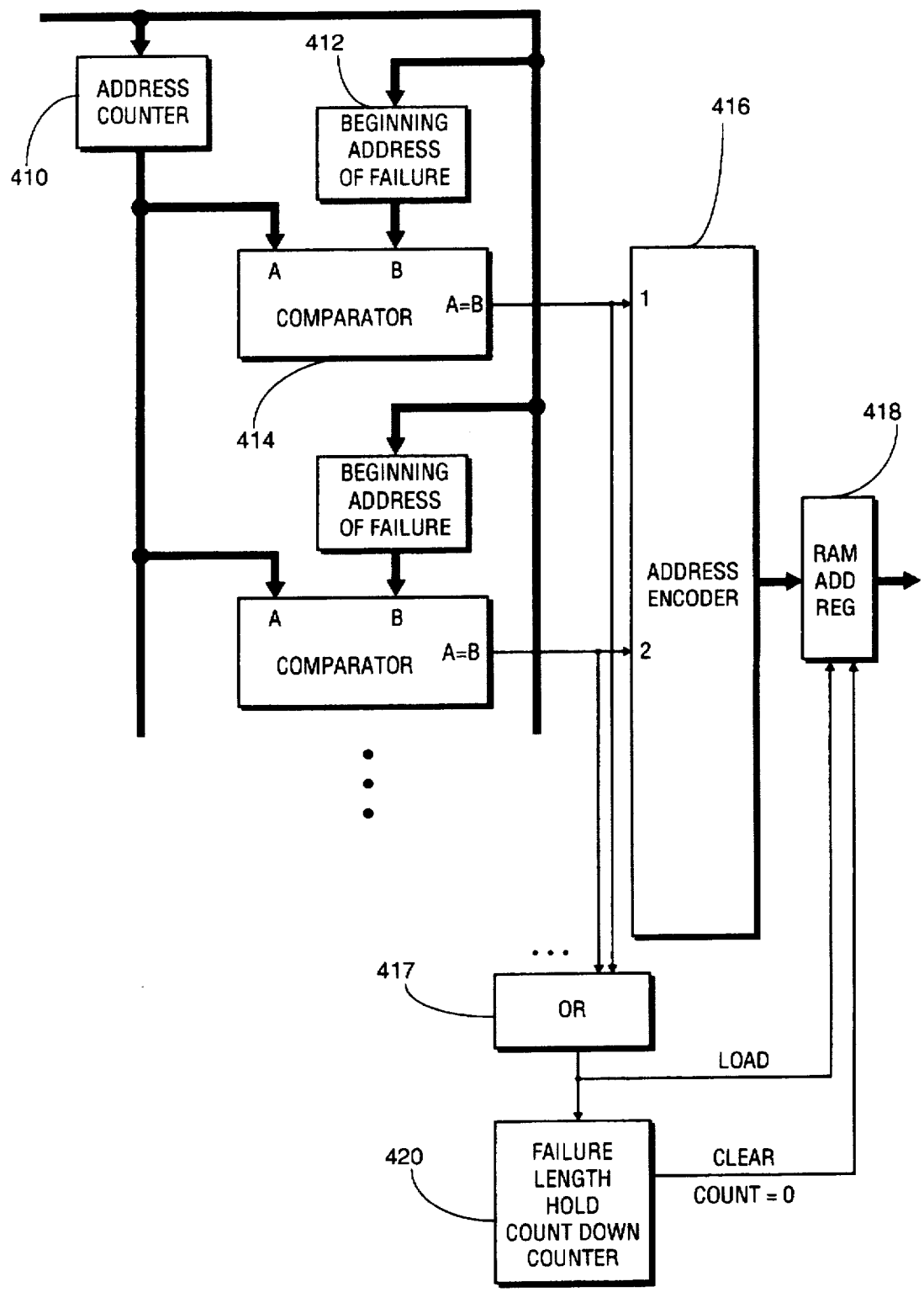

FIG. 12

| Element | Binary | Polynomial |
|---|---|---|
| 0 | 0000 | 0 |
| 1 | 0001 | 1 |
| a | 0010 | $x$ |
| b | 0100 | $x^2$ |
| c | 1000 | $x^3$ |
| d | 0011 | $x+1$ |
| e | 0110 | $x^2+x$ |
| f | 1100 | $x^3+x^2$ |

| Element | Binary | Polynomial |
|---|---|---|
| g | 1011 | $x^3+x+1$ |
| h | 0101 | $x^2+1$ |
| i | 1010 | $x^3+x$ |
| j | 0111 | $x^2+x+1$ |
| k | 1110 | $x^3+x^2+x$ |
| l | 1111 | $x^3+x^2+x+1$ |
| m | 1101 | $x^3+x^2+1$ |
| n | 1001 | $x^3+1$ |

FIG. 12-A

| + | 0 | 1 | a | b | c | d | e | f | g | h | i | j | k | l | m | n |
|---|---|---|---|---|---|---|---|---|---|---|---|---|---|---|---|---|
| 0 | 0 | 1 | a | b | c | d | e | f | g | h | i | j | k | l | m | n |
| 1 | 1 | 0 | d | h | n | a | j | m | i | b | g | e | l | k | f | c |
| a | a | d | 0 | e | i | 1 | b | k | n | j | c | h | f | m | l | g |
| b | b | h | e | 0 | f | j | a | c | l | 1 | k | d | i | g | n | m |
| c | c | n | i | f | 0 | g | k | b | d | m | a | l | e | j | h | 1 |
| d | d | a | 1 | j | g | 0 | h | l | c | e | n | b | m | f | k | i |
| e | e | j | b | a | k | h | 0 | i | m | d | f | 1 | c | n | g | l |
| f | f | m | k | c | b | l | i | o | j | n | e | g | a | d | 1 | h |
| g | g | i | n | l | d | c | m | j | 0 | k | 1 | f | h | b | e | a |
| h | h | b | j | 1 | m | e | d | n | k | 0 | l | a | g | i | c | f |
| i | i | g | c | k | a | n | f | e | 1 | l | 0 | m | b | h | j | d |
| j | j | e | h | d | l | b | 1 | g | f | a | m | 0 | n | c | i | k |
| k | k | l | f | i | e | m | c | a | h | g | b | n | 0 | 1 | d | j |
| l | l | k | m | g | j | f | n | d | b | i | h | c | 1 | 0 | a | e |
| m | m | f | l | n | h | k | g | 1 | e | c | j | i | d | a | 0 | b |
| n | n | c | g | m | 1 | i | l | h | a | f | d | k | j | e | b | 0 |

FIG. 12-B

| • | 0 | 1 | a | b | c | d | e | f | g | h | i | j | k | l | m | n |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 1 | 0 | 1 | a | b | c | d | e | f | g | h | i | j | k | l | m | n |
| a | 0 | a | b | c | d | e | f | g | h | i | j | k | l | m | n | 1 |
| b | 0 | b | c | d | e | f | g | h | i | j | k | l | m | n | 1 | a |
| c | 0 | c | d | e | f | g | h | i | j | k | l | m | n | 1 | a | b |
| d | 0 | d | e | f | g | h | i | j | k | l | m | n | 1 | a | b | c |
| e | 0 | e | f | g | h | i | j | k | l | m | n | 1 | a | b | c | d |
| f | 0 | f | g | h | i | j | k | l | m | n | 1 | a | b | c | d | e |
| g | 0 | g | h | i | j | k | l | m | n | 1 | a | b | c | d | e | f |
| h | 0 | h | i | j | k | l | m | n | 1 | a | b | c | d | e | f | g |
| i | 0 | i | j | k | l | m | n | 1 | a | b | c | d | e | f | g | h |
| j | 0 | j | k | l | m | n | 1 | a | b | c | d | e | f | g | h | i |
| k | 0 | k | l | m | n | 1 | a | b | c | d | e | f | g | h | i | j |
| l | 0 | l | m | n | 1 | a | b | c | d | e | f | g | h | i | j | k |
| m | 0 | m | n | 1 | a | b | c | d | e | f | g | h | i | j | k | l |
| n | 0 | n | 1 | a | b | c | d | e | f | g | h | i | j | k | l | m |

| $x$ | 1 | a | b | c | d | e | f | g | h | i | j | k | l | m | n |
|---|---|---|---|---|---|---|---|---|---|---|---|---|---|---|---|
| $x^{-1}$ | 1 | n | m | l | k | j | i | h | g | f | e | d | c | b | a |

FIG. 12-C

| position | 1 | a | b | c | d | e | f | g |
|---|---|---|---|---|---|---|---|---|
| position$^{-1}$ | 1 | n | m | l | k | j | i | h |
| $c_i$ | $c_0$ | $c_1$ | $c_2$ | $c_3$ | $c_4$ | $c_5$ | $c_6$ | $c_7$ |

FIG. 13-A
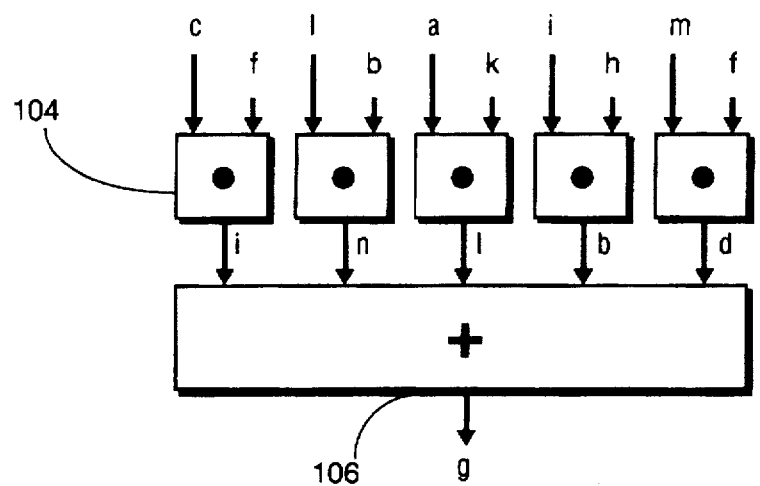
FIG. 13-B
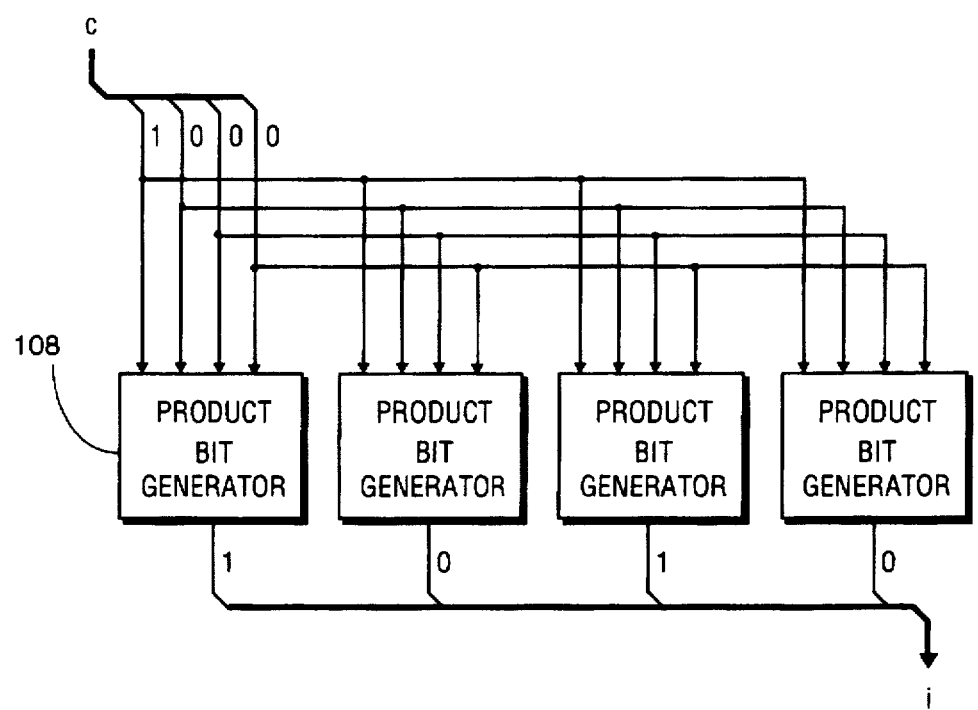

FIG. 13-C
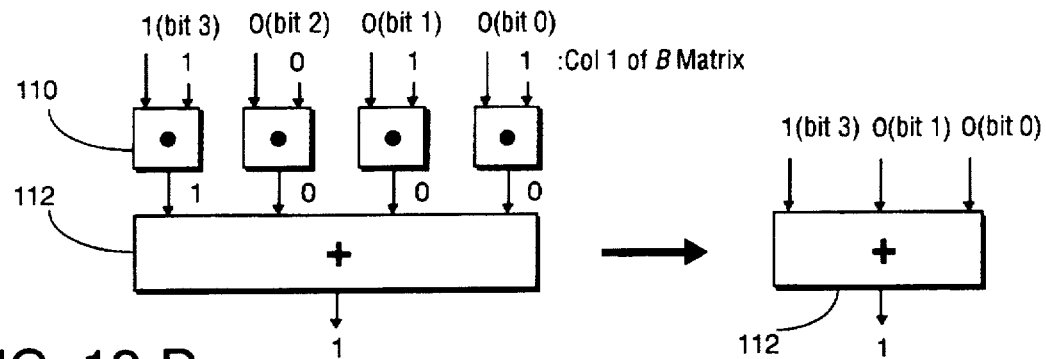
FIG. 13-D
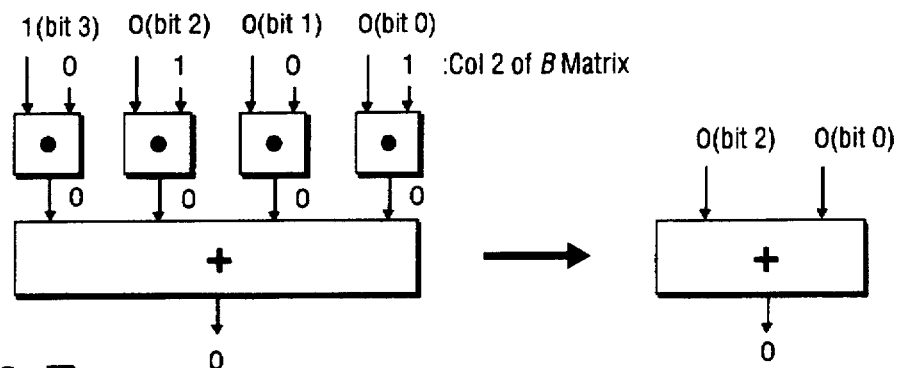
FIG. 13-E
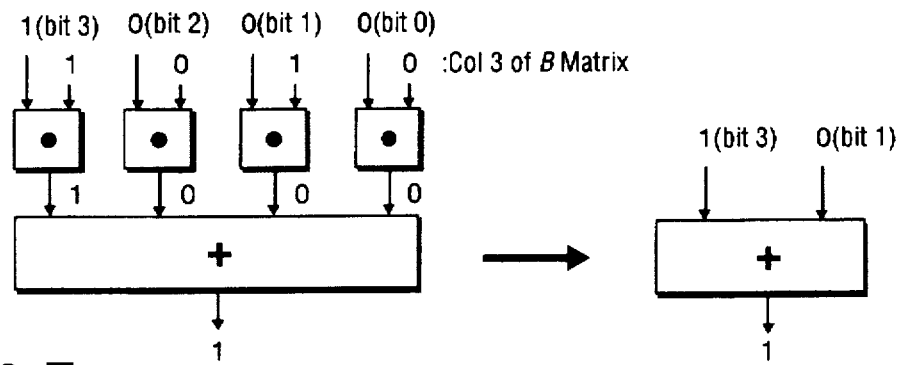
FIG. 13-F
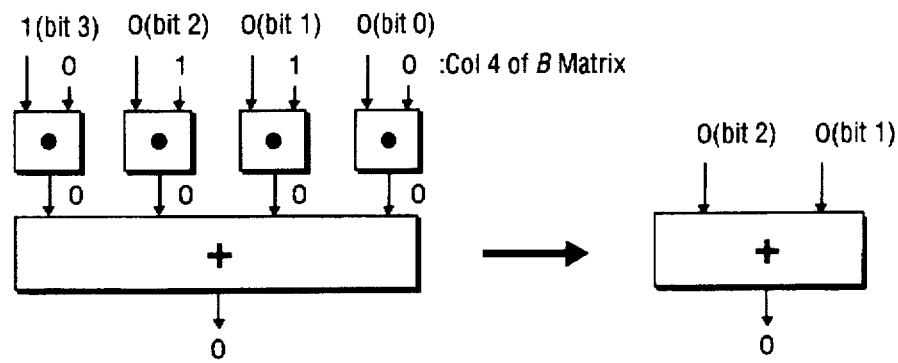

FIG. 13-G
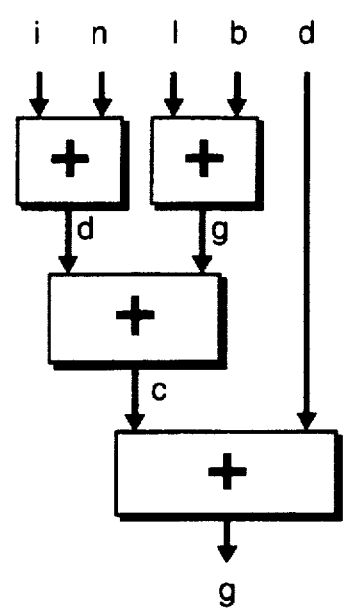

FIG. 14

|  | μ | W$_1$ | W$_2$ | W$_3$ |
|---|---|---|---|---|
| ADDRESS | DATA | | | |
| 0 | 1 | g | 0 | 0 |
| 1 | X | X | X | X |
| 2 | X | X | X | X |
| ⋮ | | | ⋮ | |
| n | X | X | X | X |

X = DON'T CARE

FIG. 16
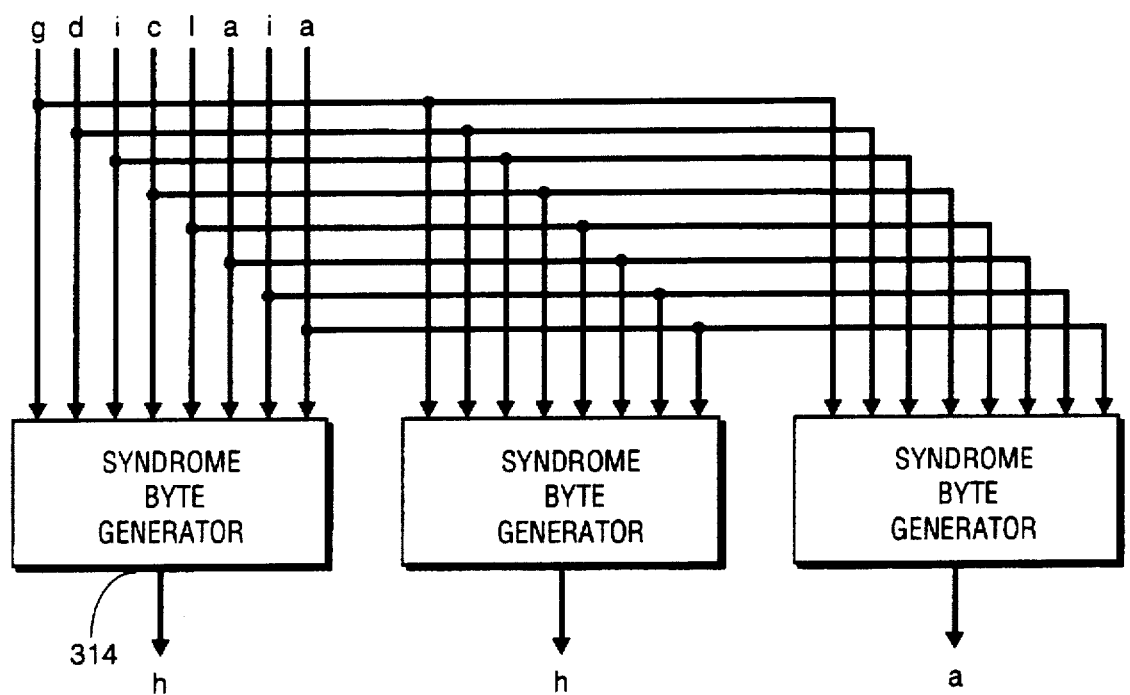
FIG. 16-A
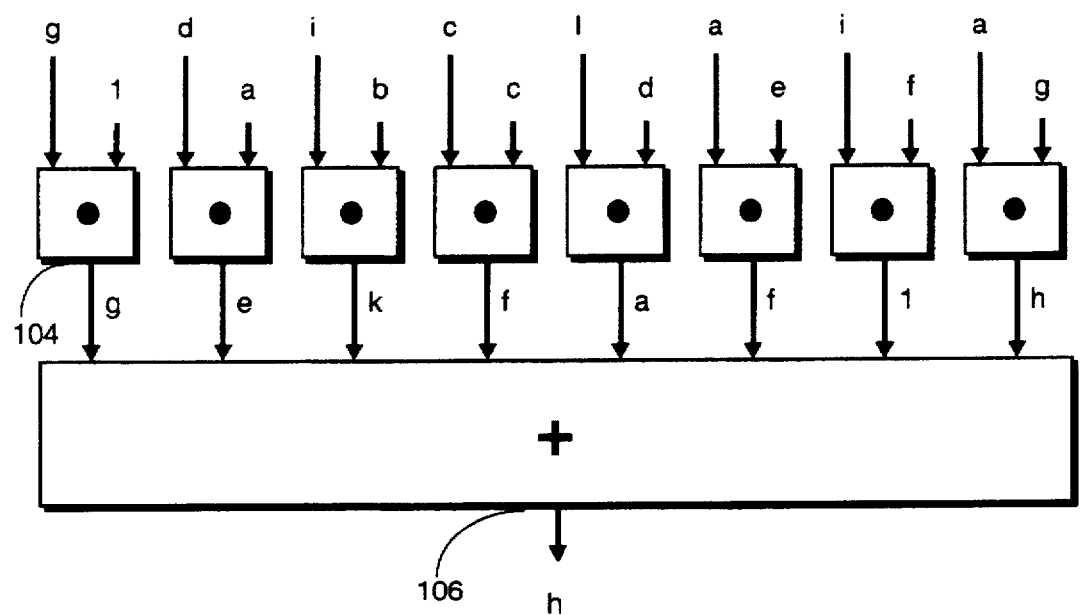

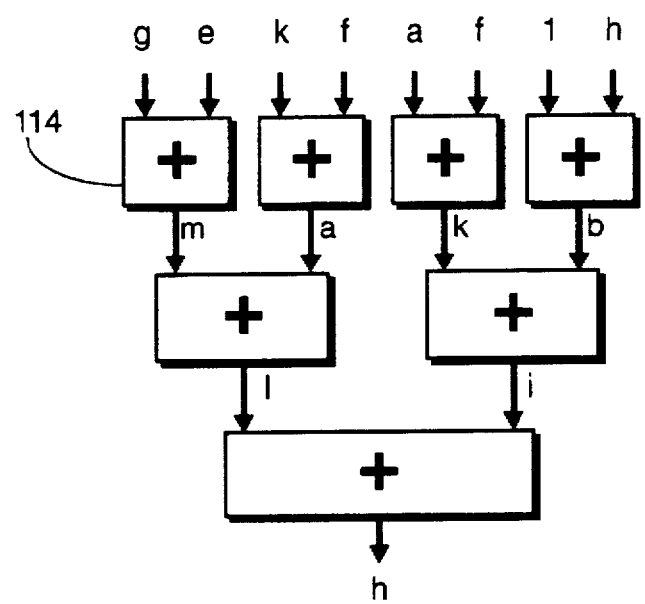
FIG. 16-B

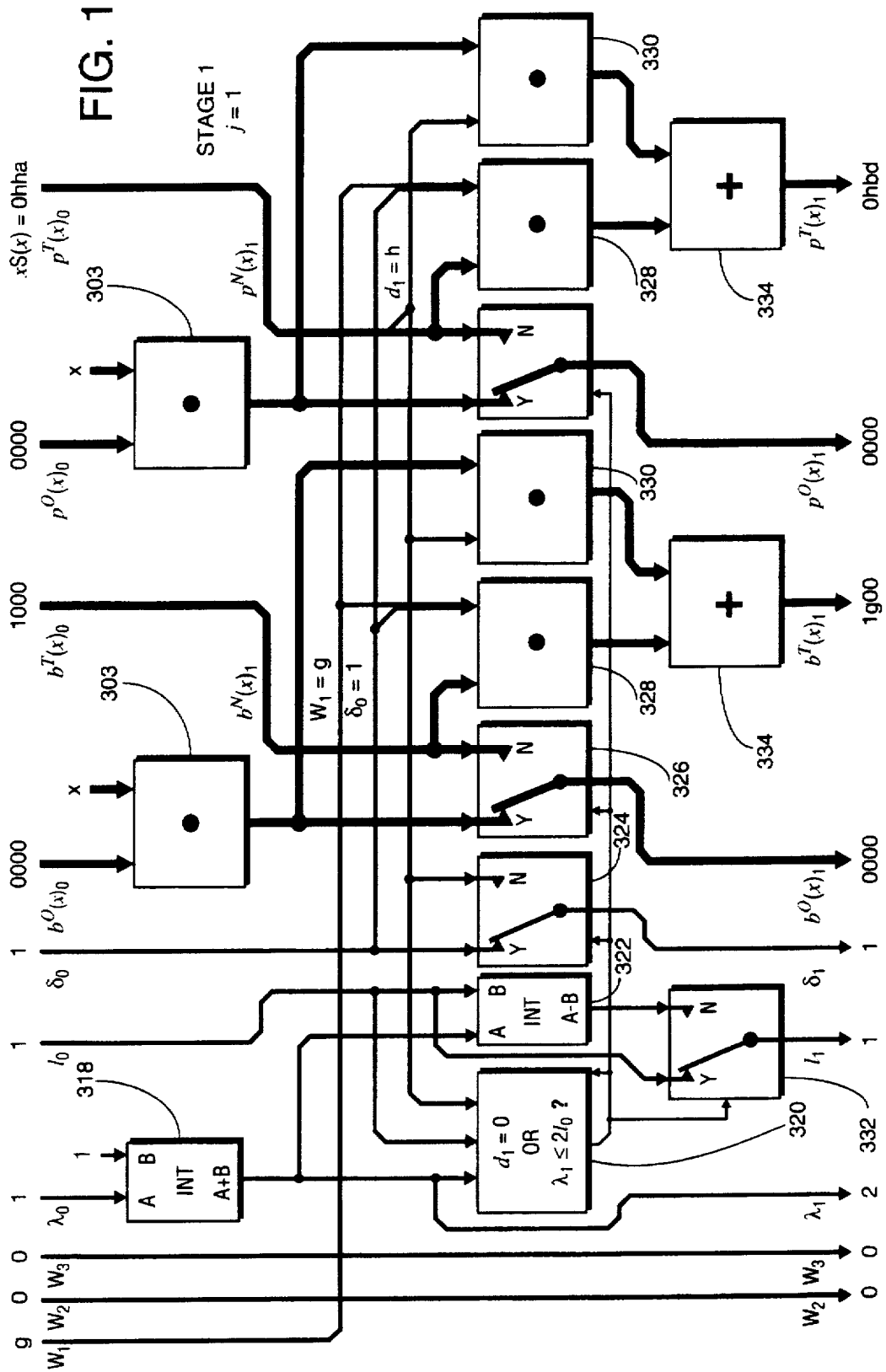
FIG. 17-A

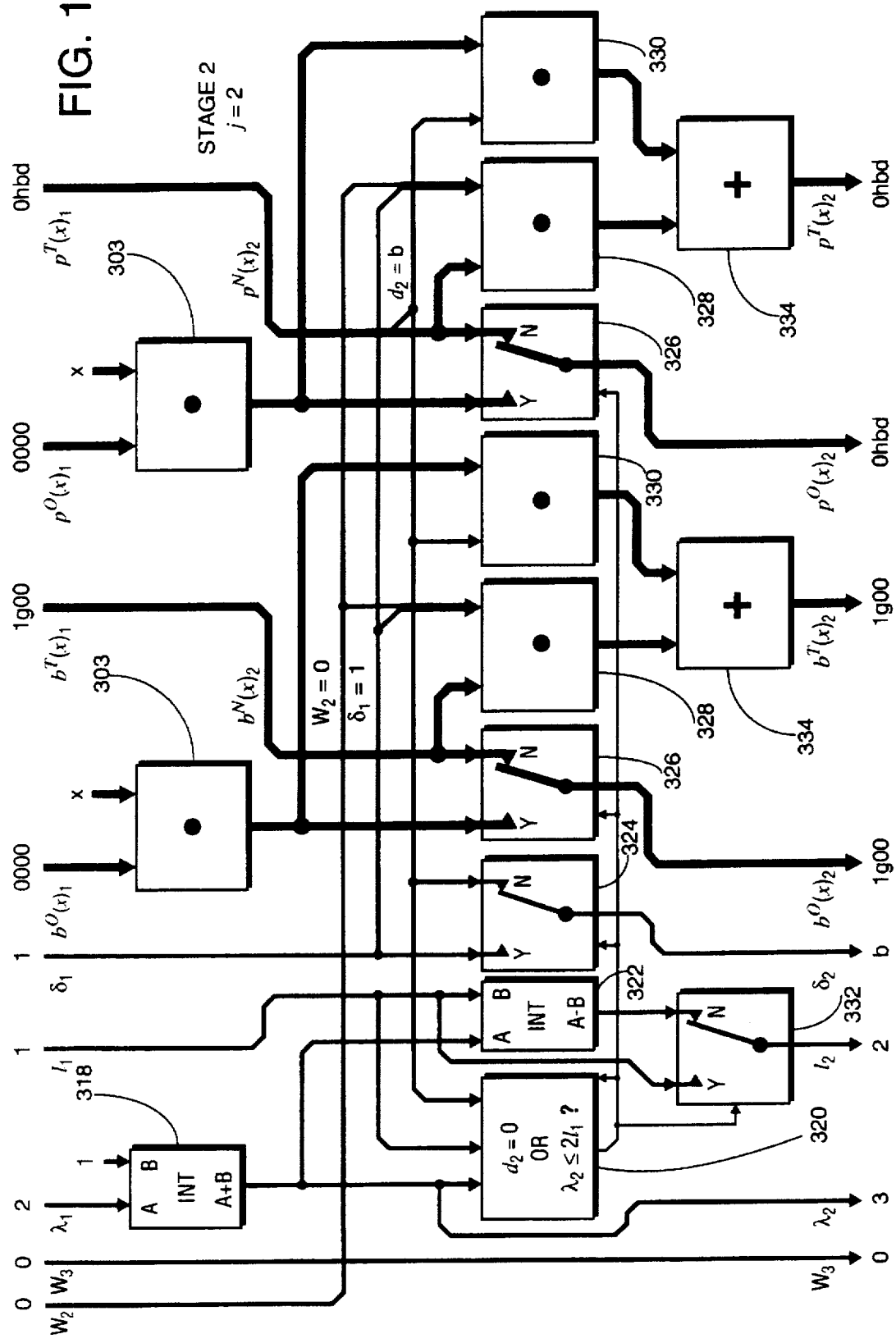
FIG. 17-B

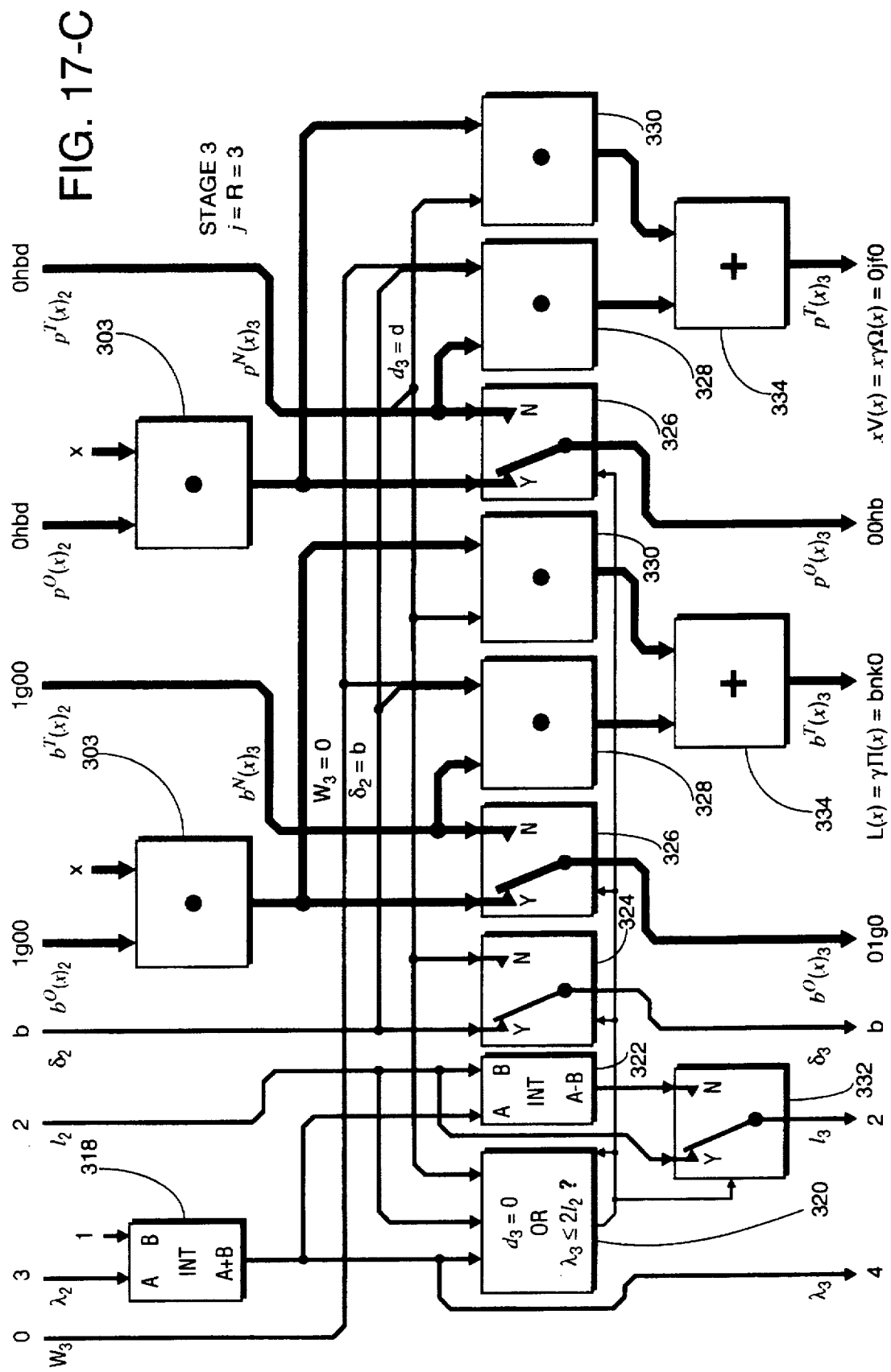

FIG. 18-A
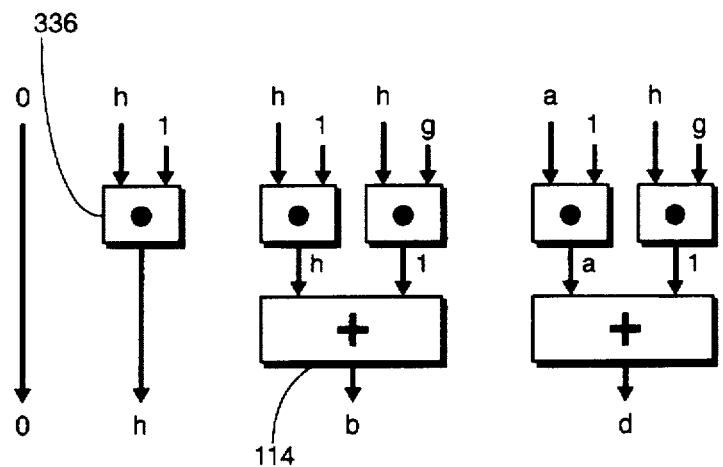
FIG. 18-B
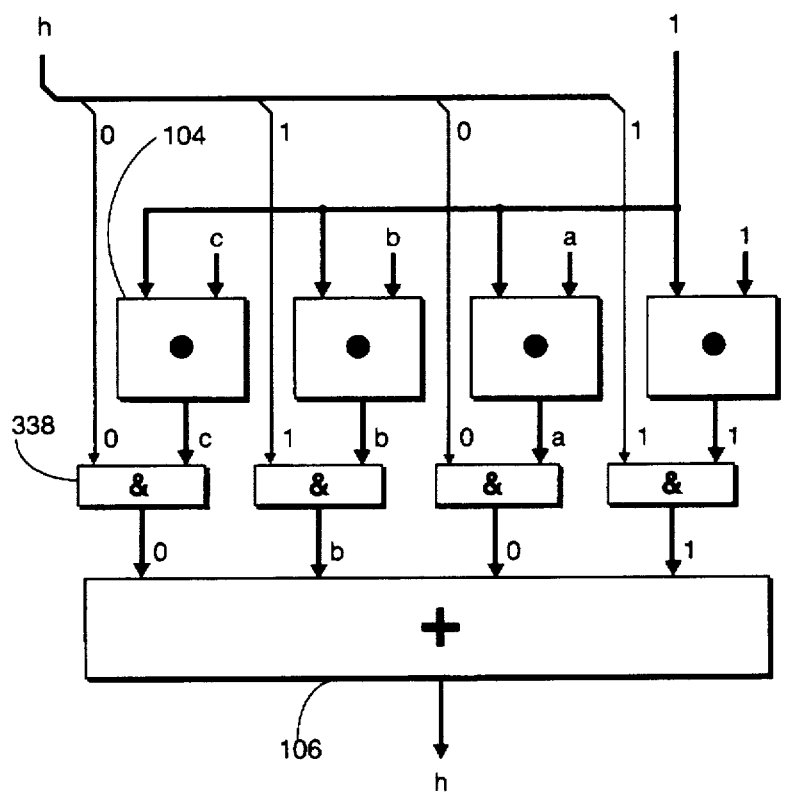

FIG. 19-A
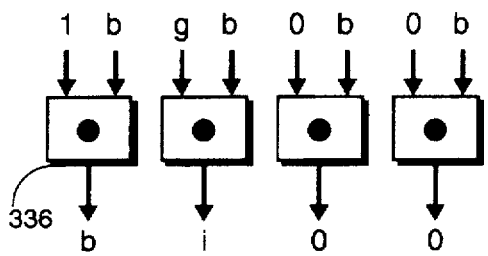
FIG. 19-B
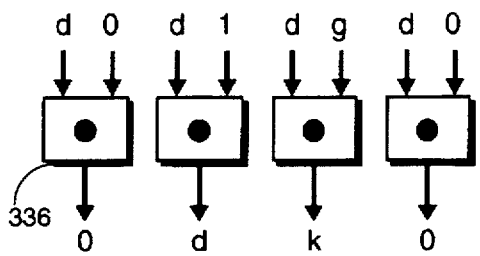
FIG. 19-C
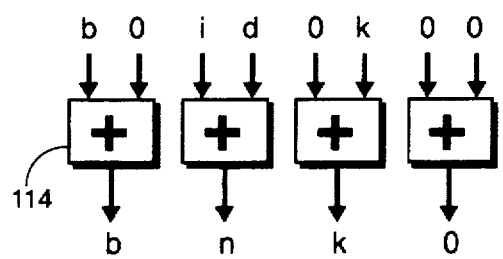
FIG. 19-D
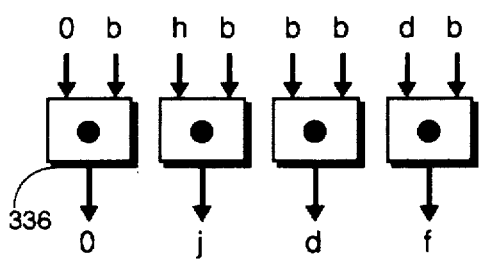
FIG. 19-E
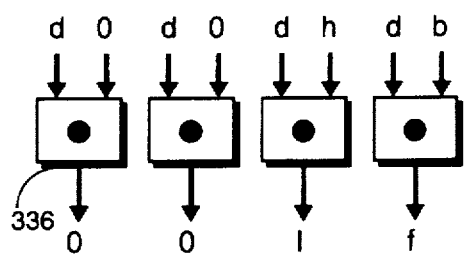
FIG. 19-F
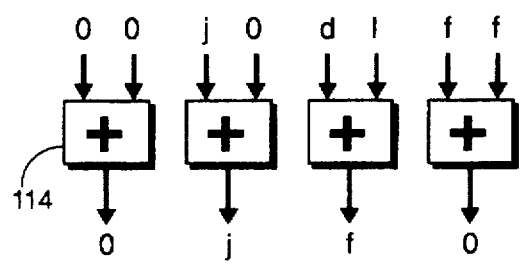

FIG. 20-A
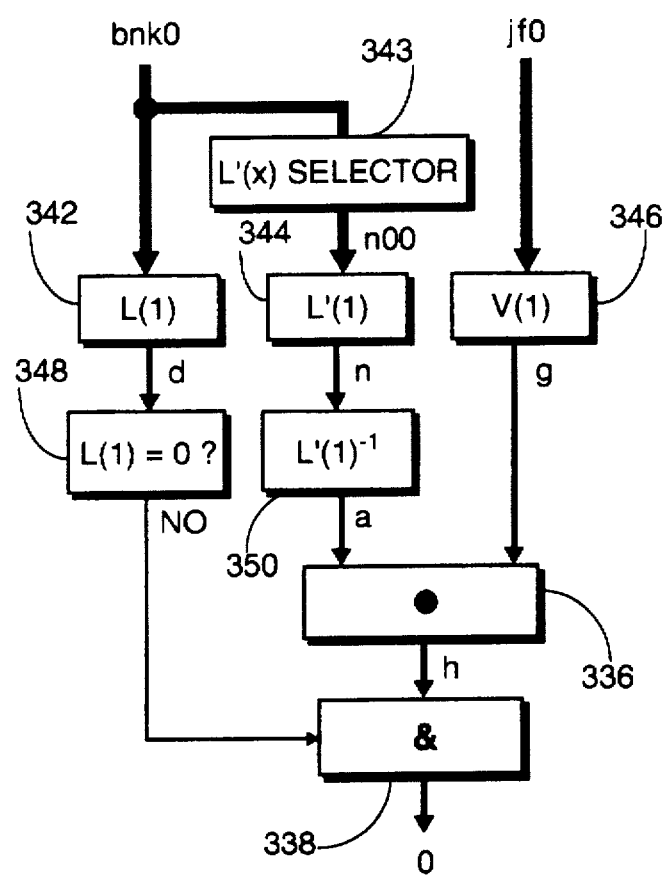

FIG. 20-B
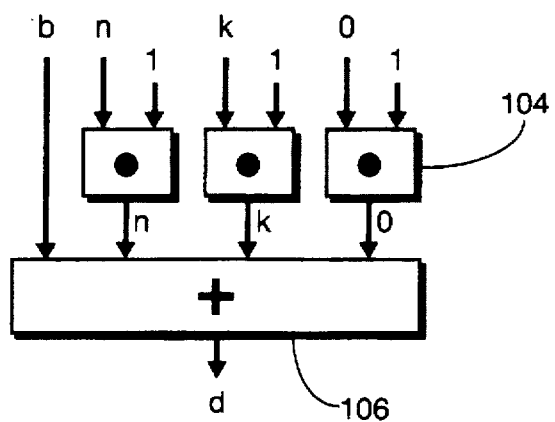
FIG. 20-C
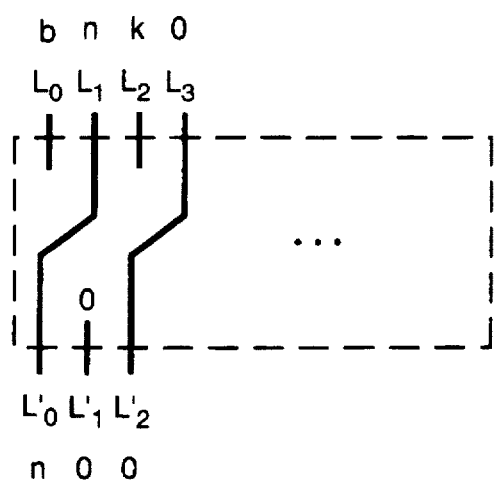
FIG. 20-D
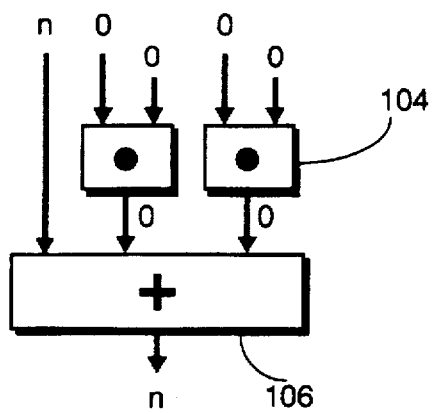
FIG. 20-E
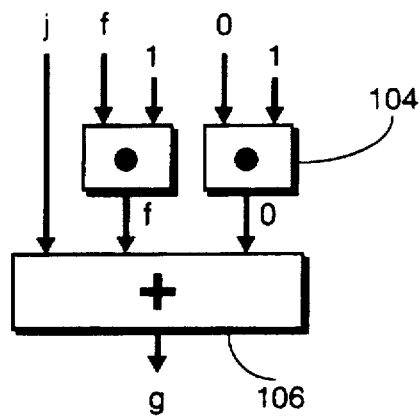

BYTE-PARALLEL SYSTEM FOR IMPLEMENTING REED-SOLOMON ERROR-CORRECTING CODES

BACKGROUND OF THE INVENTION

1. Field of the Invention

The present invention relates generally to error-correcting systems for bit-encoded data, and more particularly to Reed-Solomon error-correcting systems that operate in a parallel and pipelined fashion.

2. Description of the Prior Art

Since the development of information theory and coding theory in 1948, numerous types of error-correcting systems have been designed and developed.

The first error-correcting system corrected a single bit in error in a group of bits. Shortly thereafter, error-correcting systems were developed to correct a single burst of bit errors in a block of bits. Error-correcting systems operate on data either as a set of bits or as a set of bytes, where the number of bits per byte is normally 8, but can be any number greater than 1. Error-correcting systems that operate on bits are called binary error-correcting systems and those that operate on bytes are called nonbinary error-correcting systems. Early error-correcting systems are examples of binary systems.

Nonbinary error-correcting systems were implemented after the discovery in 1968 of an iterative algorithm to solve the key decoding equation known as the Berlekamp-Massey algorithm in honor of its inventors. Since 1968, several other iterative algorithms have been discovered to solve the key decoding equation. In addition, algorithms which operate on matrices have been developed to solve the key decoding equation. Some decoding methods do not use the key decoding equation.

Reed-Solomon error-correcting systems are nonbinary. In the past decade, their use has become widespread. They are regularly used in magnetic disk drives, optical disk drives, magnetic tape drives and in communications systems.

Nearly all prior Reed-Solomon error-correcting systems are implemented such that most of the encoding and decoding functions are done in a byte-by-byte serial fashion. Some Reed-Solomon implementations solve the key decoding equation in a parallel fashion, but nearly all Reed-Solomon implementations encode serially, generate the syndrome word serially and determine the most-likely error pattern serially, thereby limiting performance.

Some prior Reed-Solomon error-correcting systems correct errors only, some correct erasures only and some correct both errors and erasures. (An error is a byte in error about which no information is known. An erasure is a byte that is likely to be in error and the location is known by the decoder before decoding begins. In the present invention, an erasure is referred to as a byte failure location.) In prior Reed-Solomon error-correcting systems that use byte failure location information, this information is transmitted directly from the transmission or storage channel(s) to the decoder. These systems require an entire block of data to be received before decoding can begin, so, storage must be provided for at least one block of data. For example, in disk array systems where the error-correction system within each disk drive is used to indicate a failed drive, an entire sector of data must be read from each disk in the array before byte failure location information can be determined.

Prior encoders which encode Reed-Solomon codes operate on message word bytes serially, which limits the speed of encoding. Prior Reed-Solomon error-correcting systems do not implement all the decoding functions in a parallel fashion. For example, prior syndrome word generators operate serially on bytes of the received word, which limits the speed of syndrome word generation. Prior decoding circuits that generate the most-likely error word operate serially, which limits the speed of decoding.

Prior Reed-Solomon error-correcting systems have not been designed to operate in a combination parallel and pipelined fashion. This limits the performance throughput. Due to this limit on performance, semiconductor memories have not been able to take advantage of the capabilities of Reed-Solomon error-correcting systems.

In prior decoders that use byte failure location information, the channel failure indicators are communicated directly from the channels to the decoder. This is an unreliable method when determining if a channel has failed since the channel is, in effect, diagnosing itself. If an indicated byte failure location is not actually in error, the decoder has lost some of its capability to correct other random errors. Prior Reed-Solomon decoders which receive byte failure location information directly from the channels also require an entire block of data to be read before correction can begin.

Most prior storage systems that use a Reed-Solomon error-correction system to create fault-tolerance have a low-level of fault-tolerance. They can only correct for one channel failure, so a problem arises when multiple channels fail simultaneously.

Prior Reed-Solomon decoders are not easily scalable. They have been configured to work for one level of error correction and do not provide a pattern for a design which would provide a higher or lower level of error correction.

SUMMARY OF THE INVENTION

Objects

The first object of the error-correcting system is to implement highly-parallel versions of Reed-Solomon encoding and decoding algorithms so that encoding and decoding can be done in a parallel fashion, thereby overcoming the performance limitations in conventional implementations due to functions which operate on bytes serially. The encoding and decoding functions of the Reed-Solomon error-correcting system are implemented in a highly-parallel fashion through the use of parallel processing circuitry.

The second object of the error-correcting system is to provide the means to encode and decode words as fast as they can be sent. This is done by implementing Reed-Solomon encoders and decoders in a "pipelined" fashion where each segment of an encoder or decoder "pipe" is a stage of digital electronics. Each stage of a pipe encompasses one or more levels of digital logic gates. Pipelining allows parallel Reed-Solomon encoders and decoders to receive inputs at very high (fiber optic) rates and deliver outputs at correspondingly high rates. Since the error-correcting system consists of levels of digital electronics, registers can be selectively added between levels which results in higher performance in terms of the amount of information that can be encoded and decoded in a fixed unit of time even though the time through the pipe may be increased.

The third object of the error-correcting system is to combine highly-parallel versions of Reed-Solomon encoding and decoding circuitry with the encoders and decoders configured in a "pipelined" fashion to further enhance performance.

The fourth object of the error-correcting system is to provide an improved method and apparatus for generating byte failure location information and presenting it to the decoder, thereby overcoming the problems associated with prior systems which use failure indicators directly from channels to indicate failure locations.

The fifth object of the error-correcting system is to enable the design of parallel communications or storage systems with a high degree of fault-tolerance by resolving situations where multiple channel failures are indicated simultaneously. This is done by inserting an intelligent entity which uses past error-correction history between the channel failure indicators and byte failure location information received by the decoder.

The sixth object of the error-correcting system is to provide a generic pattern for the design of parallelized and pipelined Reed-Solomon encoders and decoders so that, given one level of error correction capability, the design of other implementations to correct more or fewer errors is readily apparent.

The seventh object of the error-correcting system is to enable parallelized and pipelined encoders and decoders to be implemented in a single chip. The method and apparatus of the error-correcting system is designed to reduce the number of pins required to an acceptable level.

The foregoing and other objects are preferably accomplished in the following manner for Reed-Solomon codes:

On encoding, a message word, m, is multiplied by a Reed-Solomon generator matrix, G, to generate a code word, c. Matrix G can take one of two forms; one form generates systematic code words and the other non-systematic code words. (Systematic code words contain the message word bytes unaltered, while non-systematic code words encrypt the message word.) The preferred implementation is systematic. Encoding is a one-step operation accomplished by a set of parallel processing circuits.

On decoding, the syndrome word, S, is generated in a parallel fashion by multiplying the received word, r, by an error detection matrix, D, or by multiplying by an alternative error detection matrix, $D_A$, followed by multiplication by a roots matrix, $D_R$, where $S=rD_AD_R$. (D is the transpose of the conventional parity check matrix, H.) The preferred implementation uses D.

The key equation is solved in a parallel fashion by implementing a variation of Willard Eastman's modification to the Berlekamp-Massey algorithm as described in Proceedings of the 1988 Tactical Communications Conference, Vol. 1 (1988), Eastman, "Euclideanization of the Berlekamp-Massey Algorithm", pp. 295–303. This algorithm, Eastman's Program 6, is implemented in a parallel fashion with or without byte failure location information. The output of the key equation solver is an error locator polynomial, L(x), and an error evaluator polynomial, V(x), multiplied by the constant polynomial x, i.e. xV(x).

The error locator polynomial, L(x), is evaluated at each possible location simultaneously to determine the error locations.

The error evaluator polynomial, V(x), is evaluated at each possible location simultaneously and divided by the corresponding evaluation of the formal derivative of the error locator polynomial, L'(x), so as to determine the most-likely error pattern. See Encyclopedia of Mathematics and its Applications, Vol. 3, The Theory of Information and Coding (1977), McEliece, pp. 181–183.

Byte failure location information is provided to the decoder based upon a feedback failure location system comprising a microprocessor, a content-addressable memory (CAM) and a random-access memory (RAM). The communications system or storage system to which the error-correcting system is being applied is exercised periodically so as to determine the locations of failures based on frequency of correction. If data from certain locations is corrected at a frequency exceeding a preset threshold level, these locations will be indicated as failed locations or channels. Byte failure location information can also be determined by prior testing of the media.

The error-correcting system provides a general-purpose way of creating highly fault-tolerant communications and storage systems. It is easily configurable to allow for many levels of error correction and fault-tolerance.

The error-correcting system can be applied to all types of transmission and storage media including magnetic and optical disk, magnetic tape, semiconductor memory, fiber optic cables, and cabling of all types. The error-correcting system can be used with real-time digital video data and will correct for errors with no slowdown of the video.

A high level of fault-tolerance can be achieved. Failed components can be removed and replaced without shutting down or slowing down the system. Increasing the level of fault tolerance leads to more reliable systems that are capable of sustained periods of operation with little or no down time. This is significant because the storage industry is moving toward systems with arrays of smaller capacity devices, rather than increasing the capacity of a single device. Without increased fault-tolerance, storage systems which contain arrays with a large number of component devices would be too unreliable to be practical.

The error-correcting system allows the use of highly-flawed, unreliable or high error rate media. Previously unusable media can be used to produce highly-reliable communications and storage systems.

The error-correcting system significantly reduces the need to test manufactured media in the factory. Fabricated media can be installed in a communications or storage system that contains the error-correcting system, and a media defect map will automatically be generated by the feedback failure location system. The failed components can be removed and replaced.

Transmission speeds and storage capacities can be increased by allowing raw error rates to increase and using the error-correcting system to reduce the error rate to an acceptable level. The error-correcting system can be used with raw error rates as high as one byte in error for every thousand bytes transferred. Current systems require raw error rates as low as one byte in error for every billion bytes transferred. Due to the unprecedented speed of the error-correction system, it can be used with high-speed transmission and storage media such as fiber optic cable and semiconductor memory chips.

The error-correcting system requires a minimum amount of redundant information. Reed-Solomon codes are optimal from the standpoint of having the most error correction power for a given amount of redundancy. From that standpoint, the error-correcting system is optimal.

When used to replace the industry standard Single Error Correcting Double Error Detecting binary error-correcting system (SECDED) in semiconductor memories, the error-correcting system can either reduce the redundancy required and keep error-correcting capabilities the same, or increase error-correcting capabilities and keep redundancy requirements the same. Also, the next generation of memory chips being produced store 4-bit quantities rather than the current single-bit quantities. The error-correcting system can correct 4-bit or wider quantities.

Other objects and advantages of the error-correcting system will become apparent from a consideration of the drawings and the following detailed description.

BRIEF DESCRIPTION OF THE DRAWINGS

FIG. 2-A through FIG. 2-G illustrate features of the encoder.

FIG. 3-A is a block diagram of a polynomial multiplier which multiplies a variable polynomial by the constant x.

FIG. 3-B is a block diagram of a polynomial multiplier which multiplies a variable polynomial by the constant $x^{-1}$.

FIG. 4 is a block diagram of the syndrome generator.

FIG. 4-A is a block diagram of a syndrome byte generator.

FIG. 5-A is a flowchart of the logic executed by the key equation solver stages.

FIG. 5-B through FIG. 5-J illustrate elements of the key equation solver.

FIG. 6-A through FIG. 6-E illustrate elements of the most-likely error word generator.

FIG. 7 is a block diagram of the most-likely code word generator.

FIG. 7-A is a decomposition of the polynomial adder.

FIG. 9-A shows the content of the feedback failure location system's random access memory (RAM).

FIG. 9-B is a block diagram of the content-addressable memory (CAM).

FIG. 12 shows letter, binary and polynomial equivalents for each element in a finite field with 16 elements.

FIG. 12-A shows an addition table for a finite field with 16 elements.

FIG. 12-B shows multiplication and reciprocal tables for a finite field with 16 elements.

FIG. 12-C shows how the letters of a code word for the example case are labeled with (or identified by) the nonzero elements from a finite field with 16 elements.

FIG. 13-A through FIG. 13-G show data flow and operation of elements of the parallel encoder for the example case.

FIG. 14 shows the content of the feedback failure location system's RAM for the example case where channel "g" has failed.

FIG. 16 shows the data flow and operation of the syndrome generator for the example case.

FIG. 16-A shows the data flow and operation of the first syndrome byte generator for the example case.

FIG. 16-B shows the data flow and operation of the byte adder circuitry for the first syndrome byte generator for the example case.

FIG. 17-A through FIG. 17-C show data flow and operation of the three stages of the key equation solver for the example case.

FIG. 18-A shows the generation of $p^7(x)_1$ for stage 1 of the key equation solver for the example case.

FIG. 18-B shows the data flow and operation of the first byte multiplier that multiplies two variable bytes ("h" by "l" for the generation of $p^7(x)_1$ for stage 1 of the key equation solver for the example case.

FIG. 19-A through FIG. 19-F show data flow and operation of various elements of stage 3 of the key equation solver for the example case.

FIG. 20-A through FIG. 20-E show data flow and operation of various elements of the most-likely error word generator for the example case.

DETAILED DESCRIPTION OF THE PREFERRED EMBODIMENT

Figure 1:
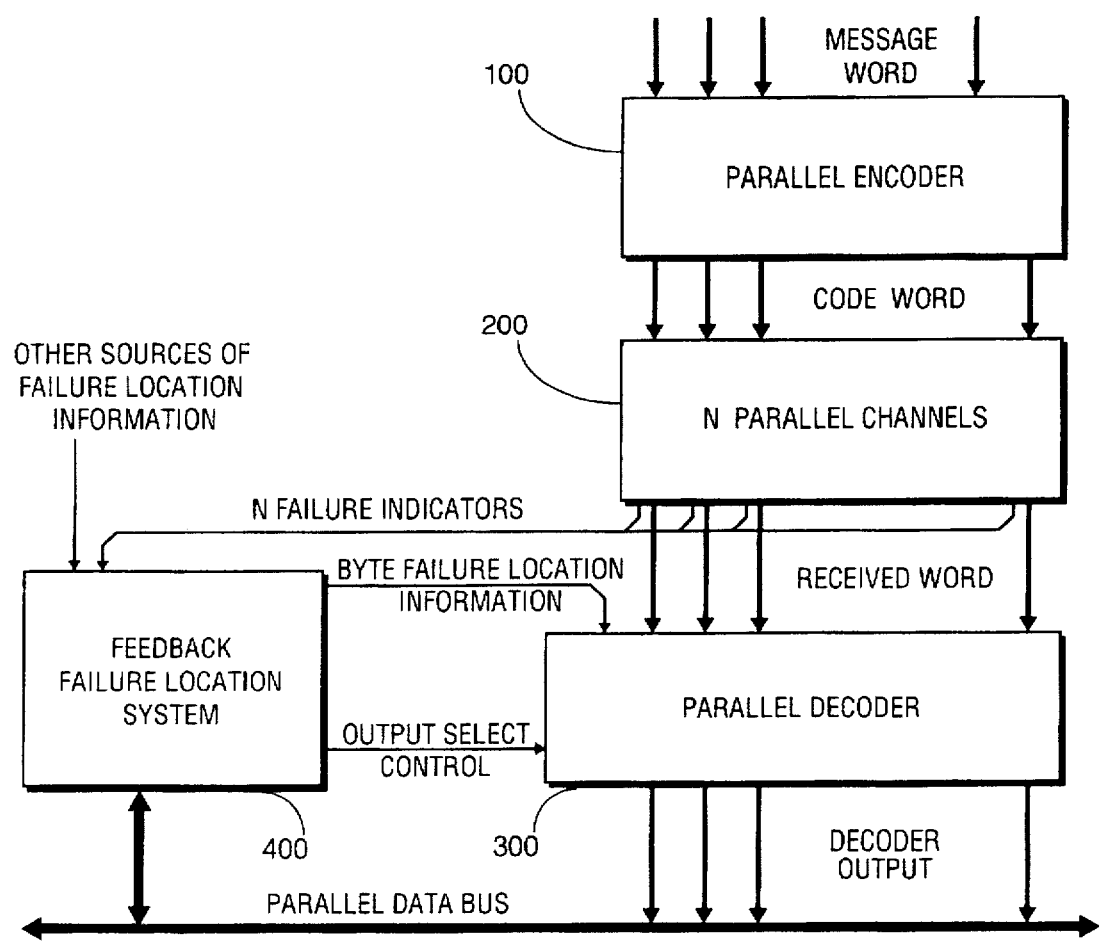
FIG. 1 shows the high-level logical structure of an error-correcting system constructed according to the present invention.

The logical structure of the preferred embodiment of the error-correcting system is described first. Next, the operation of the error-correcting system is described by choosing a particular configuration and running through an example showing how the encoding and decoding is done and how errors are corrected. The logical structure and operation are described by a series of block diagrams. The highest level block diagram shows the major functions, each function being represented as a single block. Subsequent block diagrams decompose each function into subfunctions. This is continued until the blocks/functions are well-known logical operations such as the AND, OR, NOT, and Exclusive OR (XOR) operations from Boolean Algebra used in designing digital logic circuits. All logical functions of the error-correcting system are parallelized and pipelined to maximize speed of operation, although not every function is noted as "parallelized and pipelined" in order to simplify the description.

Three line widths are used in the drawings. The narrowest lines represent single-bit data paths, the medium width lines represent byte-wide paths, and the widest lines represent polynomial-wide data paths. The actual number of physical wires for the byte-width paths and polynomial width paths depend on the number of bits per byte chosen and the maximum degree of the polynomial that is transferred over the polynomial path. For example, bytes are often 8 bits wide and a polynomial with a maximum degree of 5 would require a data path that is 6 bytes wide.

Registers can be added between stages of a pipeline of digital logic to increase performance by increasing the maximum possible clocking frequency of the system. To simplify the description, interstage registers are not shown. While the number and positioning of registers varies among systems, placement of registers is well known to those of skill in the art.

In the design of any logical circuit, it is necessary to add drivers to drive heavy loads. This is referred to as "fan-out". Fan-out is not shown but may need to be added in certain places in an actual implementation, as those of skill in the art are aware.

Systematic error-correcting systems are preferred to non-systematic ones, so figures and descriptions will be based on systematic error-correcting systems with additional comments on non-systematic implementations. In systematic error-correcting systems, the message word is retained in the code word unaltered. Non-systematic error-correcting systems encrypt the message word.

The high-level logical structure of the preferred embodiment of the error-correcting system is shown in FIG. 1. It comprises a parallel encoder 100, N parallel communications or storage channels 200, a parallel decoder 300, and a feedback failure location system 400. Each function operates on w-bit quantities, also referred to a s bytes, letters or finite field elements. Each of N channels 200 transmits a failure indicator to failure location system 400. There may also be other sources of failure location information as shown in FIG. 1. Failure location system 400 supplies byte failure location information to decoder 300 and controls the output of decoder 300 through decoder output select control lines. Conventionally, other system-level components would be connected to decoder 300 through a parallel data bus to interface with the error-correcting system.

Figure 2:
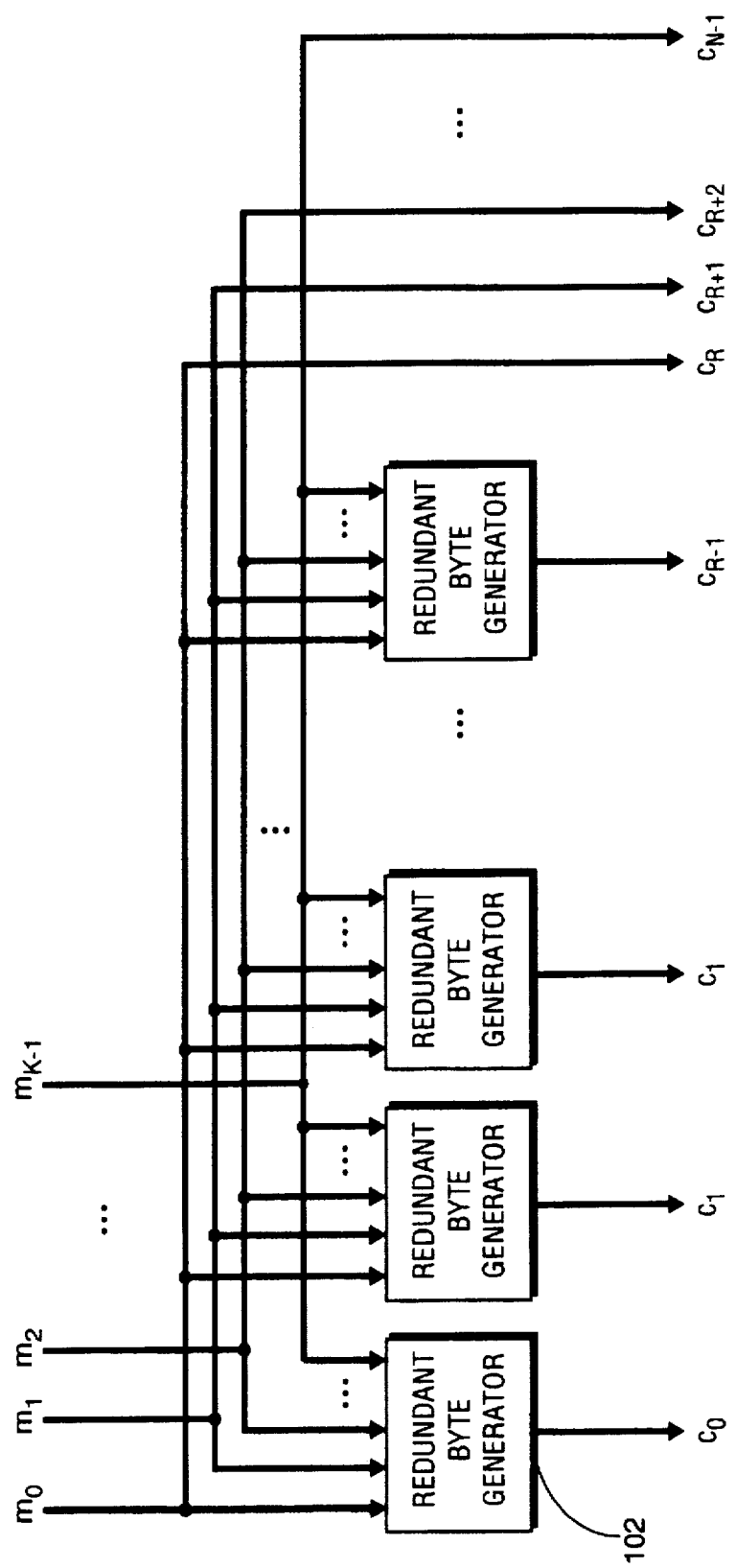
FIG. 2 is a block diagram of the parallel encoder.

The logical components of encoder 100 are shown in FIG. 2. K message word bytes, $m_i$, are applied as input and N code word bytes, $c_i$, are output. Encoder 100 contains R redundant byte generators 102. The R bytes are the redundant bytes added on to each set of message word bytes. The redundant bytes are shown in FIG. 2 as being added as a prefix, but they can be interspersed with the message word bytes or added as a suffix. The logical components of encoder 100 shown in FIG. 2 are for a systematic error-correcting system. For a non-systematic error-correcting systems, there are N rather than R generators 102 and the message word is encrypted. The mathematical basis for parallelized encoding is explained in Appendix A.

FIG. 2-A shows the components of one of generators 102. Each generator 102 contains K byte multipliers 104 that multiply a variable byte by a constant byte where each byte is an element in a finite field. The variable input is labeled "V" and the constant input is labeled "C". Each byte multiplier 104 receives one byte of the message as its "V" input and a constant byte denoted as $g_{x,i}$ as its "C" input. The constant bytes, $g_{x,i}$, are elements from the code's generator matrix, G. G is a matrix of constants. The constants are fixed, based on the values of K and R. While shown as inputs, the constant bytes preferably are built into their respective byte multipliers as circuitry that appropriately processes the respective message bytes. The outputs of the byte multipliers 104 are added by byte adder circuitry 106.

FIG. 2-B shows one of byte multipliers 104. Each of w input bits of the message byte is input to one of w product bit generators 108. One of product bit generators 108 is shown in FIG. 2-C. It consists of w bit multipliers 110 that multiply a variable bit by a constant bit and bit adder circuitry 112. Bit multipliers 110 are fabricated to provide a constant bit input $b_{x,i}$ of either 1 or 0. If $b_{x,i}=1$, bit multiplier 110 represents a connection between the "V" input and the output. If $b_{x,i}=0$, there is no connection between the "V" input and the output. Circuit connections within product bit generator 108 are determined by the constant multiplier or "input". The mathematical basis for byte multiplier 104 is described in Appendix B.

As seen in FIG. 2-D, byte adder tree 106 comprises multiple byte adders 114. Each byte adder 114 adds two of the variable bytes (or finite field elements) output by byte multipliers 104 shown in FIG. 2-A. FIG. 2-E shows bit adder circuitry 112 in greater detail. FIG. 2-F is a decomposition of one of byte adders 114. FIG. 2-G shows one of bit adders 116 from the circuitry in FIG. 2-E.

Figure 3:
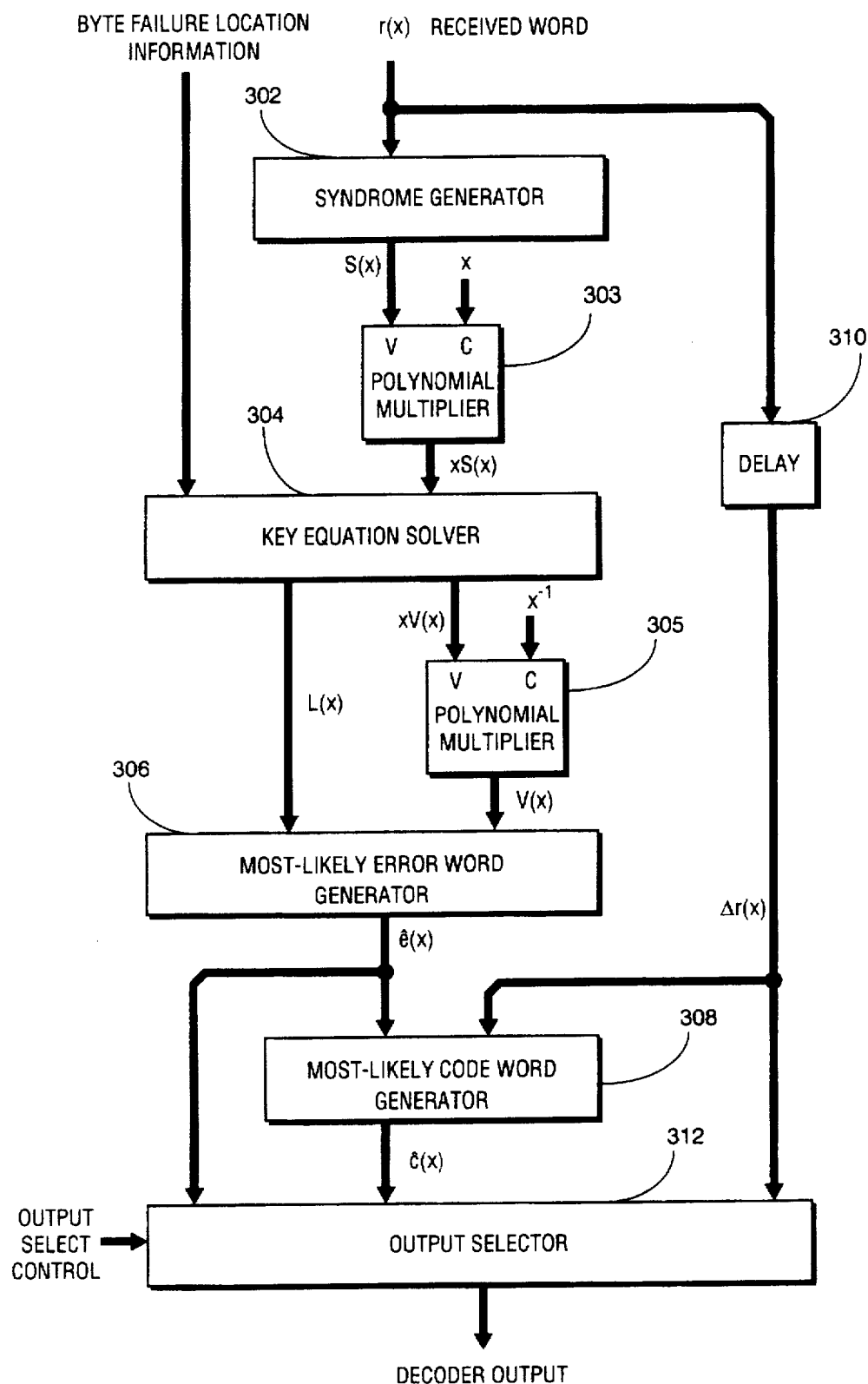
FIG. 3 is a block diagram of the parallel decoder.

Decoder 300 is shown in FIG. 3. Decoder 300 includes a syndrome generator 302, a key equation solver 304, a most-likely error word generator 306, a most-likely code word generator 308, a delay function 310 and an output selector 312 interconnected as shown in FIG. 3. Received word/polynomial r(x) is input from data channels 200 to syndrome generator 302. A syndrome word/polynomial S(x) is output of the syndrome generator. Syndrome word/polynomial S(x) is multiplied by constant "x" using polynomial multiplier 303 as shown in FIG. 3-A where a(x) is S(x). Key equation solver 304 inputs syndrome word/polynomial S(x) multiplied by "x" and byte failure location information and outputs error locator word/polynomial L(x) and error evaluator word/polynomial xV(x). Error evaluator word/polynomial xV(x) is multiplied by constant "$x^{-1}$" using polynomial multiplier 305 as shown in FIG. 3-B where a(x) is xV(x). L(x) and V(x) are input to most-likely error word generator 306 which generates the most-likely error word/polynomial, ê(x). Most-likely code word generator 308 determines the most-likely code word/polynomial, ĉ(x), given the most-likely error word/polynomial and a delayed version of the received word/polynomial, Δr(x). Output selector 312 is controlled by feedback failure location system 400 shown in FIG. 1. The selector is set to select either the most-likely error word, the most-likely code word or a delayed version of the received word to be output by decoder 300.

Polynomial multipliers 303 and 305 are implemented via "wiring". No actual logic gates are needed to perform these functions.

FIG. 4 shows the components of syndrome generator 302. It consists of R syndrome byte generators 314. Each byte generator 314 comprises N byte multipliers 104 and byte adder circuitry 106 as shown in FIG. 4-A. Byte multipliers 104 and byte adder circuitry 106 have previously been described in connection with encoder 100. Each byte multiplier 104 receives one byte of the received word as its "V" input and a constant byte denoted as $d_{x,i}$ as its "C" input. The $d_{x,i}$ are elements from the code's error detection matrix of constants, D. The mathematical basis for parallelized syndrome generation is described in Appendix C.

Figure 5:
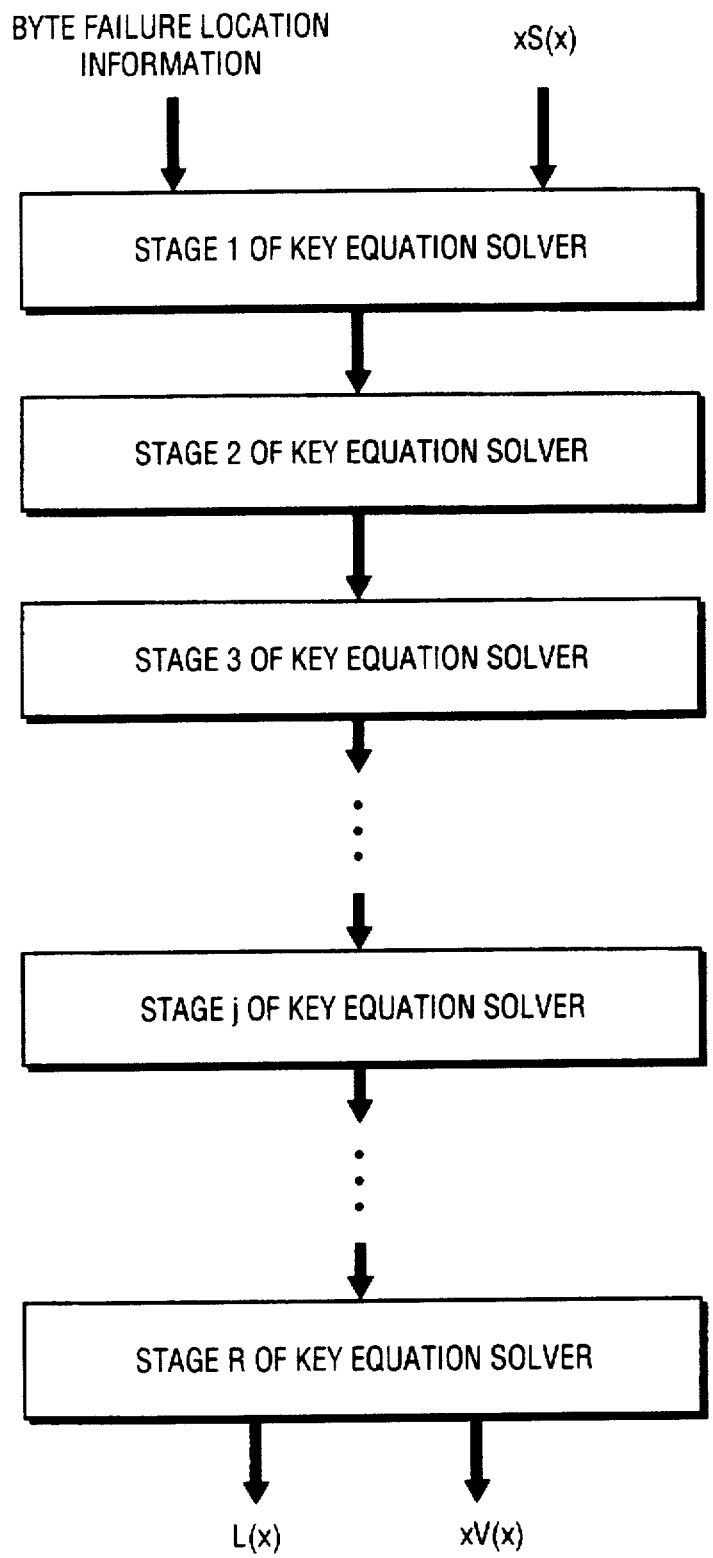
FIG. 5 illustrates a key equation solver composed of R stages of digital logic.

Key equation solver 304 is composed of a number of stages of digital logic. Each stage is one segment of a "pipe" as shown in FIG. 5. There are R stages, where R is the number of redundant bytes in a code word. Each stage performs the functions required by a single iteration of an iterative algorithm designed to solve the key equation S(x) L(x)=V(x) modulo $x^{R+1}$. Several iterative algorithms exist to solve this equation for L(x) and V(x), given S(x) and R. A variation of the Berlekamp-Massey algorithm as modified by Willard Eastman and described in Proceedings of the 1988 Tactical Communications Conference, Vol. 1 (1988), Eastman, "Euclideanization of the Berlekamp-Massey Algorithm", pp. 295–303 (incorporated herein by reference), is employed to solve the key equation and is the basis for the logic circuitry in key equation solver 304. See FIG. 5-A for the variation. The notation in FIG. 5-A is the same as used in the Eastman reference except that subscripts have been added and an auxiliary variable, $\lambda_j$, is used. The algorithm can correct for both errors and erasures (failure locations). The mathematical basis for key equation solver 304 is given in the Eastman reference. At the end of R stages of logic, error locator polynomial L(x) and error evaluator polynomial V(x) are output to most-likely error word generator 306. In Eastman's notation, $\Pi(x)$ is the error locator polynomial, $\Omega(x)$ is the error evaluator polynomial, and $\gamma$ is a constant finite field element. The outputs of the key equation solver are $\gamma\Pi(x)$ and $x\gamma\Omega(x)$. In the present invention, $L(x)=\gamma\Pi(x)$ and $V(x)=\gamma\Omega(x)$, so the outputs are L(x) and xV(x). See Appendix D for the mathematical basis for polynomial multiplication modulo $x^{R+1}$.

FIG. 5-B shows the high-level structure of each stage of key equation solver 304 consisting of control circuitry 315 and polynomial processing circuitry 316. FIG. 5-C shows detailed logic in each stage of key equation solver 304, showing that control circuitry 315 includes an integer adder 318, a test circuit 320 for determining if $d_j=0$ or $\lambda_j \leq 2l_{j-1}$, an integer subtracter 322 and an integer selector 332, and that polynomial processing circuitry 316 includes two polynomial multipliers 303 which multiply incoming polynomials $b^O(x)_{j-1}$ and $p^O(x)_{j-1}$ by a constant polynomial,"x" (see FIG. 3-A), a byte selector 324, two polynomial selectors 326, two polynomial multipliers 328 which multiply $\delta_{j-1}+W_jx$ by polynomials $b^T(x)_{j-1}$ and $p^T(x)_{j-1}$, respectively, two polynomial multipliers 330 which multiply $d_j$ by the polynomials $xb^O(x)_{j-1}$ and $xp^O(x)_{j-1}$, respectively, and two polynomial adders 334.

The data items involved in solving the key equation are $\mu$, $W_i(i=1, R), \lambda, l, \delta, d, b^O(x), b^T(x), p^O(x)$ and $p^T(x)$. Here, Eastman's notation is used. The $W_i$, $\delta$ and d data items are bytes, letters or finite field elements. Items $\mu, \lambda$, and l are integers. Items $b^O(x), b^T(x), p^O(x)$ and $p^T(x)$ are polynomials whose coefficients are bytes.

Adder 318, subtracter 322 and selector 332 of control circuitry 315 are understood from FIG. 5-C. Test circuit 320 consists of a circuit to determine if $d_j=0$ and a circuit to determine if $\lambda_j \leq 2l_{j-1}$. The circuit to determine if $d_j=0$ consists of a w-input OR logic gate with an inverted (NOT) output. The circuit to determine if $\lambda_j \leq 2l_{j-1}$ consists of an integer subtracter which subtracts $l_{j-1}$ shifted left one position (which is equivalent to multiplication by 2) from $\lambda_j$ and a circuit for determining if the result has a positive sign or is zero, indicating that $\lambda_j \leq 2l_{j-1}$. The results of the two determinations are OR'd together to determine if either condition is true.

FIG. 3-A shows one of polynomial multipliers 303.

FIG. 5-D is a decomposition of byte selector 324.

FIG. 5-E is a decomposition of polynomial selector 326.

FIG. 5-F is a decomposition of one of polynomial multipliers 328. The quantity "a" is either $b^T(x)_{j-1}$ or $p^T(x)_{j-1}$ depending on which of multipliers 328 is under consideration. Polynomial multiplier 328 contains byte multipliers 336 that multiply two variable bytes and byte adders 114 (see FIG. 2-F) receiving outputs of the multipliers except for the initial and final multipliers with $a_0$ and $a_n$, inputs, respectively. The required number of byte multipliers 336 depends upon the value of R and the level of the pipeline stage. See Appendix E for the mathematical basis for polynomial multiplier that multiplies by $\delta_{j-1}+W_jx$.

FIG. 5-G is a decomposition of one of polynomial multipliers 330 shown in FIG. 5-C. Each polynomial multiplier 330 consists of a plurality of byte multipliers 336. The quantity "b" is either $xb^O(x)_{j-1}$ or $xp^O(x)_{j-1}$, depending on which of polynomial multipliers 330 is under consideration. The required number of byte multipliers 336 depends upon the value of R and the level of the pipeline stage.

FIG. 5-H shows the preferred implementation of byte multipliers 336. See Appendix B for the mathematical basis for byte multiplier 336.

FIG. 5-I is a decomposition of w ANDs function 338 shown in FIG. 5-H.

FIG. 5-J is a decomposition of polynomial adder 334 shown in FIG. 5-C.

Figure 6:
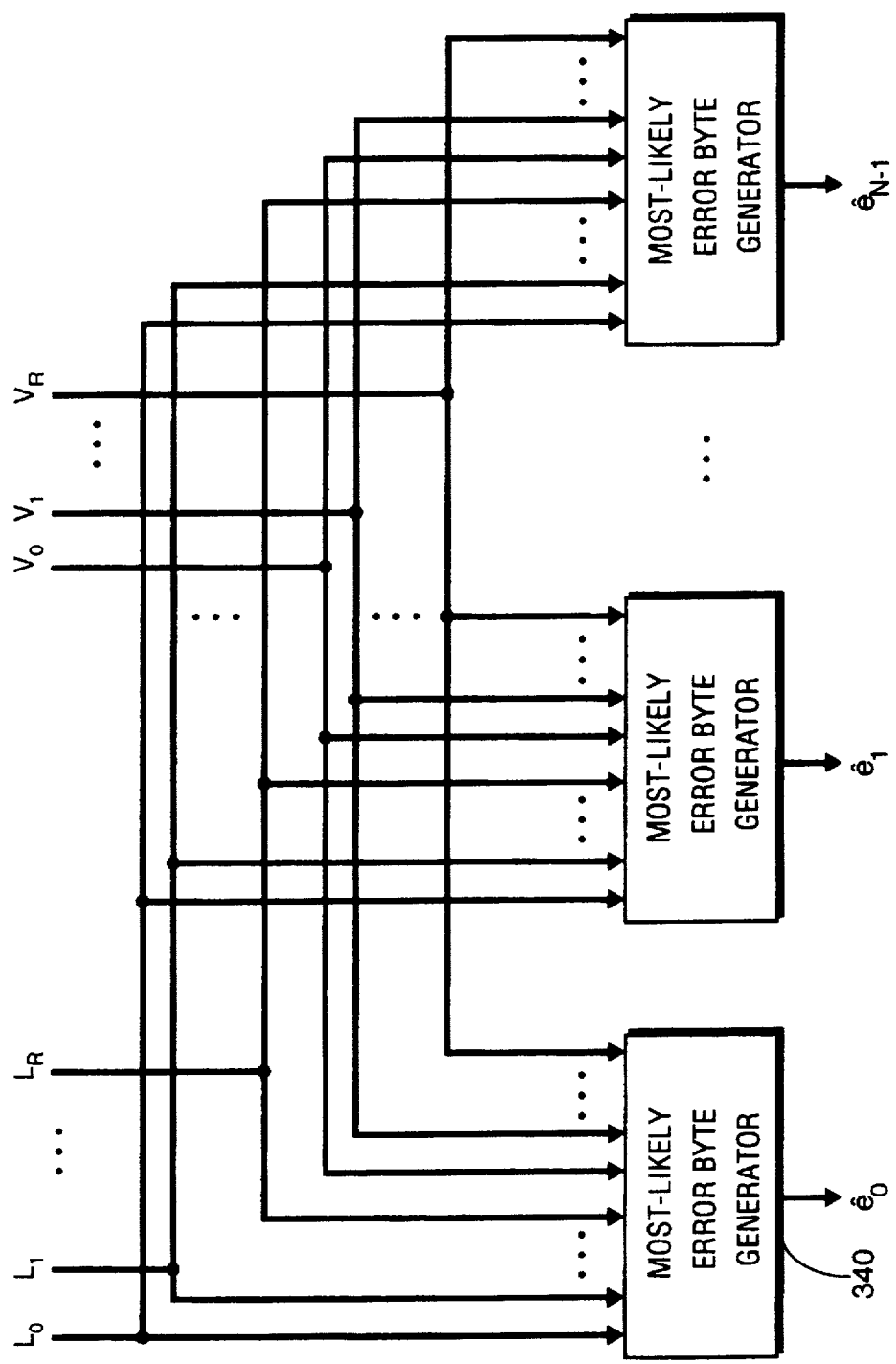
FIG. 6 is a block diagram of the most-likely error word generator.

A logical decomposition of most-likely error word generator 306 from FIG. 3 is presented in FIG. 6. The most-likely error word generator consists of N parallel most-likely error byte generators 340. Each generator 340 receives error locator word/polynomial L(x) and error evaluator polynomial V(x) as inputs, and outputs a byte i of the most-likely error word, denoted as $\hat{e}_i$.

FIG. 6-A is a logical decomposition of error byte generator 340 shown in FIG. 6. Logic level 1 consists of L'(x) selector 343 which selects coefficients of L(x) in order to form L'(x). The mathematical basis for forming L'(x) is described in Appendix F. Level 2 contains L(x) evaluator 342, L'(x) evaluator 344 and V(x) evaluator 346. L(x) evaluator 342 evaluates L(x) at $a^{-ij}$, L'(x) evaluator 344 evaluates L'(x) at $a^{-ij}$ and V(x) evaluator 346 evaluates V(x) at $a^{-ij}$. Level 3 contains a byte test for zero 348 which determines if $L(a^{-ij})=0$ and byte reciprocal generator 350, which generates the reciprocal of $L'(a^{-ij})$. Byte multiplier 336 in level 4 (see FIG. 5-H) multiplies $(L'(a^{-ij}))^{-1}$ by $V(a^{-ij})$ to produce $\hat{e}_i$ if $L(a^{-ij})=0$. Level 5 consists of w ANDS function 338 (see FIG. 5-I). The mathematical basis for determining the most-likely error word from L(x) and V(x) is presented in Encyclopedia of Mathematics and its Applications, Vol. 3, The Theory of Information and Coding (1977), McEliece, pp. 181–183.

FIG. 6-B shows the logical decomposition of L(x) evaluator 342. The form of this circuit is the same as encoder 100 and syndrome generator 302. Each component shown in FIG. 6-B has been previously described. The powers of a are constants.

FIG. 6-C shows how the coefficients of L'(x) are selected in selector 343 from the coefficients of L(x). FIG. 6-D and FIG. 6-E are logical decompositions of L'(x) evaluator 344 and V(x) evaluator 346.

For small values of w, e.g. w<8, the preferred implementation of byte reciprocal generator 350 shown in FIG. 6-A is a read only memory or "ROM". There are many other methods of generating reciprocals. For larger values of w, the preferred implementation of byte reciprocal generator 350 is a parallelized and pipelined version of Euclid's extended algorithm for finding the greatest common divisor of two polynomials.

FIG. 7 and FIG. 7-A show most-likely code word generator 308 in more detail. It is a polynomial adder 334 which consists of a set of N byte adders 114.

Figure 8:
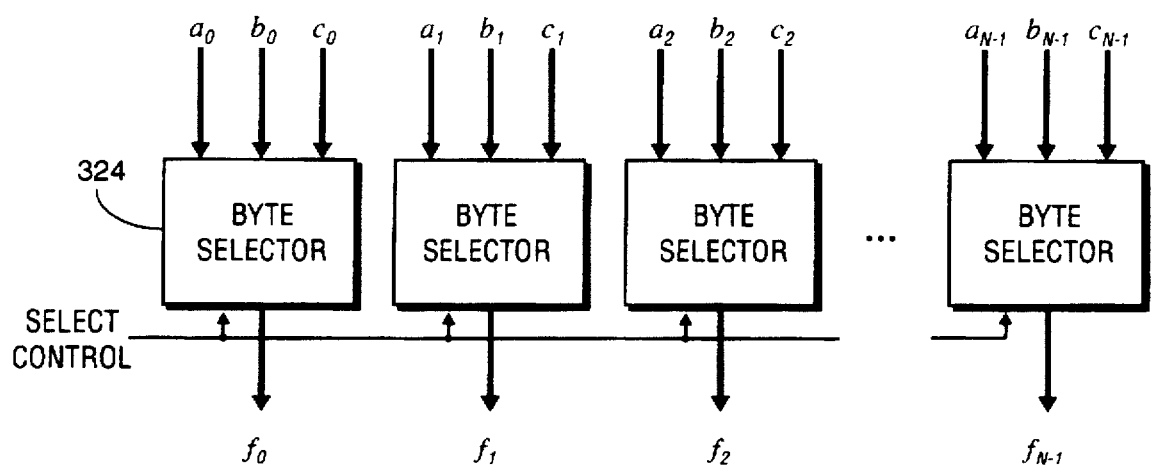
FIG. 8 is a block diagram of the output selector.

FIG. 8 shows output selector 312 from FIG. 3. It consists of multiple 3-input byte selectors 324.

The preferred implementation of delay function 310 (FIG. 3) is a set of shift registers. Actual implementation of delay function 310 depends upon the VLSI circuit technology being used.

Figure 9:
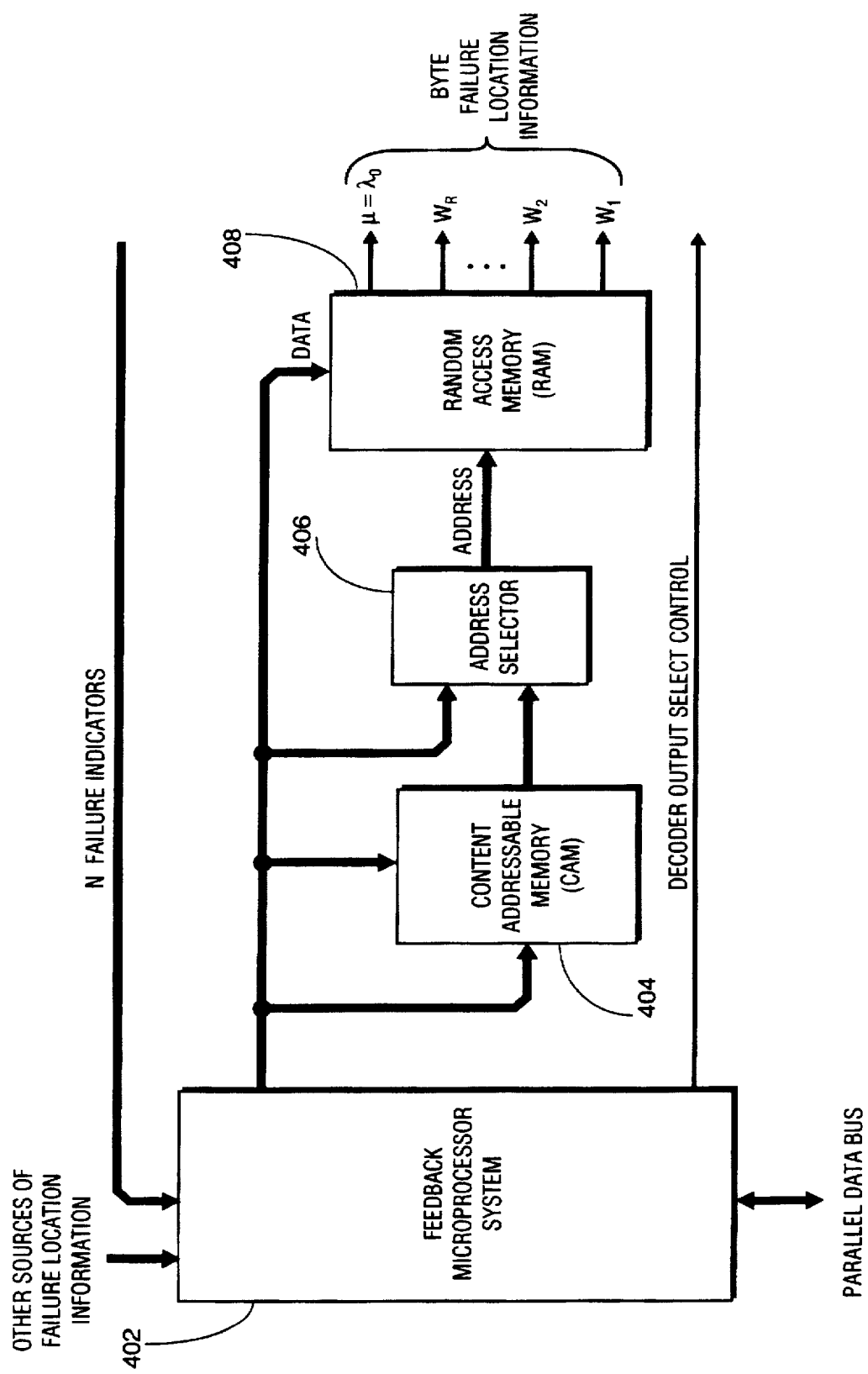
FIG. 9 is a block diagram of the feedback failure location system.

FIG. 9 is a logical decomposition of feedback failure location system 400 shown in FIG. 1. It consists of a feedback microprocessor system 402, a content-addressable memory (CAM) 404, an address selector 406 and a conventional random access memory (RAM) 408. The outputs of RAM 408 are $\mu$, $W_R$, $W_{R-1}$, $W_{R-2}$, ..., $W_1$, where $W_i$ are the locations of failures and $\mu$ is the number of failures in a received word. The value $\mu$ is an integer and the $W_i$ are bytes. CAM 404 and RAM 408 are controlled by feedback microprocessor system 402.

The content of RAM 408 is shown in FIG. 9-A. RAM 408 address 0 contains the location(s) of channel 200 failures. If there are additional failure areas, such as defects, RAM 408 address $i(i\neq 0)$ contains the location(s) of channel 200 failures plus the location(s) of additional failure areas. The content of RAM 408 is similar to a conventional defect map.

FIG. 9-B shows the logical structure of one embodiment of CAM 404 in FIG. 9. It consists of an address counter 410, multiple beginning address of failure registers 412, multiple comparators 414, an address encoder 416, an OR function 417, a failure length hold count down counter 420 and a RAM address register 418 as shown.

Figure 10:
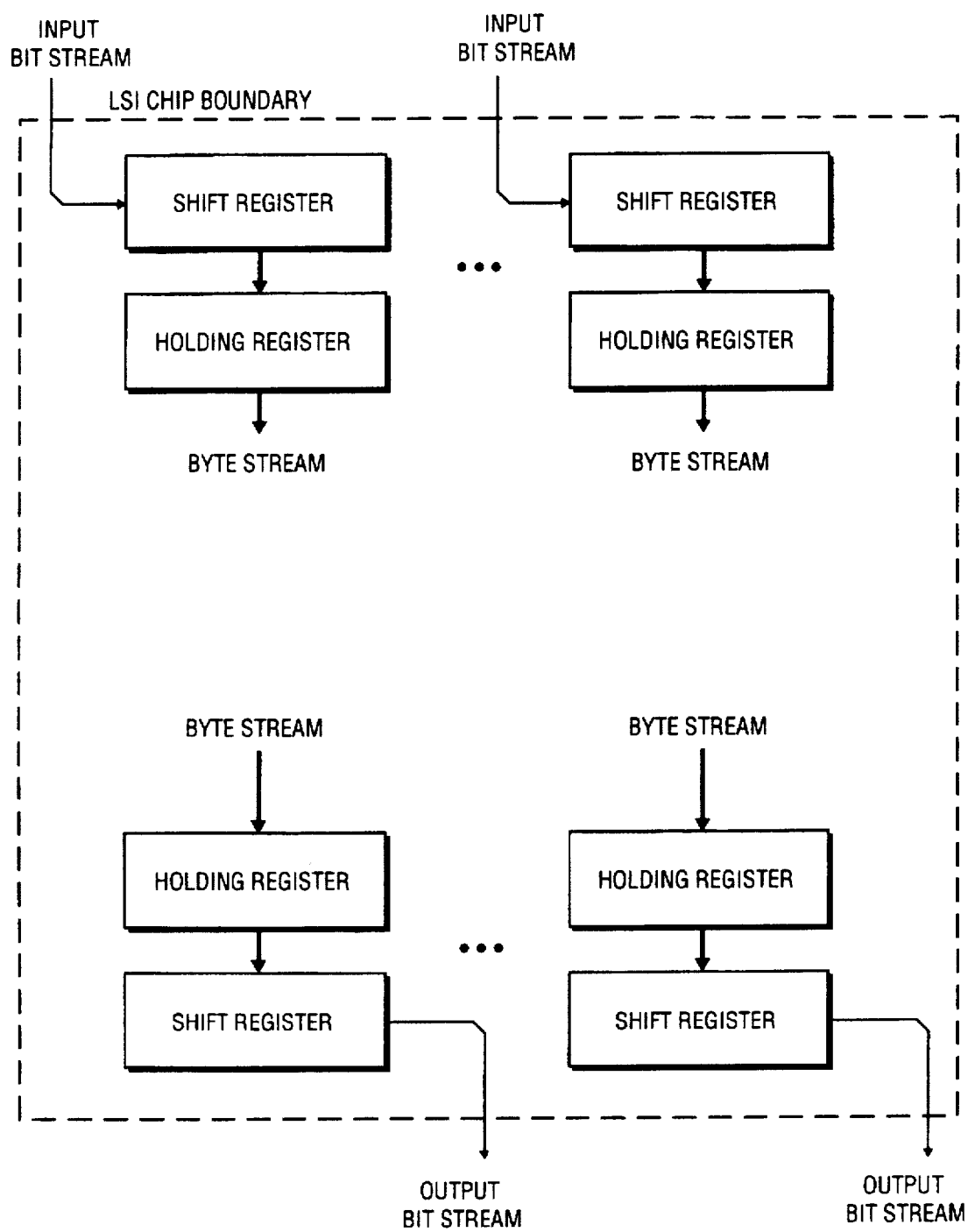
FIG. 10 shows an apparatus for reducing the number of pins required on a VLSI chip containing the error-correcting system.

One object of the error-correcting system is to design parallel encoders and decoders that can be implemented in a single VLSI chip. VLSI chip packaging normally limits the number of pins to several hundred. The number of pins required by encoder 100 and decoder 300 of FIG. 1 may exceed the number of pins available in some circumstances. This problem can be solved by a pin reduction technique shown in FIG. 10. With this technique, inputs that normally input w-bit quantities are reduced to inputs that input streams of single-bit quantities. This is accomplished with multiple w-bit shift registers and w-bit holding registers. A reverse technique can be applied to outputs as shown also in FIG. 10. This requires control circuitry not shown.

OPERATION OF THE PREFERRED EMBODIMENT

The operation of the preferred embodiment of the error-correcting system is explained with an example. The message word "claim" is used as input. Assume channel "g" has previously failed and an error occurs in channel "b" during transmission. The example will show how decoder 300 receives the failure location information and the received word and performs finite field operations on the bytes (or letters) of the received word to correct the errors. See FIG. 11 for an overall picture of the example.

The example uses K=5, R=3, and N=K+R=8. K is the number of bytes in a message, R is the number of redundant bytes, and N is the number of bytes in a code word. Normally these values are determined after deciding how much error correction power is needed in a particular error-correcting system. The value S is the maximum number of soft errors and the value H is the maximum number of hard errors that can occur and still be corrected by the error-correcting system. (A soft error is a byte in error about which the decoder has no information. A hard error is a byte that is probably in error and the decoder knows its position before decoding begins. A hard error byte is also known as a failure location or erasure.) If R bytes of redundancy are chosen, a Reed-Solomon error-correcting system can correct S soft errors and H hard errors so long as $2S+H \leq R$.

The example uses a finite field with 16 elements. Each element is represented by a 4-bit quantity (w=4) referred to as a byte or letter. In the example, the elements are denoted as 0, 1, a, b, c, d, e, f, g, h, i, j, k, l, m, and n. FIG. 12 shows the letter, binary and polynomial equivalents.

FIG. 12-A and FIG. 12-B show the addition, multiplication and reciprocal tables for the finite field. The finite field shown in FIG. 12-A and FIG. 12-B was generated by considering each element to be a binary polynomial and operating on polynomials modulo p(x), where p(x) is the irreducible binary polynomial of degree 4, equal to $x^4+x+1$ in this example case. Any other choice of an irreducible binary polynomial of degree 4 would have resulted in an equivalent finite field. The only difference would be in the naming of the elements. Each element in the finite field can be represented as a polynomial of degree 3 or less with binary coefficients. When an element of the finite field is represented as a polynomial, it is written with the highest powers of x on the left and the lowest powers of x on the right. The powers of x are in the reverse order as the representations of message, code word and received word polynomials to differentiate them from each other. This notation allows the same symbol, namely "x", to be used for the indeterminate in both types of polynomials. Polynomials which represent messages, code words and received words have nonbinary coefficients. Intermediate polynomials generated in the key equation solver also have nonbinary coefficients.

Each finite field has at least 1 primitive element. A primitive element is an element that, when multiplied by itself repeatedly, generates all the other nonzero elements in the field. Conventionally, a primitive element has been denoted as a. In the finite field shown in FIG. 12-A and FIG. 12-B, there are 8 primitive elements, namely a, b, d, g, h, k, m and n. Every finite field with 16 elements has 8 primitive elements.

The example uses a, $a^2$ and $a^3$ to be the roots of the Reed-Solomon generator polynomial, g(x), where a=a. In other words, $g(x)=(x-a)(x-a^2)(x-a^3)=(x-a)(x-b)(x-c)=f+mx+kx^2+x^3$.

The generator matrix, G, for the example case is $$G = \begin{bmatrix} f & m & k & 1 & 0 & 0 & 0 & 0 \\ b & e & e & 0 & 1 & 0 & 0 & 0 \\ k & f & b & 0 & 0 & 1 & 0 & 0 \\ h & l & 1 & 0 & 0 & 0 & 1 & 0 \\ f & c & 1 & 0 & 0 & 0 & 0 & 1 \end{bmatrix}.$$

FIG. 12-C shows how the position of each byte in a code word is identified. Eight non-zero elements of the finite field are used to identify each byte in a code word. The inverses of the positions are also shown. Each channel 200 is also identified by the same designators as the code word bytes as shown in FIG. 11.

Figure 13:
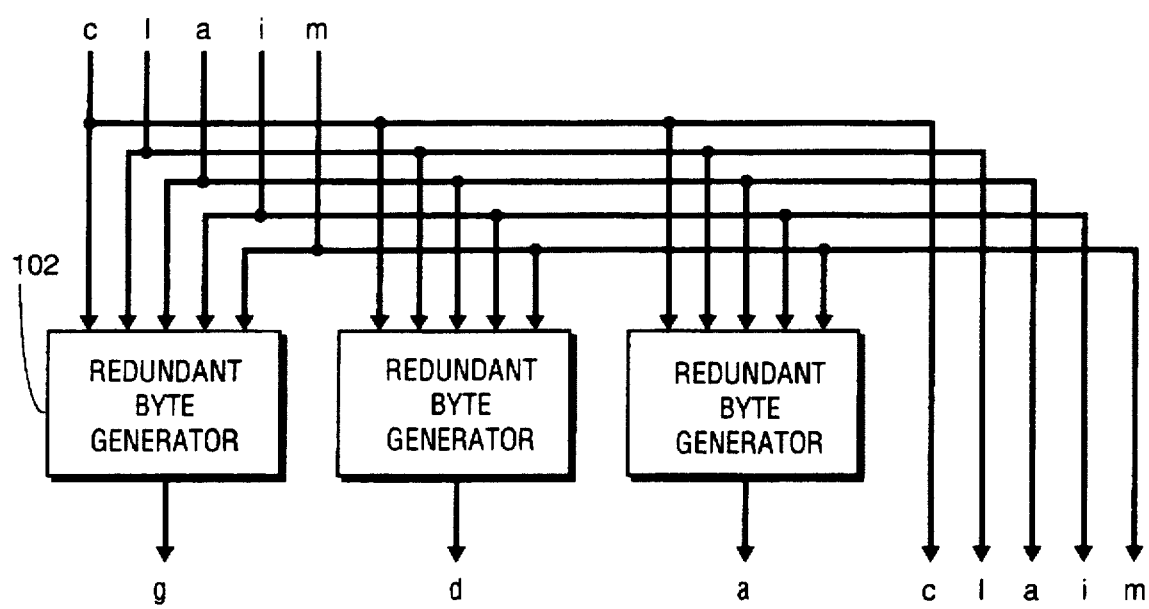
FIG. 13 shows the data flow and operation of the parallel encoder for the example case where the message word "claim" is encoded into the code word "gdaclaim".

Encoder 100 is shown in FIG. 13 with the example message "claim" as input and "gda" as the redundant portion of the code word as output. FIG. 13-A shows the data flow and operation of the first redundant byte generator 102. FIG. 13-B shows the data flow and operation of the first byte multiplier 104 which multiplies the variable "c" by the constant "f" as shown in FIG. 13-A. The constant "f" determines the actual connections within each product bit generator 108. Product bit generator 108 multiplies the incoming row of bits by one column of the B matrix as described Appendix B where, for this case, $$B = \begin{bmatrix} x^3f \\ x^2f \\ xf \\ f \end{bmatrix} = \begin{bmatrix} cf \\ bf \\ af \\ f \end{bmatrix} = \begin{bmatrix} 1 & 0 & 1 & 0 \\ 0 & 1 & 0 & 1 \\ 1 & 0 & 1 & 1 \\ 1 & 1 & 0 & 0 \end{bmatrix}.$$

FIG. 13-C through FIG. 13-F show the data flow and operation along with a simplification for each of the four product bit generators 108 shown in FIG. 13-B. FIG. 13-G shows the data flow and operation of the byte adder circuitry 106 shown in FIG. 13-A. Remaining redundant bytes are generated in a similar manner.

Figure 11:
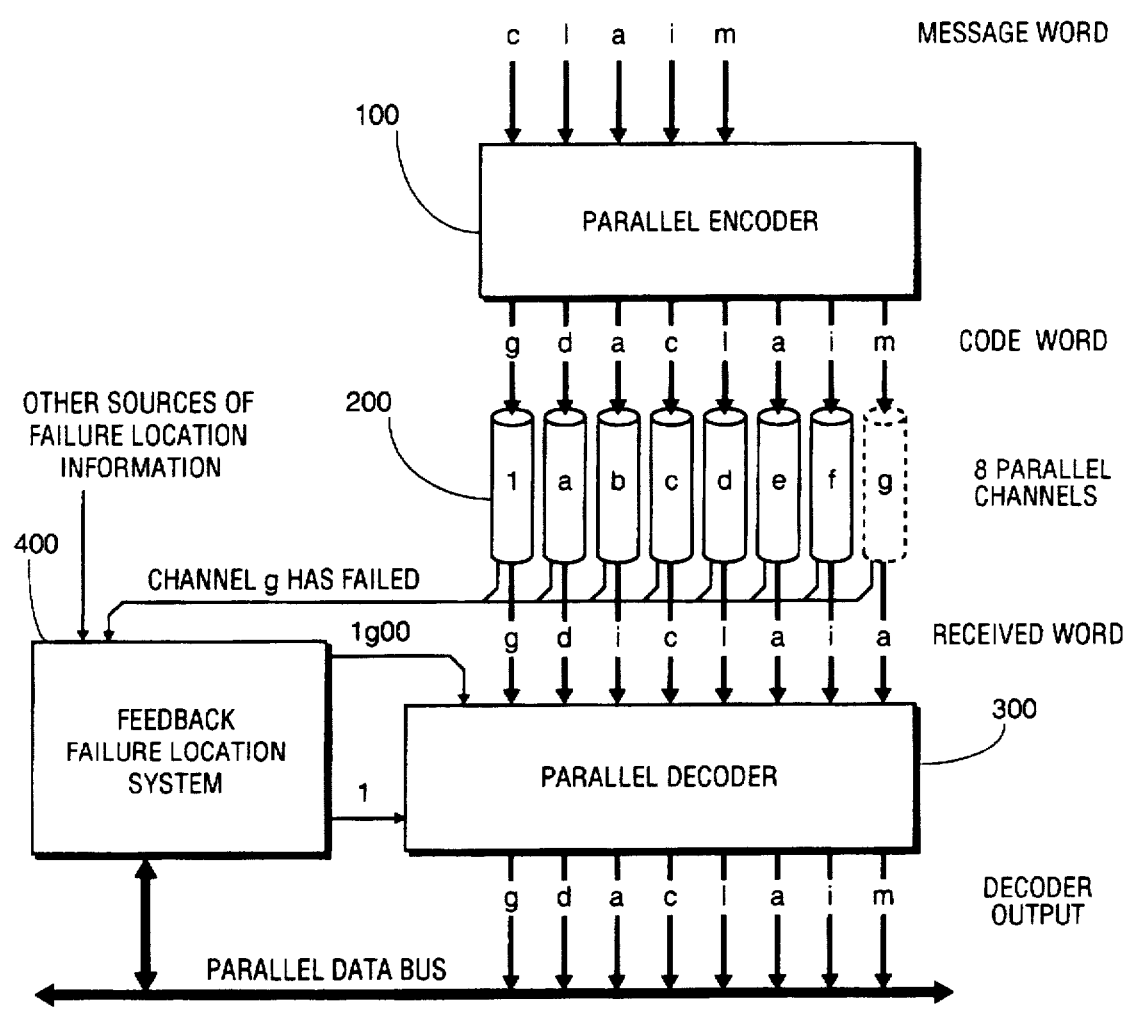
FIG. 11 illustrates the overall operation of the error-correcting system for the example case where the incoming message is "claim", channel "b" makes an error and channel "g" has previously failed.

The code word "gdaclaim" is transmitted through 8 parallel communications channels 200 (or stored in 8 parallel storage channels 200) as illustrated in FIG. 11. Channel "g" has previously failed and sent a failure indicator to feedback failure location system 400. Feedback failure location system 400 has previously written it's RAM 408 with data shown in FIG. 14. The byte "m" has been changed to "a" due to the failure. An error occurs during transmission or storage in channel "b", changing "a" to "i", which is unknown to decoder 300 and feedback failure location system 400.

Figure 15:
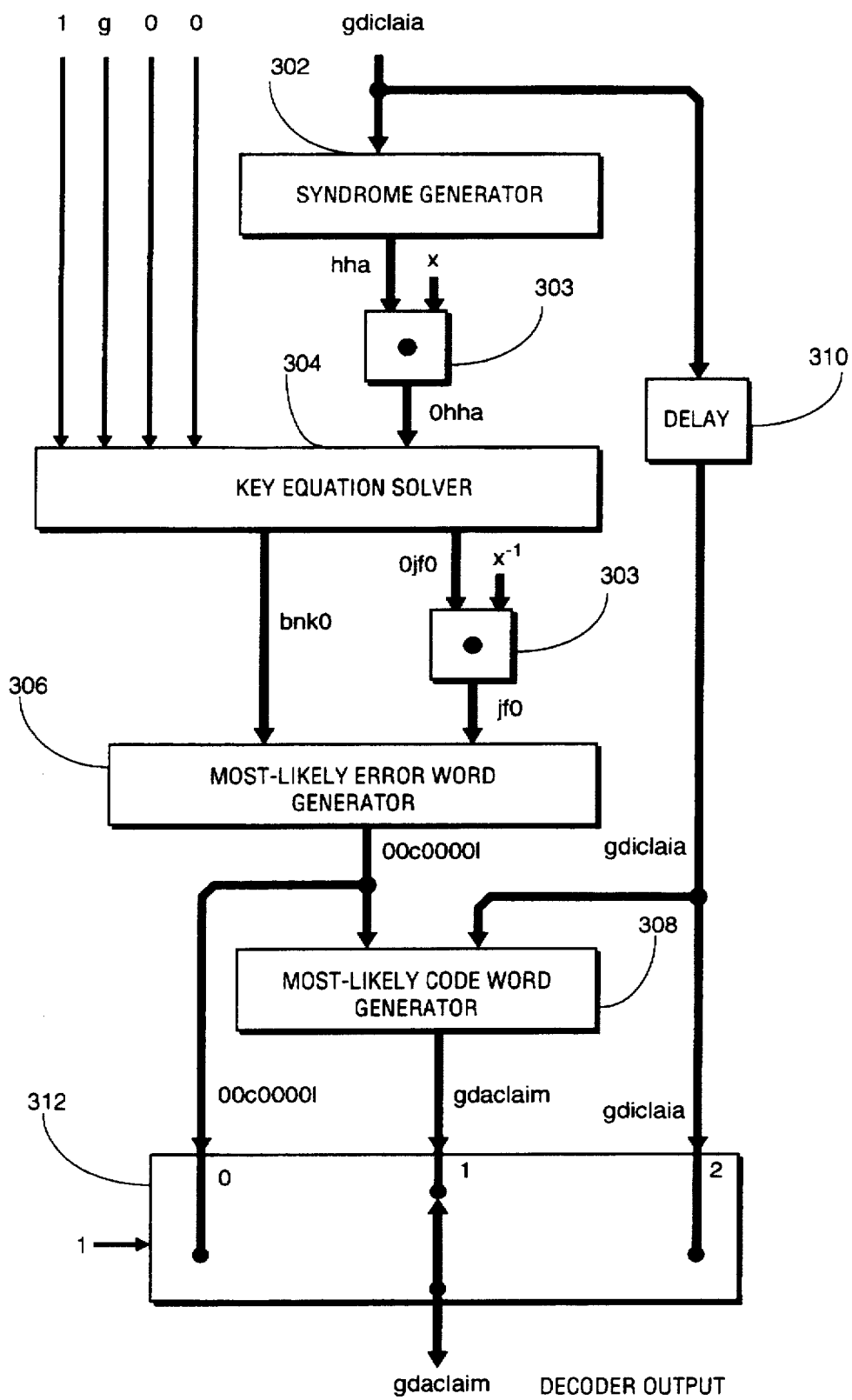
FIG. 15 shows the data flow and operation of the parallel decoder for the example case.

An overall picture of the operation of decoder 300 is given in FIG. 15. Decoder 300 receives the word "gdiclaia" as input to syndrome generator 302. Syndrome generator 302 produces syndrome word "hha" as seen in FIG. 16. FIG. 16-A and FIG. 16-B show the data flow and operation of the first syndrome byte generator 314 which outputs "h". Remaining syndrome bytes are generated in a similar manner based upon finite field operations. The error detection matrix, D, for the example case is $$D = \begin{bmatrix} 1 & 1 & 1 \\ a & b & c \\ b & d & f \\ c & f & i \\ d & h & l \\ e & j & 1 \\ f & l & c \\ g & n & f \end{bmatrix}.$$

Figure 17:
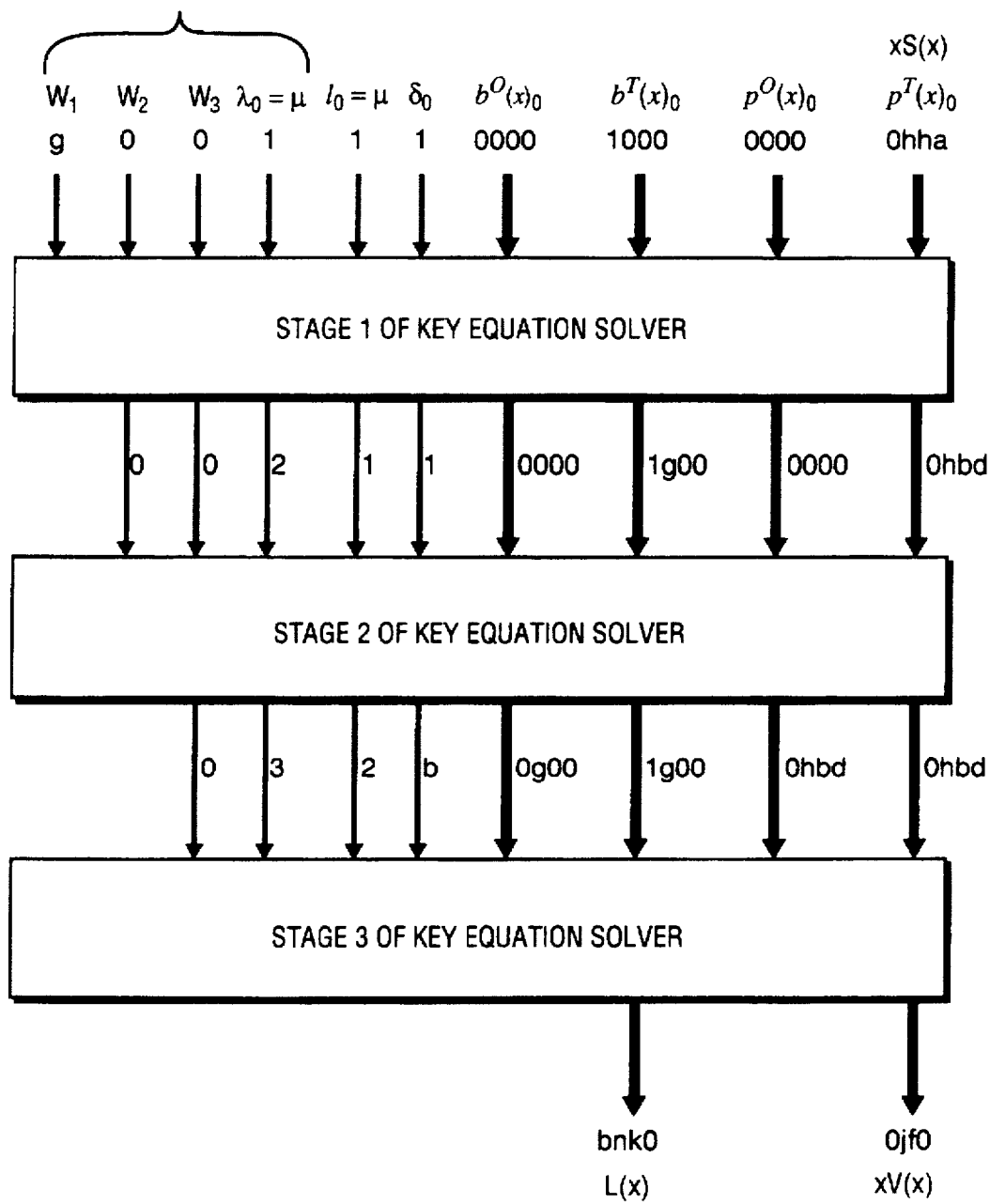
FIG. 17 shows the data flow and operation of the key equation solver for the example case.

Syndrome word "hha" is input to key equation solver 304 along with failure location information "1g00". FIG. 17 shows the inputs and outputs of each stage of key equation solver 304. There are R=3 stages. FIG. 17-A, FIG. 17-B and FIG. 17-C show the data flow and operation of the three key equation solver 304 stages.

It is important to note that key equation solver stages can be simplified as shown in FIG. 17-A through FIG. 17-C due to knowledge of the initial values, the maximum possible degrees of the intermediate polynomials and characteristics of the key equation solver algorithm chosen. More particularly:

1. the sequence of polynomials, $b^O(x)_j$ and $b^T(x)_j$ begin as degree 0 polynomials and can increase in degree only by 1 at each stage. Circuitry does not have to be provided for coefficients that do not exist;

2. since the initial values for $b^O(x)_j$ and $p^O(x)_j$=0 and the initial values for $b^T(x)_j$=1, the circuitry can be simplified;

3. the low-order coefficients of $p^O(x)_j$ and $p^T(x)_j$ are always 0. This further reduces the complexity of key equation solver 304;

4. the last stage of key equation solver 304 (in this case Stage 3) can be substantially simplified because only $b^T(x)_j$ and $p^T(x)_j$ are required outputs. Other intermediate polynomials and values need not be generated because this is the last stage;

5. all operations are modulo $x^{R+1}$, which means all polynomials are of degree R or less and no higher-order coefficients need be generated or retained.

Figure 18:
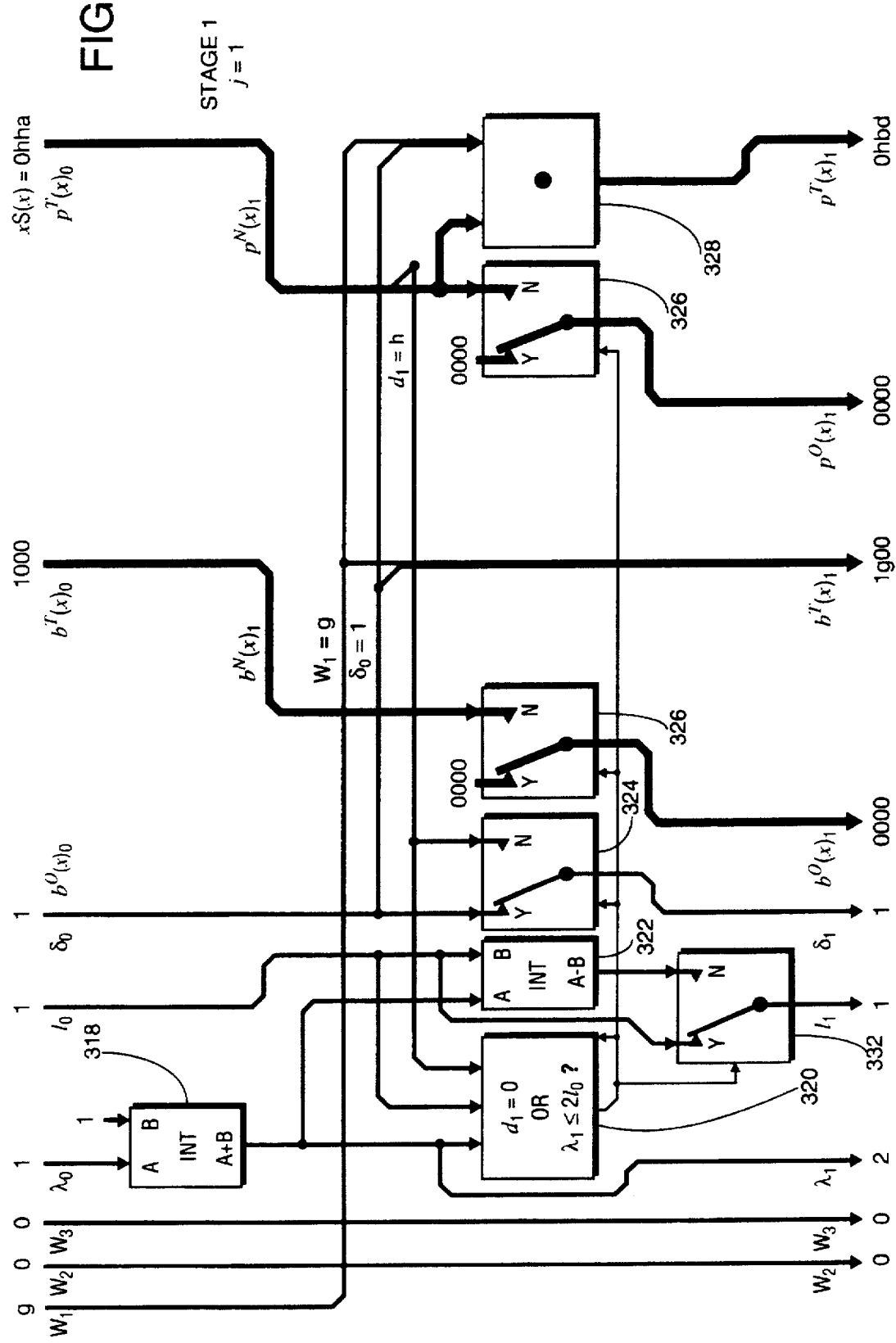
FIG. 18 shows stage 1 of the key equation solver for the example case after simplification.
Figure 19:
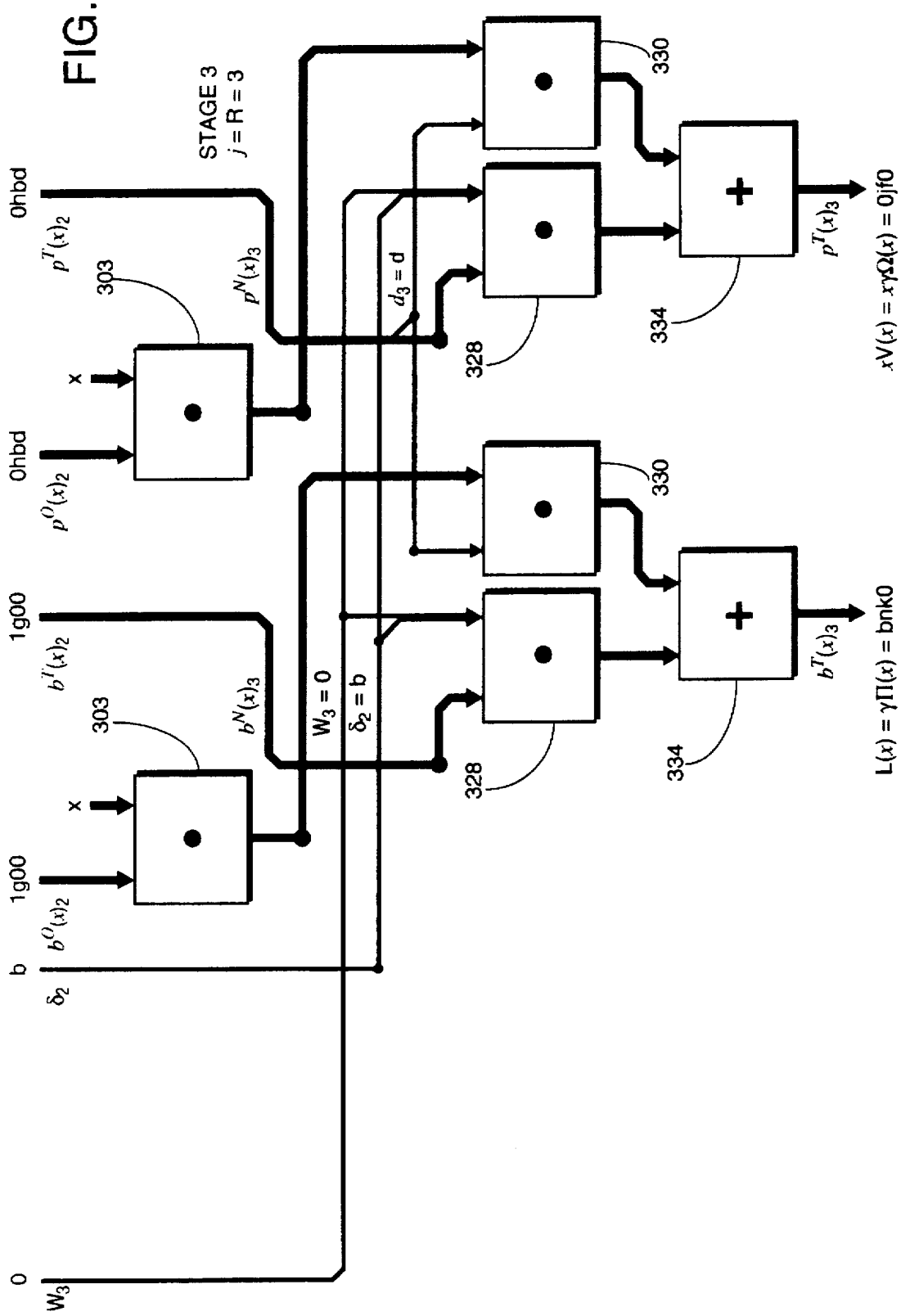
FIG. 19 shows stage 3 of the key equation solver for the example case after simplification.

FIG. 18 and FIG. 19 show simplified versions of stage 1 and stage 3 of key equation solver 304 as a result of the circuit reductions previously mentioned. FIG. 18-A shows the generation of $p^T(x)_1$ for the simplified version of stage 1 of key equation solver 304. FIG. 18-B shows the data flow and operation of the first byte multiplier 336 for the generation of $p^T(x)_1$. Remaining byte multipliers 336 operate in a similar fashion. The data flow and operation of stage 2 of key equation solver 304 is not shown and is self-explanatory. FIG. 19-A through FIG. 19-C show the generation of $b^T(x)_3$ and FIG. 19-D through FIG. 19-F show the generation of $p^T(x)_3$ for the simplified version of stage 3 of key equation solver 304.

Outputs from key equation solver 304 are the error locator word/polynomial and the error evaluator word/polynomial. These are input to most-likely error word generator 306.

Figure 20:
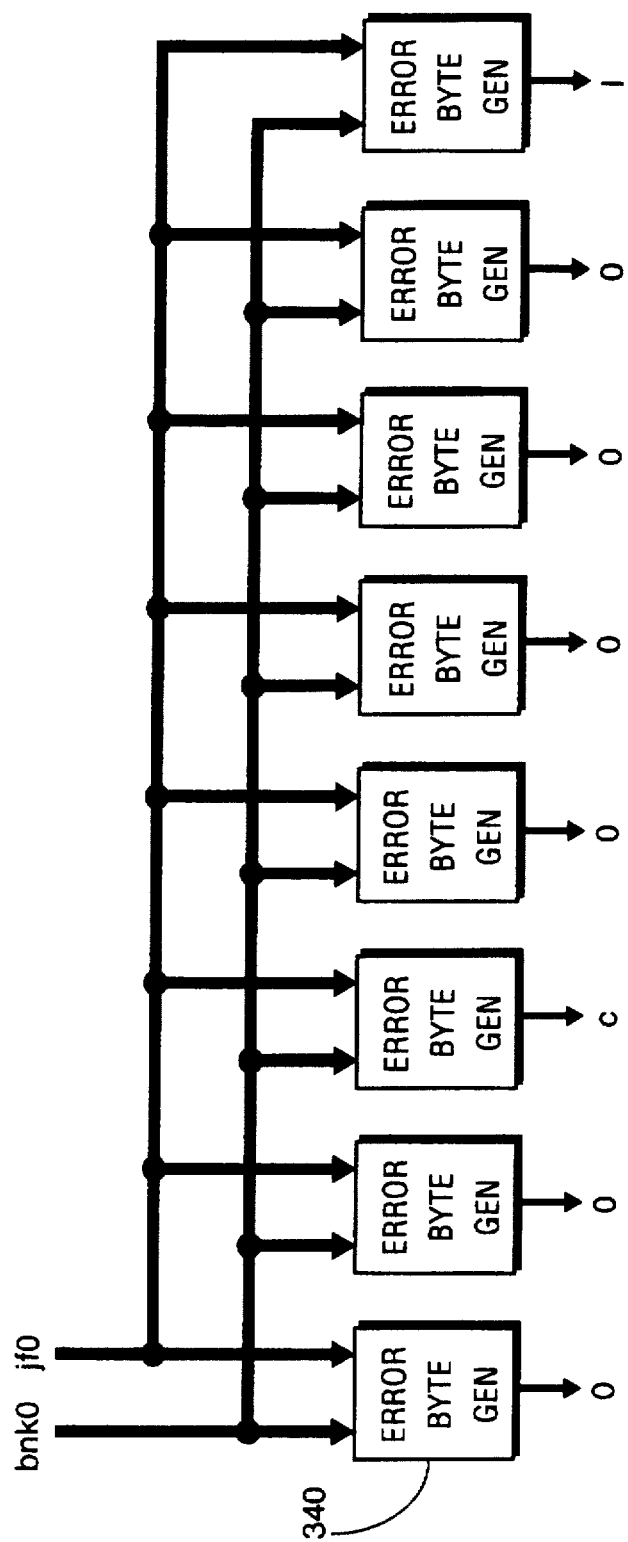
FIG. 20 shows the data flow and operation of the most-likely error word generator for the example case.

FIG. 20 shows data flow and operation of most-likely error word generator 306. The data flow and operation of the first most-likely error byte generator 340 is shown in FIG. 20-A through FIG. 20-E.

FIG. 20-B shows the data flow and operation of L(x) evaluator 342 for x=1. FIG. 20-C shows the data flow through L'(x) selector 343. FIG. 20-D shows the data flow and operation of L'(x) evaluator 344 for x=1. FIG. 20-E shows the data flow and operation of V(x) evaluator 346 for x=1. Remaining most-likely error bytes are generated in a similar manner.

Figure 21:
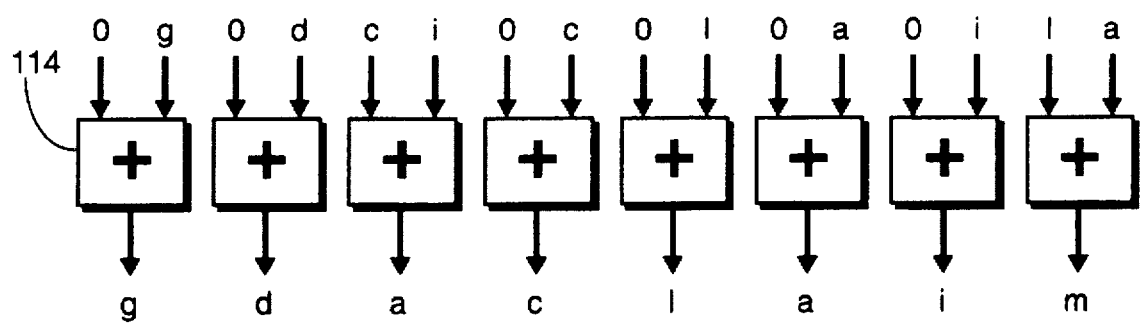
FIG. 21 shows the data flow and operation of the most-likely code word generator for the example case.

The output from most-likely error word generator 306 is the most-likely error word, which is input to most-likely code word generator 308 along with a delayed version of the received word. This is shown in FIG. 21.

Refer back to FIG. 9 for an overall picture of feedback failure location system 400. Feedback microprocessor system 402 is responsible for keeping content-addressable memory (CAM) 404 and random access memory (RAM) 408 updated with failure location information. The operation of feedback failure location system 400 depends upon whether the channels 200 are communications channels or storage channels. If the channels 200 are storage channels, such as DRAM memory chips, there will usually be more failure location information to deal with than if the channels 200 are communications channels, such as coaxial cables.

When the channels 200 are storage channels, feedback microprocessor system 402 sequentially reads every location in storage in background mode when the storage is not being used. If the storage is used 100% of the time, it interrupts use to do its reads. If the storage channels 200 are made up of Dynamic Random Access Memory (DRAM) chips, this background reading process can also provide the necessary memory refresh, eliminating the need for a separate refresh mechanism. During this time, feedback microprocessor system 402 makes a determination as to which areas in storage are failing based on the frequency of errors. If a particular area in storage makes errors at a rate of 80% of the time it is read (or another predetermined threshold), then feedback microprocessor system 402 determines that area to have failed. The actual algorithm used by feedback microprocessor system 402 is application-dependent. Once a location is determined to have failed, feedback microprocessor system 402 will update CAM 404 and RAM 408 shown in FIG. 9 with the appropriate values so that when that location is addressed in the future, failure location information will be supplied to the decoder.

When the channels 200 are communications channels, feedback failure location system 400 can normally be simplified because failures are usually entire channel failures, although it is possible that some failures may always occur at a certain time into the transmission. Then, the address counter becomes more of a "location in time" counter rather than a "location in space" counter.

Feedback microprocessor system 402 monitors communications or storage channel 200 failure indicators received from the channels 200 themselves. It also monitors failure indicators from other sources, for example, a user, which indicate a channel or channels have failed. When these failure indications occur, feedback microprocessor system 402 updates CAM 404 and RAM 408 with new failure location information. Feedback microprocessor system 402 is the intelligent entity that can decide the best course to follow when multiple channel 200 failure indicators occur simultaneously.

In the example case, feedback microprocessor system 402 has previously been informed that channel "g" has failed. As a result, feedback microprocessor system 402 has written RAM 408 as shown in FIG. 14. Since an entire channel has failed, only RAM 408 address 0 contains any meaningful information. The content of all addresses of RAM 408 other than 0 contain "don't care" data indicated by X's in FIG. 14.

The following appendices are referenced at points throughout the preceding text.

APPENDIX A

Mathematical Basis for Parallelized Encoding

For a systematic Reed-Solomon code, code words, c, can be calculated by multiplying message words, m, by a Reed-Solomon generator matrix, G, as shown below:

$$\vec{c} = mG$$

where $$G = \begin{bmatrix} x^R \bmod g(x) \\ x^{R+1} \bmod g(x) \\ x^{R+2} \bmod g(x) \\ \cdots \\ \cdots \\ \cdots \\ x^{R+K-1} \bmod g(x) \end{bmatrix} \begin{bmatrix} 1 & 0 & 0 & 0 & 0 & 0 \\ 0 & 1 & 0 & 0 & 0 & 0 \\ 0 & 0 & 1 & 0 & 0 & 0 \\ & & \cdots & & & \\ & & \cdots & & & \\ & & \cdots & & & \\ 0 & 0 & 0 & 0 & 0 & 1 \end{bmatrix} = \begin{bmatrix} g_{0,0} & g_{0,1} & g_{0,2} & \cdots & g_{0,N-1} \\ g_{1,0} & g_{1,1} & g_{1,2} & \cdots & g_{1,N-1} \\ g_{2,0} & g_{2,1} & g_{2,2} & \cdots & g_{2,N-1} \\ & & \cdots & & \\ & & \cdots & & \\ & & \cdots & & \\ g_{K-1,0} & g_{K-1,1} & g_{K-1,2} & \cdots & g_{K-1,N-1} \end{bmatrix}$$

The content of RAM 408 address 0 contains the location (s) of failed channel(s) 200. The content of other RAM 408 addresses contain the location(s) of failed channel(s) 200 plus the locations of failure areas such as defects. Failure location information received by decoder 300 comes from the content of RAM 408 address 0 unless the address of data being received by decoder 300 matches an address contained in one of the beginning address of failure registers 412. In that case, failure location information received by decoder 300 comes from the content of RAM 408 address as determined by address encoder 416.

CAM 404 shown in FIG. 9-B can be implemented in various ways depending upon the length of failures. In FIG. 9-B, all the failures are assumed to be of a fixed length. "Length" means the number of consecutive locations that are affected by the failure. When all the failures are of fixed length, only the beginning address of the failure needs to be stored. When a location with a failure is accessed, one of the beginning address of failure registers 412 will contain an address that will match the address counter. When that occurs, comparator 414 will assert that A=B and address encoder 416 will output the comparator number to RAM address register 418. RAM address register 418 will hold that address until failure length hold count down counter 420 reaches a "0" count.

CAM 404 shown in FIG. 9-B can be implemented in other ways. For example, there could be two registers for each failure, one for the beginning address of each failure and one for the ending address of each failure. In that way, no assumption is made as to the length of the defect. The exact design of CAM 404 is application-dependent. It can also be implemented with failure locations of several different fixed lengths.

The preferred implementation of encoder 100 shown in FIG. 2-A uses G as shown above. g(x) is the generator polynomial.

For a non-systematic Reed-Solomon code, code words, c, can be calculated by multiplying message words, m by an alternative Reed-Solomon generator matrix, $G_A$, as shown below:

$$\vec{c} = m G_A$$

$$\text{where } G_A = \begin{bmatrix} g_0 & g_1 & g_2 & \cdots & g_R & 0 & 0 & \cdots & 0 & 0 \\ 0 & g_0 & g_1 & \cdots & g_{R-1} & g_R & 0 & \cdots & 0 & 0 \\ 0 & 0 & g_0 & g_1 & \cdots & g_{R-1} & g_R & \cdots & 0 & 0 \\ & & & \cdots & & & & \cdots & & \\ & & & \cdots & & & & \cdots & & \\ & & & \cdots & & & & \cdots & & \\ 0 & 0 & 0 & \cdots & 0 & g_0 & g_1 & \cdots & g_{R-1} & g_R \end{bmatrix},$$

where $g_i$ are the coefficients of the code's generator polynomial.

APPENDIX B

Mathematical Basis for Byte Multipliers

Let p(x) be an irreducible binary polynomial of degree w that generates a finite field with $2^w$ elements and let each element be represented as a binary polynomial of degree $\leq w-1$.

Assume one input of the byte multiplier is $$a(x) = a_{w-1}x^{w-1} + a_{w-2}x^{w-2} + a_{w-3}x^{w-3} + \ldots + a_0$$

and the other input is $$b(x) = b_{w-1}x^{w-1} + b_{w-2}x^{w-2} + b_{w-3}x^{w-3} + \ldots + b_0.$$

Then, $$\begin{aligned}
a(x) \cdot b(x) \bmod p(x) &= (a_{w-1}x^{w-1} + a_{w-2}x^{w-2} + a_{w-3}x^{w-3} + \ldots + a_0)b(x)\bmod p(x) \\
&= a_{w-1}x^{w-1}b(x)\bmod p(x) \\
&+ a_{w-2}x^{w-2}b(x)\bmod p(x) \\
&+ a_{w-3}x^{w-3}b(x)\bmod p(x) \\
&\quad \ldots \\
&+ a_0 b(x)\bmod p(x).
\end{aligned}$$

In matrix notation, $$a(x) \cdot b(x)\bmod p(x) = (a_{w-1}\, a_{w-2}\, a_{w-3}\, \ldots\, a_0) \begin{bmatrix} x^{w-1}b(x)\bmod p(x) \\ x^{w-2}b(x)\bmod p(x) \\ x^{w-3}b(x)\bmod p(x) \\ \ldots \\ \ldots \\ \ldots \\ b(x)\bmod p(x) \end{bmatrix}$$

$$= (a_{w-1}\, a_{w-2}\, a_{w-3}\, \ldots\, a_0) \begin{bmatrix} b_{0,0} & b_{0,1} & b_{0,2} & \ldots & b_{0,w-1} \\ b_{1,0} & b_{1,1} & b_{1,2} & \ldots & b_{1,w-1} \\ b_{2,0} & b_{2,1} & b_{2,2} & \ldots & b_{2,w-1} \\ & & \ldots & & \\ & & \ldots & & \\ & & \ldots & & \\ b_{w-1,0} & b_{w-1,1} & b_{w-1,2} & \ldots & b_{w-1,w-1} \end{bmatrix}$$

$$= \vec{a} \cdot B.$$

If b(x) is a constant, B is a w×w matrix of constants (bits) and a B can be implemented by the circuits shown in FIG. 2-B and FIG. 2-C.

If b(x) is a variable, then a·B can be implemented by the circuit shown in FIG. 5-H.

APPENDIX C

Mathematical Basis for Parallelized Syndrome Generation

Conventionally, for Reed-Solomon codes, the syndrome word, S, is generated by multiplying the received word, r, by an error detection matrix, D, which evaluates r(x) at $a^{i+j}, j=0, 1 \ldots R-1$ as shown below: (i is a constant in the range of $0-2^w-1$).

$$\vec{S} = \vec{r}D \text{ where}$$

$$D = \begin{bmatrix} 1 & 1 & 1 & \ldots & 1 \\ \alpha^i & \alpha^{i+1} & \alpha^{i+2} & \ldots & \alpha^{i+R-1} \\ (\alpha^i)^2 & (\alpha^{i+1})^2 & (\alpha^{i+2})^2 & \ldots & (\alpha^{i+R-1})^2 \\ (\alpha^i)^3 & (\alpha^{i+1})^3 & (\alpha^{i+2})^3 & \ldots & (\alpha^{i+R-1})^3 \\ & & \ldots & & \\ & & \ldots & & \\ & & \ldots & & \\ (\alpha^i)^{N-1} & (\alpha^{i+1})^{N-1} & (\alpha^{i+2})^{N-1} & \ldots & (\alpha^{i+R-1})^{N-1} \end{bmatrix}$$

$$
= \begin{bmatrix} d_{0,0} & d_{0,1} & d_{0,2} & \ldots & d_{0,R-1} \\ d_{1,0} & d_{1,1} & d_{1,2} & \ldots & d_{1,R-1} \\ d_{2,0} & d_{2,1} & d_{2,2} & \ldots & d_{2,R-1} \\ & & \ldots & & \\ & & \ldots & & \\ & & \ldots & & \\ d_{N-1,0} & d_{N-1,1} & d_{N-1,2} & \ldots & d_{N-1,R-1} \end{bmatrix}.
$$

The preferred implementation of syndrome generator 302 shown in FIG. 4-A uses the error detection matrix as shown above.

Note that the error detection matrix, D, is the transpose of the conventional parity check matrix, H, or, $D=H^T$.

Alternatively, the syndrome word, S, can be generated by multiplying the received word, r, by an alternative error detection matrix followed with the multiplication by a g(x) roots matrix, $D_R$, as shown below:

$$\vec{S} = \vec{r} D_A D_R$$

where $$
D_A = \begin{bmatrix} 1 \bmod g(x) \\ x \bmod g(x) \\ x^2 \bmod g(x) \\ \ldots \\ \ldots \\ \ldots \\ x^{R-1} \bmod g(x) \\ \hline x^R \bmod g(x) \\ x^{R+1} \bmod g(x) \\ x^{R+2} \bmod g(x) \\ \ldots \\ \ldots \\ \ldots \\ x^{R+K-1} \bmod g(x) \end{bmatrix} \text{ and}
$$

$$
D_R = \begin{bmatrix} 1 & 1 & 1 & \ldots & 1 \\ \alpha^i & \alpha^{i+1} & \alpha^{i+2} & \ldots & \alpha^{i+R-1} \\ (\alpha^i)^2 & (\alpha^{i+1})^2 & (\alpha^{i+2})^2 & \ldots & (\alpha^{i+R-1})^2 \\ (\alpha^i)^3 & (\alpha^{i+1})^3 & (\alpha^{i+2})^3 & \ldots & (\alpha^{i+R-1})^3 \\ & & \ldots & & \\ & & \ldots & & \\ & & \ldots & & \\ (\alpha^i)^{R-1} & (\alpha^{i+1})^{R-1} & (\alpha^{i+2})^{R-1} & \ldots & (\alpha^{i+R-1})^{R-1} \end{bmatrix}
$$

D, $D_A$ and $D_R$ are matrices of constants from a finite field with $2^w$ elements.

The alternative method of generating the syndrome word allows encoder 100 circuitry to be used as a component of syndrome generator 302.

APPENDIX D

Mathematical Basis for Polynomial Multiplication Modulo $X^{R+1}$

Assume $a(x)=a_0+a_1x+a_2x^2+\ldots a_nx^n$ and $b(x)=b_0+b_1x+b_2x^2+\ldots b_nx^n$.

Then, $a(x)b(x) \bmod x^{R+1} = (a_0+a_1x+a_2x^2+\ldots +a_nx^n)b(x) \bmod x^{R+1}$.

In matrix notation, $$
a(x)b(x) = (a_0 a_1 a_2 \ldots a_n) \begin{bmatrix} b(x) \bmod x^{R+1} \\ xb(x) \bmod x^{R+1} \\ x^2 b(x) \bmod x^{R+1} \\ \ldots \\ \ldots \\ \ldots \\ x^n b(x) \bmod x^{R+1} \end{bmatrix}
$$

$$= a \cdot B$$

where $$
B = \begin{bmatrix} b_0 & b_1 & b_2 & b_3 & b_4 & \ldots & b_n & 0 & 0 & 0 & 0 & 0 \\ 0 & b_0 & b_1 & b_2 & b_3 & \ldots & b_{n-1} & b_n & 0 & 0 & 0 & 0 \\ 0 & 0 & b_0 & b_1 & b_2 & \ldots & b_{n-2} & b_{n-1} & b_n & 0 & 0 & 0 \\ & & & & & \ldots & & & & & & \\ & & & & & \ldots & & & & & & \\ & & & & & \ldots & & & & & & \end{bmatrix}.
$$

B has R+1 columns.

APPENDIX E

Mathematical Basis for Polynomial Multiplier that Multiplies by $\delta_{j-1}+W_j x$

Let $\delta(x)=\delta_{j-1}+W_j x$ and $a(x)=a_0+a_1x+a_2x^2+\ldots +a_nx^n$.

Then $$
\delta(x)a(x) = (\delta_{j-1} W_j) \begin{bmatrix} a_0 & a_1 & a_2 & \ldots & a_n & 0 \\ 0 & a_0 & a_1 & \ldots & a_{n-1} & a_n \end{bmatrix}
$$

$$= \delta_{j-1}a_0 + (\delta_{j-1}a_1 + W_j a_0)x$$
$$+ (\delta_{j-1}a_2 + W_j a_1)x^2$$
$$+ \ldots$$

The circuit to implement $\delta(x)a(x)$ is shown in FIG. 5-F. The number of stages required depends on the degree of a(x).

APPENDIX F

Mathematical Basis for Selecting L'(x) from L(x)

Let $L(x)=L_0+L_1x+L_2x^2+L_3x^3+\ldots +L_nx^n$.

Then the derivative of L(x) is $L'(x)=L_1+2L_2x+3L_3x^2+\ldots nL_nx^{n-1}$.

The coefficient $nL_n$ means $L_n+L_n+\ldots$ n times. If n is even, $nL_n=0$. If n is odd, $$nL_n = L_n \text{ so } L'(x) = L_1 + L_3x^2 + L_5x^4 + \ldots + L_n x^{n-1}$$
$$= L'_0 + L'_1 x + L'_2 x^2 + L'_{n-1} x^{n-1}.$$

Therefore,

-continued $L_0' = L_1 \quad L_1' = 0$ $L_2' = L_3 \quad L_3' = 0$ $L_4' = L_5 \quad L_5' = 0$

. . .

. . .

. . .

The degree of L'(x) is less than the degree of L(x).

I claim:

1. A parallel encoder for generating R redundant bytes responsive to receiving a message word having K variable message bytes for forming a code word having N=K+R bytes, wherein each of the bytes is an element of a finite field and includes w binary bits, and K and R are positive integers; said parallel encoder including:

R redundant byte generators, each receiving a message word in byte-parallel fashion and moving each of the variable message bytes through a multiplying stage, thereby to generate K intermediate product bytes, each of the intermediate product bytes representing one of said variable message bytes multiplied by a different one of K constant generator bytes, wherein each of the constant generator bytes is a predetermined constant element of the finite field; and wherein each redundant byte generator further includes byte adder circuitry for receiving the intermediate product bytes in parallel and for pairing said intermediate product bytes for addition in a plurality of successive byte-additive stages including a final byte-additive stage that generates its associated one of R redundant bytes.

2. The parallel encoder of claim 1 wherein:

each of said redundant byte generators includes K byte multiplier circuits, each said byte multiplier circuit receiving a different one of said K variable message bytes and generating an associated one of said K intermediate product bytes.

3. The parallel encoder of claim 2 wherein:

each one of said byte multiplier circuits includes w product bit generator circuits in parallel, each said product bit generator circuit including w bit multiplier circuits, each bit multiplier circuit receiving a different one of w variable bits forming the associated variable message byte and generating an intermediate product bit representing the product of its associated one of the variable message bits and an associated one of w constant bits determined by the associated generator byte where each constant bit is predetermined to equal either 0 or 1; and bit adder circuitry associated with the bit multiplier circuits for receiving the intermediate product bits in parallel and for pairing the intermediate product bits for addition in successive bit-additive stages including a final bit-additive stage for generating its associated one of w bits that together form the intermediate byte associated with said one byte multiplier circuit.

4. The parallel encoder of claim 3 wherein:

said bit adder circuitry includes a plurality of exclusive OR (XOR) logic gates arranged in n said stages, where n is an integer satisfying the relationship $2^n \geq w$, with each XOR gate in a first one of the bit-additive stages receiving two of the intermediate product bits and providing a single bit output to an XOR gate of a subsequent stage.

5. The parallel encoder of claim 1 wherein:

said byte adder circuitry includes a plurality of byte adders arranged in m byte-additive stages where m is the lowest integer satisfying the relationship $2^m \geq K$, with each of the byte adders in a first of said byte-additive stages receiving two of said intermediate product bytes and providing a single byte output to a byte adder of a subsequent stage.

6. The parallel encoder of claim 5 wherein:

each of said byte adders includes w exclusive OR (XOR) logic gates in parallel.

7. The parallel encoder of claim 1, wherein:

said redundant byte generators are fabricated on a single semiconductor chip.

8. In a system for parallel encoding of message words into code words provided to data channels, and for parallel decoding of an output of the data channels comprised of received words, each received word having a plurality of variable received word bytes and each variable received word byte including w binary bits where w is an integer greater than one, circuitry for generating a syndrome word in response to inputting a received word of K variable message bytes and R variable redundant bytes, where K and R are positive integers; said circuitry including:

R syndrome byte generators, each syndrome byte generator having as a parallel input a received word, and moving the received word through a multiplying stage to generate N intermediate product bytes where N=K+R, each intermediate product byte representing a multiplication of one of N variable received bytes of the received word by an associated one of N predetermined constant error detection bytes; and wherein each syndrome byte generator further includes byte adder circuitry for receiving the intermediate product bytes in parallel and for pairing of the intermediate product bytes for addition in successive byte-additive stages including a final byte-additive stage for generating its associated one of R syndrome bytes.

9. The syndrome generating circuitry of claim 8 wherein:

each of the syndrome byte generators includes N byte multiplier circuits, each of the byte multiplier circuits receiving a different one of the variable received word bytes and generating an associated one of the intermediate product bytes.

10. The syndrome generating circuitry of claim 9, wherein:

each one of said byte multiplier circuits includes w product bit generator circuits arranged in parallel, each said product bit generator circuit including w bit multiplier circuits, each bit multiplier circuit receiving a different one of the w variable input bits of the associated variable received word byte and generating an intermediate product bit representing the product of its associated variable input bit and an associated one of w predetermined constant bits of said constant error detection byte; and bit adder circuitry associated with the bit multiplier circuits for receiving the intermediate product bits in parallel and for pairing them for addition in successive bit-additive stages including a final bit-additive stage for generating its associated one of w intermediate product bits that together form the intermediate product byte associated with said one byte multiplier circuit.

11. The syndrome generating circuitry of claim 8 wherein:

said byte adder circuitry includes a plurality of byte adders arranged in m byte-additive stages where m is an integer satisfying the relationship $2^m \geq N$, each of the adders in a first one of said byte-additive stages receiving a pair of the intermediate product bytes and providing a single byte output to a subsequent stage.

12. The syndrome generating circuitry of claim 11 wherein:

each of said byte adders includes w exclusive OR (XOR) logic gates in parallel.

13. In a system for parallel encoding and decoding of data in which the data take the form of message words having K message bytes and code words having N=K+R bytes where R is the number of redundant bytes, wherein the code words are provided to a plurality of data channels in parallel and a parallel output of the data channels takes the form of received words, a decoding system including:

- a syndrome generator for generating a syndrome polynomial responsive to receiving a received word as an input;
- a key equation solver circuit for generating an error locator polynomial L(x) and an error evaluator polynomial V(x) representative of solutions to the key equation:

$$S(x)L(x)=V(x) \text{ modulo } x^{R+1}$$

where R is the number of redundant bytes and S(x) is said syndrome polynomial; and

- a most-likely error word generating circuit for generating a most-likely error word based on receiving said error locator polynomial and said error evaluator polynomial.

14. The system of claim 13, wherein:

said key equation solving circuit includes R successive stages, each stage generating an output representing a single iteration of an iterative algorithm for solving said key equation.

15. The system of claim 13 wherein:

said most likely error word generating circuit includes N most-likely error byte generating circuits, each one of the error byte generating circuits receiving the error locator polynomial and the error evaluator polynomial in parallel and, based on the error locator polynomial, the error evaluator polynomial and a first derivative of the error locator polynomial, generating a most-likely error byte, the most likely error bytes of the respective most-likely error byte generating circuits together providing the most-likely error word.

16. The system of claim 15 wherein:

each of the error byte generating circuits includes a first evaluator circuit receiving the error locator polynomial for generating an error locator byte, a second evaluator circuit receiving the first derivative of the error locator polynomial and generating a derivative byte, and a third evaluator circuit receiving the error evaluator polynomial and generating an evaluator byte;

a test circuit receiving the error locator byte as an input, and generating an output that varies depending upon whether or not the error locator byte is equal to zero; a byte multiplier receiving as its input said error evaluator byte and a reciprocal of said derivative byte and generating an output representative of the error evaluator byte divided by the first derivative byte; and w AND logic gates, each of said gates receiving (i) the output of said test circuit; and (ii) a different one of the output bits of said multiplier, and generating as its output an error bit whereby said logic gates together output a most-likely error byte.

17. The system of claim 13, further including:

a most-likely code word generator for receiving as inputs said received word and said most-likely error word, and generating as its output a most-likely code word.

18. The system of claim 17 wherein:

said most-likely code word generator includes N byte adder circuits, each byte adder circuit receiving one of N received word bytes of said received word and further receiving one of N most-likely error word bytes of said most-likely error word, and providing as an output a most-likely code word byte representing the sum (XOR) of the associated most-likely error word byte and received word byte.

19. The system of claim 18 wherein:

each of said byte adder circuits includes w exclusive OR logic gates in parallel.

20. The system of claim 18 further including:

a multiplexing circuit receiving as inputs said most-likely error word, said most-likely code word and said received word, and a select control means for causing the multiplexing circuit to provide one of said inputs as its output.

21. An error correcting system including:

- a parallel encoder for receiving message words, each message word including K message bytes where each of the message bytes includes w binary bits, said parallel encoder generating as its output a code word having N bytes including the message bytes plus R redundant bytes;
- N parallel data channels for receiving the code word in byte parallel fashion and providing a parallel data channel output based on the code word;
- a parallel decoder for receiving the parallel data channel output as a received word and, based on the received word, generating a most-likely error word and a most-likely code word each having N bytes; and
- a failure location system, coupled to receive failure location information from said data channels and further coupled to provide byte failure location information to the parallel decoder, said failure location system including a microprocessing means for sequentially reading every location in the data handling channels and accumulating failure information associated with each of said locations; said processor system being adapted to identify at least one of said locations as a failed location based on a sensed frequency of errors at least equal to a predetermined threshold frequency;
- said failure location system further including a memory means for storing a record of failed locations, said memory providing the byte failure location information to the parallel decoder.

22. The error correcting system of claim 21 wherein:

said memory means includes a content addressable memory, a random access memory, and an address selector coupled between the content addressable memory and the random access memory for providing an address to said random access memory, said random access memory fetching information at said address to provide the byte failure location information.

23. The error correcting system of claim 22 wherein:

said content addressable memory includes an address counter, multiple beginning-address-of-failure registers for storing the beginning address of failed locations, and multiple comparators, each comparator receiving the output of said address counter and an associated one of the beginning-address-of-failure registers; each comparator, upon determining a match between the address counter output and the output of its associated beginning-address-of-failure register, causing an address encoder to generate an output, corresponding to the identified address based on the selective comparator, to an address register of said random access memory.

24. A variable byte multiplier circuit for multiplying two variable data bytes wherein each of the variable data bytes is composed of w data bits and w is an integer greater than one; said variable-byte multiplier circuit including:

w constant byte multipliers in parallel, each one of the constant byte multipliers receiving a first variable byte in parallel and generating a first intermediate byte representing the product of the first variable byte and a constant byte corresponding to said one constant byte multiplier, wherein each of the constant bytes is a predetermined constant element of a finite field;

w logic sets in parallel for receiving a second variable byte, each of said logic sets receiving a different one of w bits of the second variable byte and further receiving a different one of said first intermediate bytes;

wherein each one of said logic sets includes w AND logic gates in parallel, each of the AND logic gates receiving as bit inputs (i) the bit of said second variable byte corresponding to said one logic set, and (ii) a different one of w bits of the first intermediate byte that corresponds to said one logic set; each of said logic gates performing an AND logic function on its inputs to generate an intermediate bit, with the logic gates of the logic set together generating a second intermediate byte composed of the intermediate bits; and byte adder circuitry for receiving the second intermediate bytes from said logic sets in parallel and for pairing said second intermediate bytes in a plurality of successive byte-additive stages including a final byte-additive stage that generates a resultant byte representing a product of the first and second variable bytes.

25. The variable byte multiplier circuit of claim 24 wherein:

said byte adder circuitry includes a plurality of byte adders arranged in m said byte-additive stages, where m is the lowest integer satisfying the relationship $2^m \geq w$, with each of the byte adders in a first one of the byte-additive stages receiving two of the second intermediate bytes and providing a single byte output to a byte adder of a subsequent byte-additive stage.

26. The variable byte multiplier circuit of claim 25 wherein:

each of said byte adders includes w exclusive OR (XOR) logic gates in parallel;

wherein the XOR gates of the final byte additive stage generate, as respective single bit outputs, the w bits of the resultant byte.

27. The variable byte multiplier circuit of claim 24 wherein:

each of said w constant byte multipliers includes w product bit generators, with each said product bit generator including w constant bit multiplier circuits for receiving a variable input byte in parallel, with each of the constant bit multiplier circuits receiving a different one of w variable input bits of the first variable byte and, responsive thereto, generating one of w intermediate product bits representing a product of the associated one of said w variable input bits and a predetermined constant bit, said bit multiplier circuits together generating w intermediate product bits; and bit adder circuitry associated with each constant bit multiplier for receiving the intermediate product bits in parallel, and for pairing the intermediate product bits for addition in successive bit-additive stages including a final stage for generating a single bit output associated with said product bit generator circuit; and wherein the single bit outputs of all of said final stages together provide said first intermediate byte.

28. In a system for parallel decoding of an output of parallel data channels in the form of received words having N=K+R bytes where K is the number of data bytes and R is the number of redundant bytes, a key equation solving circuit for receiving a syndrome product of a constant polynomial x and a syndrome polynomial S(x) of R bytes based on the received words from the parallel data channels, and generating an error locator polynomial L(x) and an error evaluator polynomial V(x) representing a solution to the key equation:

$S(x)L(x)=V(x)$ modulo $x^{R+1}$ said key equation solving circuit including:

R successive stages, each stage receiving a byte-parallel input and generating a byte-parallel output representing a single iteration of an iterative algorithm for solving the key equation, wherein a first one of said stages receives said syndrome product, and wherein the stage output of a final one of said stages includes said error locator polynomial L(x) and an evaluator product of said error evaluator polynomial V(x) and said polynomial x.

29. The key equation solving circuit of claim 28 further including:

a polynomial multiplier for receiving the syndrome polynomial, and generating a multiplier output representing the syndrome product and providing the multiplier output to said initial stage.

30. The key equation solving circuit of claim 29 further including:

a means for providing predetermined byte failure location information to said initial stage, whereby said stage output of the final stage is based in part on said byte failure location information.

31. The key equation solving circuit of claim 30 wherein:

each of said stages includes polynomial processing circuitry having first and second alternative settings for performing corresponding first and second different operations upon the stage input to said stage; and control circuitry in parallel with the polynomial processing circuitry and operatively coupled to the polynomial processing circuitry for selecting one of said alternative settings to cause the polynomial processing circuitry to perform the operation corresponding to the selected setting on said stage input to said stage.

32. The key equation solving circuit of claim 30 wherein:

each of said stages comprises an incrementing circuit and two polynomial multiplying circuits, each of which multiplies an incoming polynomial by said constant polynomial x;

a control circuit for determining whether incoming data satisfies a certain condition, an integer subtracter circuit, a byte selector, two polynomial selectors, and a plurality of polynomial multipliers; and an integer selector, and a plurality of polynomial adder circuits for generating respective outputs, each representing the sum of two incoming data polynomials.

33. In a system for parallel decoding of data channel output of received words having N=K+R bytes where K is the number of data bytes and R is the number of redundant bytes, including a key equation solving circuit for receiving the product of a constant polynomial x and a syndrome polynomial S(x) of R bytes and generating an error locator polynomial L(x) and error evaluator polynomial V(x) representing a solution to the key equation:

$$S(x)L(x)=V(x) \text{ modulo } x^{R+1};$$

a most-likely error word generator, including:

N most-likely error byte generating circuits, each one of the error byte generating circuits receiving the error locator polynomial an d the error evaluator polynomial in parallel and, based on the error locator polynomial, the error evaluator polynomial and a first derivative of the error locator polynomial, generating a most-likely error byte, the most-likely error bytes of the respective most-likely err or byte generating circuits together providing the most-likely error word.

34. The most-likely error word generator of claim 33 wherein:

each of the error byte generating circuits includes a first evaluator circuit receiving the error locator polynomial for generating an error locator byte, a second evaluator circuit receiving the first derivative of the error locator polynomial and generating a derivative byte, and a third evaluator circuit receiving the error evaluator polynomial and generating an evaluator byte;

a test circuit receiving the error locator byte as an input, and generating an output that varies depending upon whether or not the error locator byte is equal to zero;

a byte multiplier receiving as its inputs said error evaluator byte and a reciprocal of said derivative byte and generating an output representative of the error evaluator byte divided by the first derivative byte; and w AND logic gates, each of said gates receiving (i) the output of said test circuit, and (ii) a different one of the output bits of said multiplier, and generating as its output an error bit whereby said logic gates together output a most-likely error byte.

35. In combination with the most-likely error word generator of claim 34:

a most-likely code word generator for receiving as inputs said received word and said most-likely error word, and generating as its output a most-likely code word.

36. The combination of claim 35 wherein:

said most-likely code word generator includes N byte adder circuits, each byte adder circuit receiving one of N received word bytes of said received word and further receiving one of N most-likely error word bytes of said most-likely error word, and providing as an output a most-likely code word byte representing the sum of the associated most-likely error word byte and code word byte.

37. The combination of claim 36 wherein:

each of said byte adder circuits includes w exclusive OR logic gates in parallel.

38. The combination of claim 37 further including:

a multiplexing circuit receiving as inputs said most-likely error word, said most-likely code word and said received word, and a select control means for causing the multiplexing circuit to provide a selected one of said inputs as its output.

* * * * *